(12) United States Patent
Yamazaki et al.

(10) Patent No.: US 8,436,350 B2
(45) Date of Patent: May 7, 2013

(54) SEMICONDUCTOR DEVICE USING AN OXIDE SEMICONDUCTOR WITH A PLURALITY OF METAL CLUSTERS

(75) Inventors: Shunpei Yamazaki, Setagaya (JP); Junichiro Sakata, Atsugi (JP); Hideyuki Kishida, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 149 days.

(21) Appl. No.: 12/692,794

(22) Filed: Jan. 25, 2010

(65) Prior Publication Data

US 2010/0193783 A1 Aug. 5, 2010

(30) Foreign Application Priority Data

Jan. 30, 2009 (JP) ................. 2009-019922

(51) Int. Cl.
*H01L 29/10* (2006.01)
(52) U.S. Cl.
USPC ............... 257/43; 257/4; 257/40; 257/243; 257/E21.411; 257/E29.001
(58) Field of Classification Search ............ 257/40, 257/43, E21.411, 4, 241, 243, E29.001
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — John C Ingham
(74) *Attorney, Agent, or Firm* — Eric J. Robinson; Robinson Intellectual Property Law Office, P.C.

(57) ABSTRACT

In forming a thin film transistor, an oxide semiconductor layer is used and a cluster containing a titanium compound whose electrical conductance is higher than that of the oxide semiconductor layer is formed between the oxide semiconductor layer and a gate insulating layer.

15 Claims, 35 Drawing Sheets

U.S. PATENT DOCUMENTS

| | | | |
|---|---|---|---|
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,741,643 B2* | 6/2010 | Miyazaki et al. | 257/66 |
| 7,897,430 B2* | 3/2011 | Kim et al. | 438/99 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0012006 A1* | 1/2008 | Bailey et al. | 257/40 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0008639 A1* | 1/2009 | Akimoto et al. | 257/43 |
| 2009/0039448 A1* | 2/2009 | Chuang et al. | 257/411 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-311404 A | 11/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M of al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3 pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using signal-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-336.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett.(Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical, Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakamura.M et al., "Syntheses and crystal structures of new homologous compounds, indium iron zinc oxides (InFeO3(ZnO)m) (m natural number) and related compounds,", Kotai Butsuri (Solid State Physics), 1993, vol. 28, No. 5, pp. 317-327.

\* cited by examiner

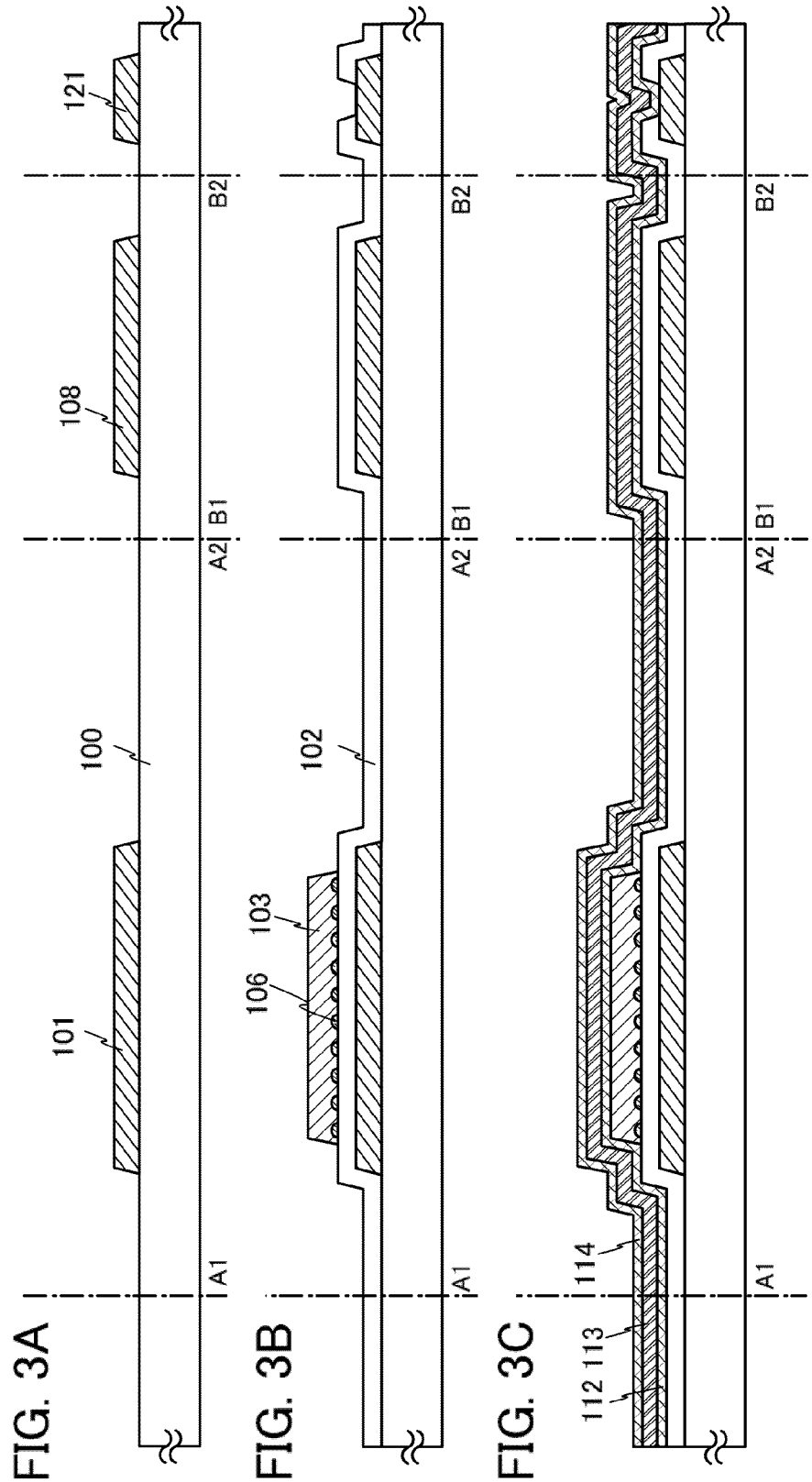

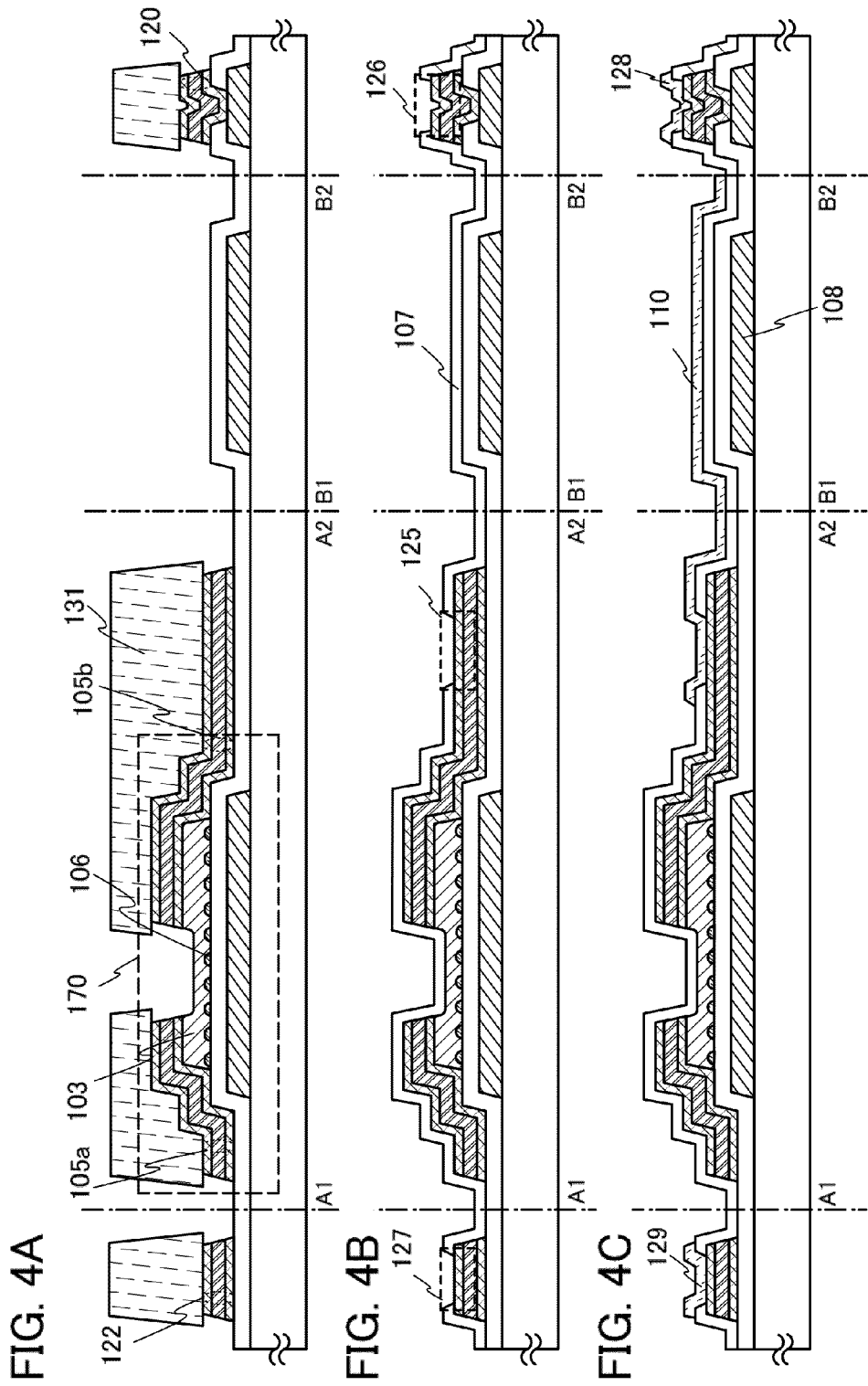

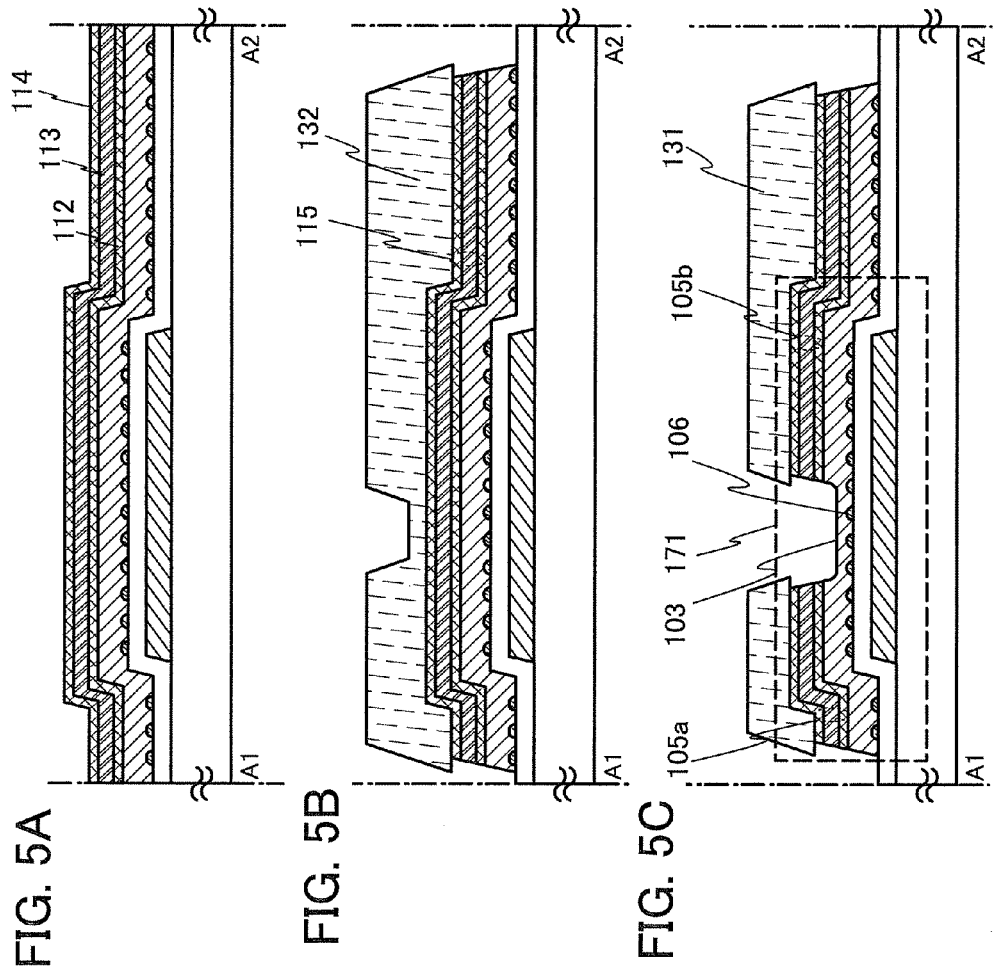

FIG. 10A1
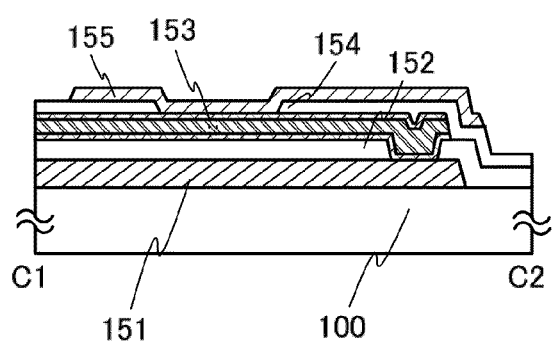
FIG. 10A2
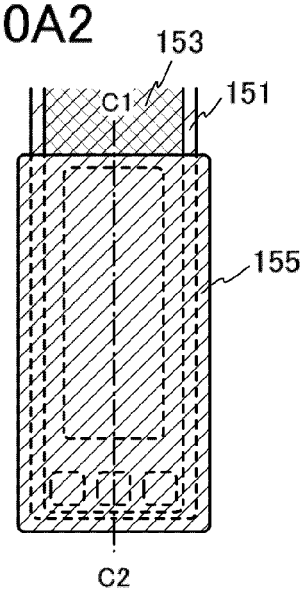
FIG. 10B1
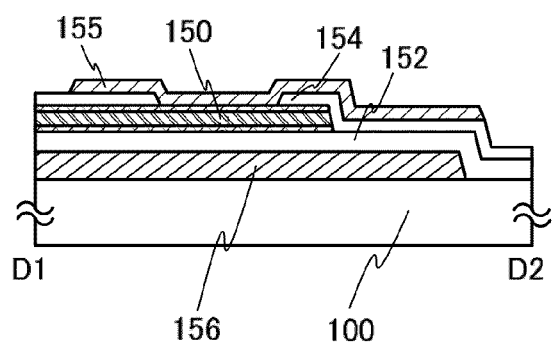
FIG. 10B2
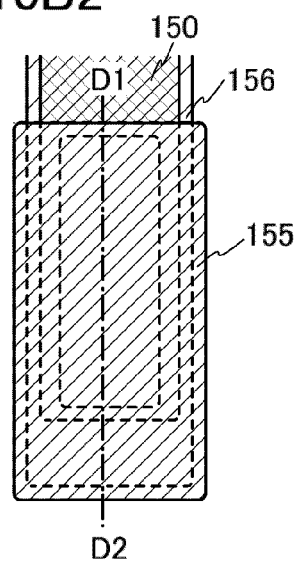

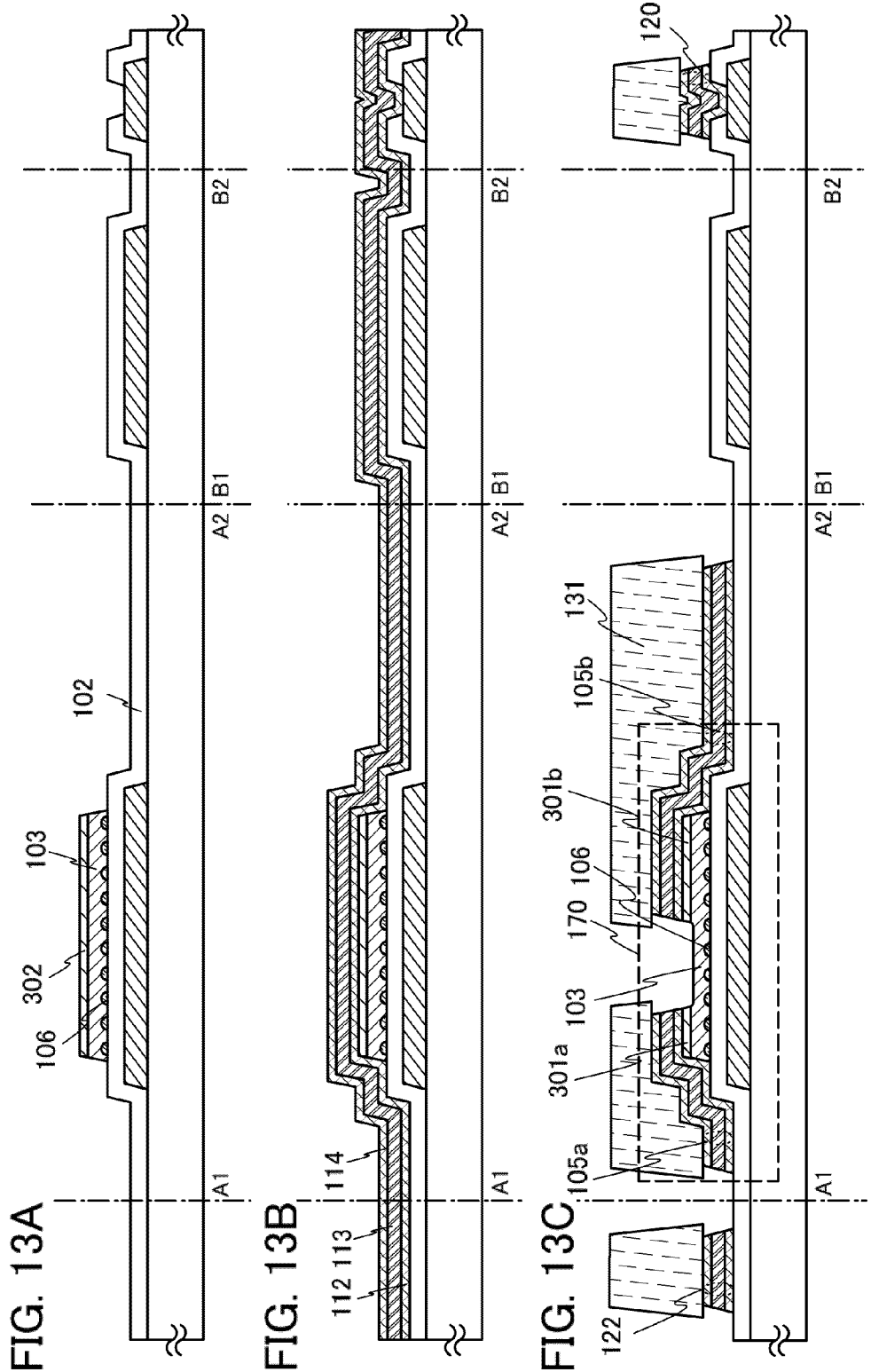

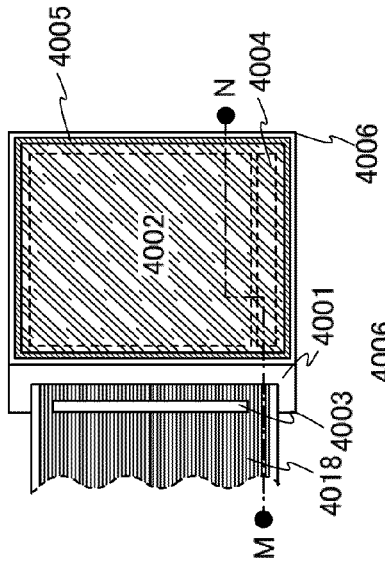
FIG. 21A1
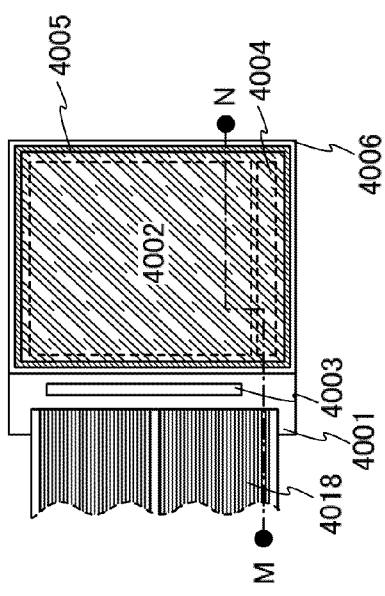
FIG. 21A2
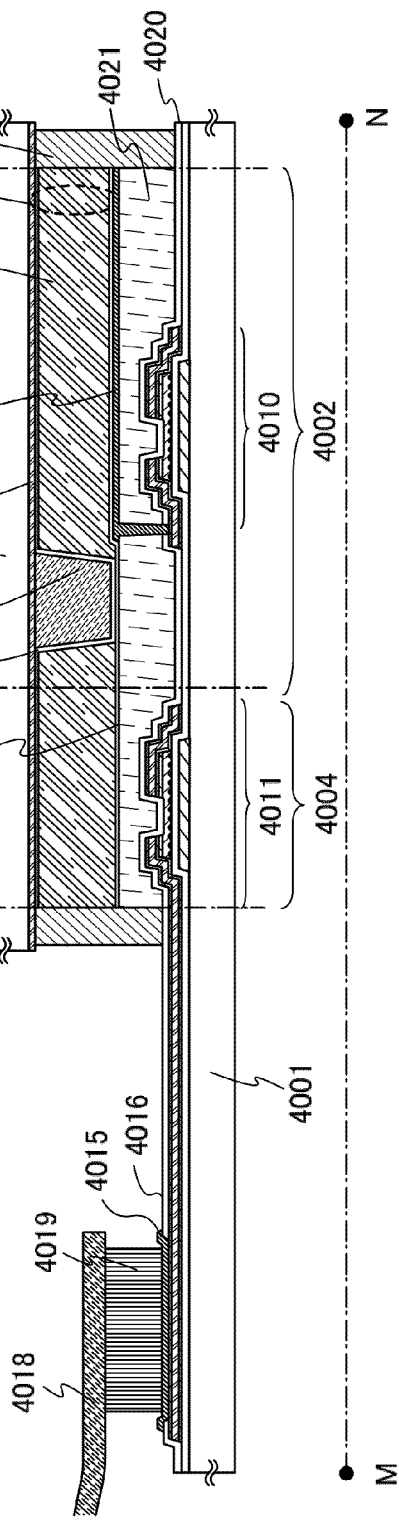
FIG. 21B

SEMICONDUCTOR DEVICE USING AN OXIDE SEMICONDUCTOR WITH A PLURALITY OF METAL CLUSTERS

BACKGROUND OF THE INVENTION

1. Field of the Invention

The present invention relates to a semiconductor device using an oxide semiconductor, a display device using the semiconductor device, and a manufacturing method thereof.

2. Description of the Related Art

Various metal oxides are used for a variety of applications. Indium oxide is a well-known material and is used as a light-transmitting electrode material which is necessary for liquid crystal displays and the like.

Some metal oxides have semiconductor characteristics. Metal oxides having semiconductor characteristics are a kind of compound semiconductor. The compound semiconductor is a semiconductor formed using two or more kinds of atoms bonded together. In general, metal oxides become insulators. However, it is known that metal oxides become semiconductors depending on the combination of elements included in the metal oxides.

For example, it is known that tungsten oxide, tin oxide, indium oxide, zinc oxide, titanium oxide and the like are metal oxides which have semiconductor characteristics. In addition, a thin film transistor in which a transparent semiconductor layer which is formed using such a metal oxide serves as a channel formation region is disclosed (Patent Documents 1 to 4, Non-Patent Document 1, and Non-Patent Document 7).

Further, not only simple (unitary) oxides but also multiple oxides are known as metal oxides. For example, $InGaO_3(ZnO)_m$ (m is a natural number) which forms a homologous phase is a known material (Non-Patent Documents 2 to 4).

Furthermore, it is confirmed that such an In—Ga—Zn-based oxide is applicable to a channel layer of a thin film transistor (Patent Document 5 and Non-Patent Documents 5 and 6).

In a conventional technique, amorphous silicon or polycrystalline silicon has been used for a thin film transistor (a TFT) provided for each pixel of an active matrix liquid crystal display. However, in place of these silicon materials, attention has been attracted to a technique for manufacturing a thin film transistor including the aforementioned metal oxide semiconductor. Examples of the techniques are disclosed in Patent Document 6 and Patent Document 7, where a thin film transistor is manufactured with zinc oxide or an In—Ga—Zn—O-based oxide semiconductor for a metal oxide semiconductor film and is used as a switching element or the like of an image display device.

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-96055

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492
[Non-Patent Document 7] Furubarashi et al., Japanese Journal of Applied Physics, 2005, Vol. 44, No. 34, pp. L1063-L1065

SUMMARY OF THE INVENTION

An oxide semiconductor film can be formed by a sputtering method or the like at a temperature of less than or equal to 300° C.; and a thin film transistor in which a channel formation region is formed in an oxide semiconductor is easily formed over a large area of a large substrate. Thus, application of the oxide semiconductor to an active matrix display device is expected.

In an active matrix liquid crystal display device, a large amount of drive current needs to flow because application of voltage to a liquid crystal layer and charging of a storage capacitor are performed during a short gate-switching period. In particular, in a liquid crystal display device with a large screen or a high-definition liquid crystal display device, a larger amount of drive current is necessary. Therefore, it is preferable that a thin film transistor used as a switching element have high field effect mobility.

Thus, an object according to an embodiment of the present invention is to increase field effect mobility of a thin film transistor including an oxide semiconductor. Another object according to an embodiment of the present invention is to suppress an increase in off current even when the field effect mobility of the thin film transistor is increased. Further, another object according to an embodiment of the present invention is to provide a display device having the thin film transistor including an oxide semiconductor.

According to an embodiment of the present invention, it is summarized that in forming a thin film transistor, an oxide semiconductor layer is used and a cluster containing a metal, for example, titanium whose electrical conductance is higher than that of the oxide semiconductor layer is formed between the oxide semiconductor layer and a gate insulating layer.

One embodiment of the invention to be disclosed is a semiconductor device including a gate electrode layer, a gate insulating layer over the gate electrode layer, a plurality of clusters containing titanium over the gate insulating layer, an oxide semiconductor layer over the gate insulating layer and the plurality of clusters containing titanium, a source electrode layer and a drain electrode layer over the oxide semiconductor layer. The oxide semiconductor layer and the source and drain electrode layers are electrically connected to each other.

Another embodiment of the invention to be disclosed is a semiconductor device including a gate electrode layer, a gate insulating layer over the gate electrode layer, a plurality of clusters containing titanium over the gate insulating layer, an oxide semiconductor layer over the gate insulating layer and the plurality of clusters containing titanium, a buffer layer having n-type conductivity over the oxide semiconductor layer, a source electrode layer and a drain electrode layer over the buffer layer. The cluster containing titanium has a higher electrical conductance than the oxide semiconductor layer. The carrier concentration of the buffer layer is higher than the carrier concentration of the oxide semiconductor layer. The oxide semiconductor layer and the source and drain electrode layers are electrically connected to each other via the buffer layer.

Note that the plurality of clusters contains a titanium compound whose electrical conductance is higher than that of the oxide semiconductor layer.

Note that the plurality of clusters containing titanium has preferably a height of greater than or equal to 3 nm and less than or equal to 5 nm from a reference surface in contact with the gate insulating layer. Further, the plurality of clusters containing titanium preferably contains at least one kind of impurity element selected from niobium (Nb) and tantalum (Ta).

Note that the oxide semiconductor layer and the buffer layer preferably contain at least one of indium, gallium, and zinc. Further, the thickness of the oxide semiconductor layer is greater than or equal to 10 nm and less than or equal to 150 nm, preferably greater than or equal to 20 nm and less than or equal to 60 nm.

Note also that the oxide semiconductor layer preferably has a first region which is between the source and drain electrode layers and whose thickness is smaller than a thickness of a second region which the source and drain electrode layers overlaps. Further, a channel protective layer including an inorganic material may be formed over the oxide semiconductor layer.

Another embodiment of the invention to be disclosed is a method for manufacturing a semiconductor device including the steps of: forming a gate electrode layer over a substrate; forming a gate insulating layer over the gate electrode layer; forming a plurality of clusters containing titanium over the gate insulating layer in a dispersed manner; forming an oxide semiconductor film over the gate insulating layer and the plurality of clusters containing titanium by a sputtering method; forming an island-like oxide semiconductor layer by etching the oxide semiconductor film; forming a conductive layer over the island-like oxide semiconductor layer; and forming an oxide semiconductor layer and source and drain electrode layers by etching the conductive layer. The oxide semiconductor layer is formed over the gate insulating layer and the plurality of clusters containing titanium.

Note that in this specification, a "cluster" refers to a structural unit including a plurality of atoms or molecules, which does not have a film structure, and a "cluster containing titanium" refers to a cluster with electrical conductivity which contains titanium. Thus, when a film is formed by assembling clusters with electrical conductivity which contain titanium, the film exhibits higher conductivity than an oxide semiconductor layer which is formed over the plurality of clusters containing titanium and has electrical conductivity even without being irradiated with light.

Note that the ordinal numbers such as "first" and "second" in this specification are used for convenience and do not denote the order of steps and the stacking order of layers. In addition, the ordinal numbers in this specification do not denote particular names which specify the invention.

Note that the semiconductor devices in this specification indicate all the devices which can operate using semiconductor characteristics, and an electronic optical device, a semiconductor circuit, and an electronic device are all included in the semiconductor devices.

According to an embodiment of the present invention, in a thin film transistor using an oxide semiconductor layer, field effect mobility of the thin film transistor can be increased by formation of a cluster containing titanium, whose electrical conductance is higher than that of the oxide semiconductor layer between the oxide semiconductor layer and a gate insulating layer. In addition, increase in off current can be suppressed even when the field effect mobility of the thin film transistor is increased.

According to an embodiment of the present invention, a display device with high electric characteristics and high reliability can be provided using the thin film transistor in a pixel portion or a driver circuit portion of the display device.

BRIEF DESCRIPTION OF THE DRAWINGS

FIGS. 3A to 3C illustrate a method for manufacturing a semiconductor device according to one embodiment of the present invention.

FIGS. 4A to 4C illustrate a method for manufacturing a semiconductor device according to one embodiment of the present invention.

FIGS. 5A to 5C illustrate a method for manufacturing a semiconductor device according to one embodiment of the present invention.

FIGS. 10A1, 10A2, 10B1, 10B2 illustrate a semiconductor device according to one embodiment of the present invention.

FIGS. 13A to 13C illustrate a method for manufacturing a semiconductor device according to one embodiment of the present invention.

FIGS. 21A1, 21A2, and 21B illustrate a semiconductor device according to one embodiment of the present invention.

DETAILED DESCRIPTION OF THE INVENTION

Figure 1A:
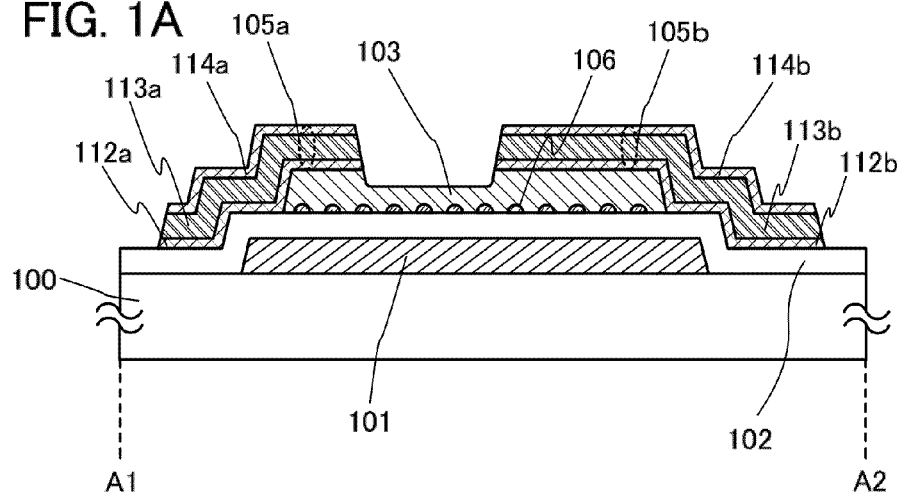
FIGS. 1A to 1C illustrate a semiconductor device according to one embodiment of the present invention.

Embodiments will be described in detail with reference to the drawings. However, the present invention is not limited to the following description, and it is easily understood by those skilled in the art that the modes and details disclosed herein can be modified in a variety of ways without departing from the scope and the spirit of the present invention. Therefore, the present invention should not be interpreted as being limited to the description of the embodiments given below. Note that in the structure of the present invention described below, the same portion or a portion having a similar function is denoted by the same reference numeral in all drawings, and the description thereof is omitted.

Embodiment 1

In this embodiment, a structure of a thin film transistor will be described with reference to FIGS. 1A to 1C.

Figure 1B:
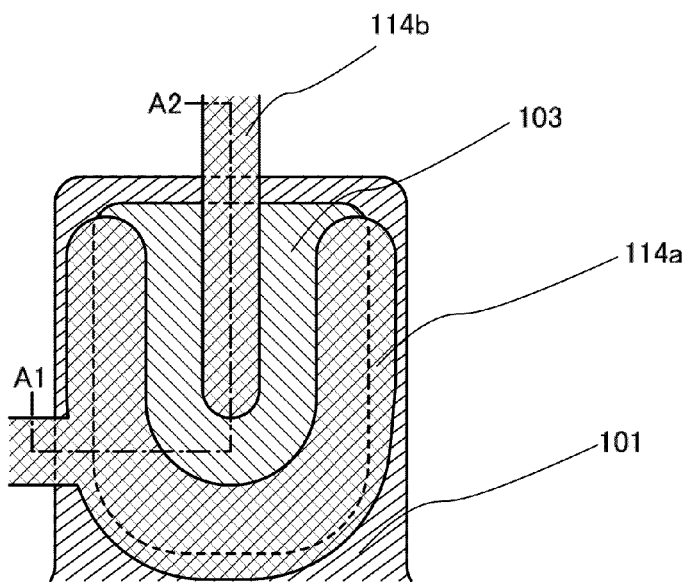
Figure 1C:
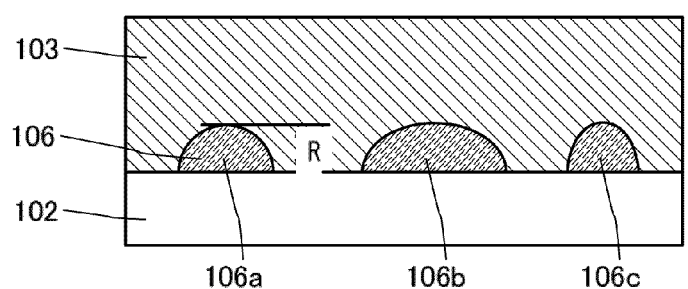

A thin film transistor having a bottom-gate structure of this embodiment is illustrated in FIGS. 1A to 1C. FIG. 1A is a cross-sectional view, and FIG. 1B is a plan view. FIG. 1A is a cross-sectional view taken along line A1-A2 in FIG. 1B. In addition, FIG. 1C is an enlarged view of an oxide semiconductor layer 103 of FIG. 1A.

In the thin film transistor illustrated in FIGS. 1A to 1C, a gate electrode layer 101 is provided over a substrate 100, a gate insulating layer 102 is provided over the gate electrode layer 101, a plurality of clusters 106 containing titanium is provided over the gate insulating layer 102 in a dispersed manner, the oxide semiconductor layer 103 is provided over the gate insulating layer 102 and the plurality of clusters 106 containing titanium, and source or drain electrode layers 105a and 105b are provided over the oxide semiconductor layer 103. Note that at least part of the oxide semiconductor layer 103 is provided in contact with an upper surface of the gate insulating layer 102.

The gate electrode layer 101 can be formed to have a single-layer structure or a stacked structure using a metal material such as aluminum, copper, molybdenum, titanium, chromium, tantalum, tungsten, neodymium, or scandium; an alloy material containing any of these metal materials as its main component; or nitride containing any of these metal materials as its component. The gate electrode layer 101 is preferably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, as a stacked structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. Alternatively, a three-layer structure in which a tungsten layer or a tungsten nitride layer, a layer using an aluminum-silicon alloy layer or an aluminum-titanium alloy layer, and a titanium nitride layer or a titanium layer are stacked is preferably used.

As an oxide semiconductor which forms the oxide semiconductor layer 103, it is preferable to use an oxide semiconductor whose composition formula is represented by $InMO_3(ZnO)_m$ (m>0). In particular, it is preferable to use an In—Ga—Zn—O-based oxide semiconductor. Note that M denotes one or more of metal elements selected from gallium (Ga), iron (Fe), nickel (Ni), manganese (Mn), and cobalt (Co). For example, in addition to a case where Ga is contained as M, there is a case where Ga and the above metal elements other than Ga, for example, Ga and Ni or Ga and Fe are contained as M. Moreover, in the oxide semiconductor, in some cases, a transition metal element such as Fe or Ni, or an oxide of the transition metal is contained as an impurity element in addition to a metal element contained as M. In this specification, among the oxide semiconductors whose composition formulas are represented by InMO$_3$(ZnO)$_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

An amorphous structure is observed as its crystal structure in an XRD (X-ray diffraction) analysis. Note that the In—Ga—Zn—O-based non-single-crystal film is formed by a sputtering method and then subjected to thermal treatment at 200° C. to 500° C., typically 300° C. to 400° C. for 10 minutes to 100 minutes.

However, an oxide semiconductor layer which forms the oxide semiconductor layer 103 is not limited to the oxide semiconductor layer whose composition formula is represented by InMO$_3$ (ZnO)$_m$ (m>0). For example, an oxide semiconductor layer including indium oxide (InO$_x$), zinc oxide (ZnO$_x$), tin oxide (SnO), indium zinc oxide (IZO), indium tin oxide (ITO), indium tin oxide containing silicon oxide (ITSO), gallium-doped zinc oxide (GZO), or the like may be used.

The thickness of the oxide semiconductor layer 103 is set to be greater than or equal to 10 nm and less than or equal to 150 nm, preferably greater than or equal to 20 nm and less than or equal to 60 nm. The oxide semiconductor layer 103 has a region which is between the source or drain electrode layers 105a and 105b and whose thickness is smaller than the thickness of a region overlapping with the source or drain electrode layers 105a and 105b.

The carrier concentration of the oxide semiconductor layer 103 is preferably less than $1 \times 10^{17}$/cm$^3$ (more preferably greater than or equal to $1 \times 10^{11}$/cm$^3$). When the carrier concentration of the oxide semiconductor layer 103 exceeds the above range, the thin film transistor has a risk of being normally on.

An insulating impurity may be contained in the oxide semiconductor layer 103. As the impurity, insulating oxide typified by silicon oxide, germanium oxide, or the like; insulating nitride typified by silicon nitride, or the like; or insulating oxynitride such as silicon oxynitride is applied.

The insulating oxide or the insulating nitride is added to the oxide semiconductor at a concentration at which electrical conductivity of the oxide semiconductor does not deteriorate. Insulating impurity is contained in the oxide semiconductor layer 103, whereby crystallization of the oxide semiconductor layer 103 can be suppressed. The crystallization of the oxide semiconductor layer 103 is suppressed, whereby characteristics of the thin film transistor can be stabilized.

In addition, the In—Ga—Zn—O-based oxide semiconductor is made to contain the impurity such as silicon oxide. Thus, crystallization of the oxide semiconductor or generation of microcrystal grains can be prevented even when heat treatment is performed at 300° C. to 600° C.

In a manufacturing process of the thin film transistor in which an In—Ga—Zn—O-based oxide semiconductor serves as a channel formation region, an S value (a subthreshold swing value) can be improved or field effect mobility can be increased by heat treatment. Even in such a case, the thin film transistor can be prevented from being normally on. Further, even if heat stress or bias stress is added to the thin film transistor, a change in threshold voltage can be prevented.

As the oxide semiconductor applied to the oxide semiconductor layer 103, any of the following oxide semiconductors can be applied in addition to the above: an In—Sn—Zn—O-based oxide semiconductor; a Sn—Ga—Zn—O-based oxide semiconductor; an In—Zn—O-based oxide semiconductor; a Sn—Zn—O-based oxide semiconductor; a Ga—Zn—O-based oxide semiconductor; an In—O-based oxide semiconductor; a Sn—O-based oxide semiconductor; and a Zn—O-based oxide semiconductor. In other words, an insulating impurity is added to these oxide semiconductors, whereby crystallization of the oxide semiconductor layer 103 can be suppressed and characteristics of the thin film transistor can be stabilized.

The cluster 106 containing titanium is a cluster which contains titanium and has a higher electrical conductance than the oxide semiconductor layer 103. For example, titanium, titanium nitride, and titanium oxide can be given. Further, oxide containing titanium may be doped with an impurity such as niobium (Nb) or tantalum (Ta) so as to have an increased electrical conductance. Note that the cluster 106 containing titanium may be crystallized.

Calculation of density of states can reveal an electronic structure of a titanium compound which is used for a cluster having a higher electrical conductance than the oxide semiconductor layer 103. The density of states is calculated by the first-principles calculation based on the density functional theory. Structures of the calculated titanium compounds are TiO (NaCl type), Ti$_2$O$_3$ (Al$_2$O$_3$ type), TiO$_2$ (in form of anatase, rutile, and brookite), Ti, titanium nitride (osbornite), and TiO$_{0.5}$N$_{0.5}$ (NaCl type). The electronic structure was calculated optimization of the structures. CASTEP is used as a calculation program and GGA-PBE is used for a functional.

Figure 32A:
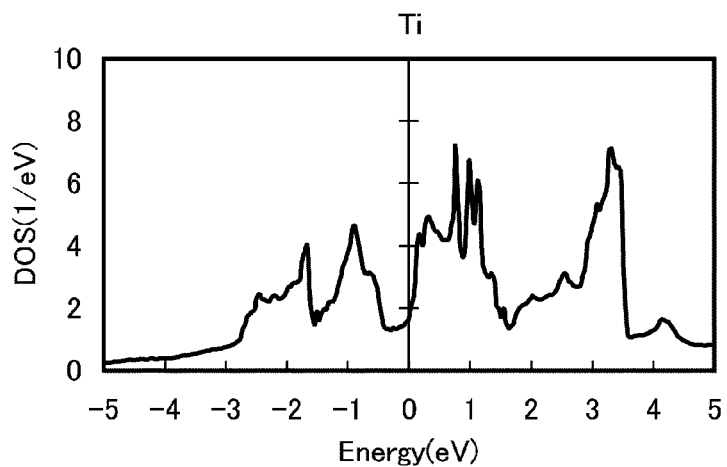
FIGS. 32A to 32C are each a graph showing the density of states of a titanium compound.
Figure 32B:
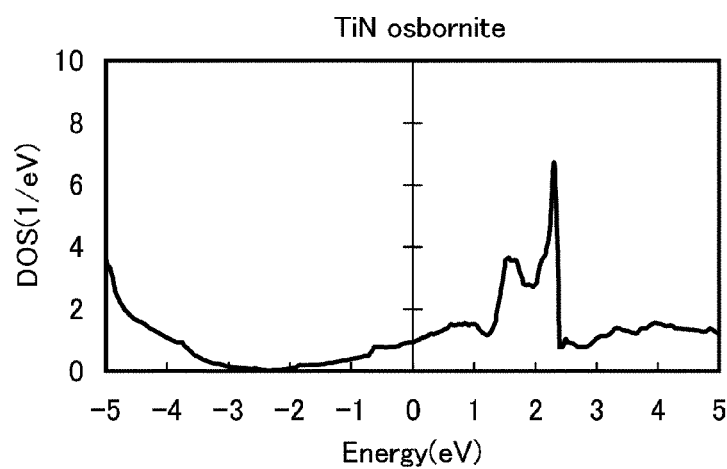
Figure 32C:
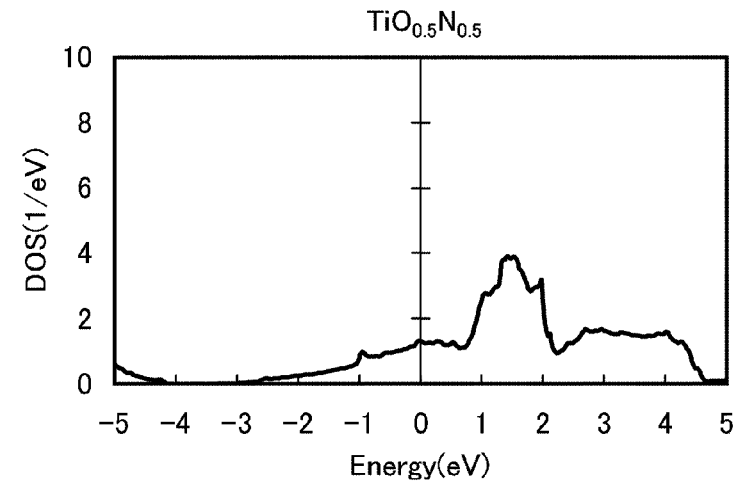

As a result of calculating the density of states of titanium, it can be seen from FIG. 32A that the Fermi level is in the conduction band and the titanium is metal. Similarly, it can be seen from the graphs of density of states in FIGS. 32B and 32C that the titanium nitride and the titanium oxynitride (TiO$_{0.5}$N$_{0.5}$) exhibit similar conductivities to metal by similar conduction mechanisms to metal.

Figure 33A:
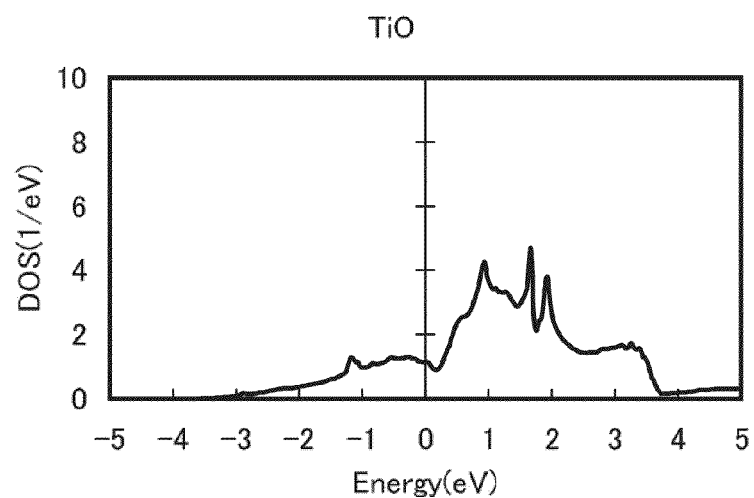
FIGS. 33A and 33B are each a graph showing the density of states of a titanium compound.
Figure 33B:
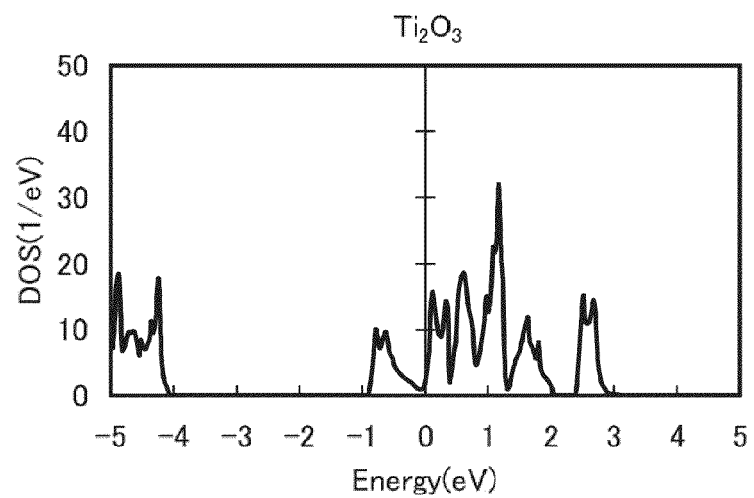

Further, it can be seen from FIGS. 33A and 33B, which show the results of the calculation of densities of states of the titanium monoxide (TiO) and the Ti$_2$O$_3$ respectively, that the Fermi level is in the conduction band, and that the titanium monoxide (TiO) and the Ti$_2$O$_3$ exhibit similar conductivities to metal by a similar conduction mechanism to metal.

Figure 34A:
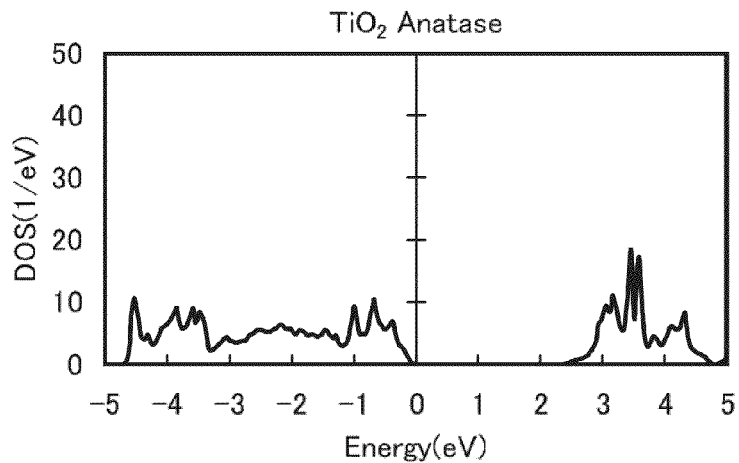
FIGS. 34A to 34C are each a graph showing the density of states of a titanium compound.
Figure 34B:
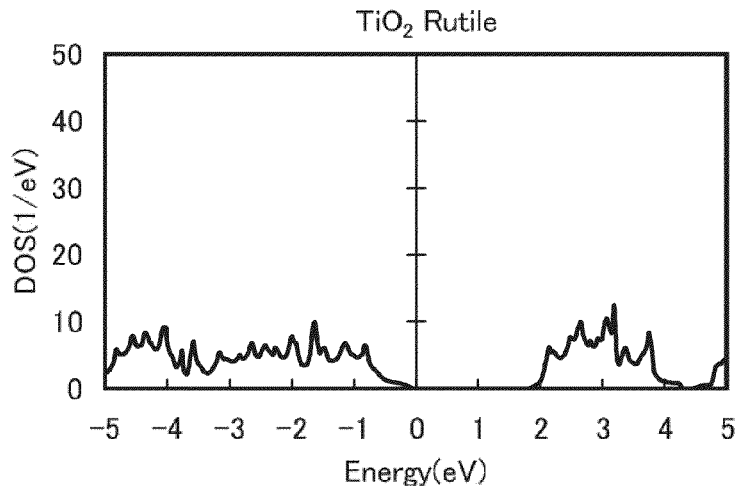
Figure 34C:
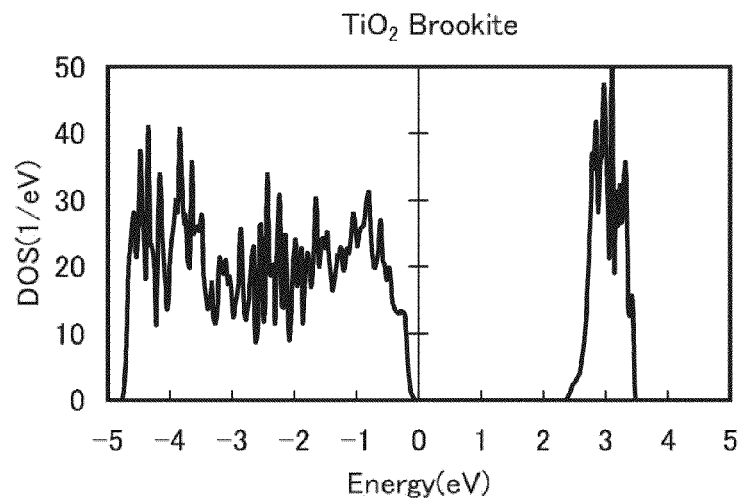
Figure 35:
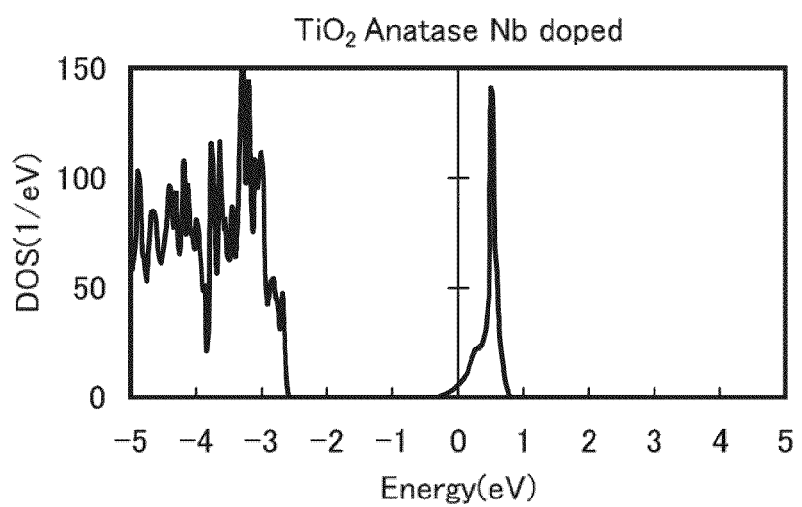
FIG. 35 is a graph showing the density of states of a titanium compound.

On the other hand, it can be seen from FIGS. 34A to 34C, each of which shows the density of states of the titanium dioxide (TiO$_2$), that the Fermi level is on top of the valence band and there is a large band gap. Thus, the titanium dioxide (TiO$_2$) can be considered to be a semiconductor. Accordingly, titanium oxide (TiO$_x$ (x>0)) can be considered to be a semiconductor when a composition proportion of oxygen is high, though considered to exhibit similar conductivities to metal by a similar conduction mechanism to metal as the composition proportion of oxygen becomes lower. In addition, when the titanium dioxide (TiO$_2$) in form of anatase is doped with niobium (Nb) as an impurity, the Fermi level moves toward a conduction band, carriers are generated, and thus the electrical conductance is improved, as shown in the graph of density of states in FIG. 35. As described above, many of the compounds containing titanium exhibit conductivity, and can be used for the cluster containing titanium of this embodiment.

In addition, a height R of the cluster 106 containing titanium is greater than 0 nm and less than or equal to 10 nm, preferably greater than or equal to 3 nm and less than or equal to 5 nm. As illustrated in FIG. 1C, the height R here is the height of the cluster 106 containing titanium from a reference surface in which a plane of the gate insulating layer 102 and the cluster 106 containing titanium are in contact with each other. In addition, the shape of the cluster 106 containing titanium is not limited to a semispherical shape like a cluster 106a containing titanium in FIG. 1C. The cluster 106 containing titanium may have a semispherical shape which is flattened horizontally like a cluster 106b containing titanium or may have a semispherical shape which is flattened vertically like a cluster 106c containing titanium.

In a channel formation region of the oxide semiconductor layer 103, the plurality of clusters 106 containing titanium are provided in a dispersed manner. Drain current flows through the cluster 106 containing titanium when the thin film transistor is turned on, whereby the field effect mobility can be increased. Further, the oxide semiconductor layer 103 prevents carrier excitation when the thin film transistor is turned off, whereby increase in off current can be suppressed.

The cluster 106 containing titanium has high affinity for oxygen, and thus draws oxygen from the surrounding oxide semiconductor layer 103. As a result, favorable electrical connection can be obtained at an interface between the cluster 106 containing titanium and the oxide semiconductor layer 103.

The source or drain electrode layer 105a has a three-layer structure of a first conductive layer 112a, a second conductive layer 113a, and a third conductive layer 114a while the source or drain electrode layer 105b has a three-layer structure of a first conductive layer 112b, a second conductive layer 113b, and a third conductive layer 114b. Each of the first conductive layers (112a and 112b), the second conductive layers (113a and 113b), and the third conductive layers (114a and 114b) can be formed using a metal material such as aluminum, copper, molybdenum, titanium, chromium, tantalum, tungsten, neodymium, or scandium; an alloy material containing any of these metal materials as its main component; or nitride containing any of these metal materials as its component. In specific, in order to suppress a wiring resistance, each of the first conductive layers (112a and 112b), the second conductive layers (113a and 113b), and the third conductive layers (114a and 114b) is preferably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, it is preferable that the first conductive layers 112a and 112b and the third conductive layers 114a and 114b be formed using titanium that is a heat-resistant conductive material, and the second conductive layers 113a and 113b be formed using an aluminum alloy containing neodymium that is low-resistant. With such a structure, a conductive layer can be formed in which electric resistance and generation of a hillock are suppressed. Note that in this embodiment, the source or drain electrode layer 105a is formed to have a three-layer structure of the first conductive layer 112a, the second conductive layer 113a, and the third conductive layer 114a while the source or drain electrode layer 105b is formed to have a three-layer structure of the first conductive layer 112b, the second conductive layer 113b, and the third conductive layer 114b; however, the source and drain electrode layers 105a and 105b are not limited to this structure. Thus, the source and drain electrode layers 105a and 105 may have a single-layer structure, a two-layer structure, or a stacked structure of four or more layers.

Figure 2A:
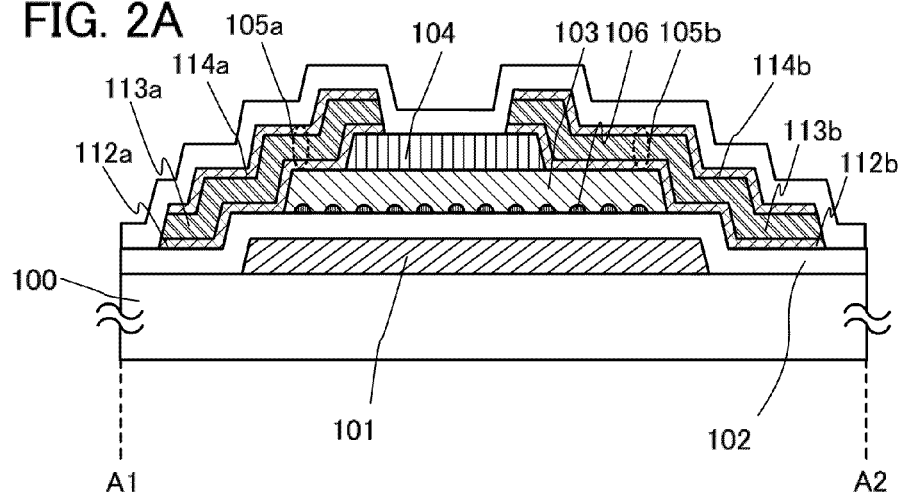
FIGS. 2A to 2C illustrate a semiconductor device according to one embodiment of the present invention.
Figure 2B:
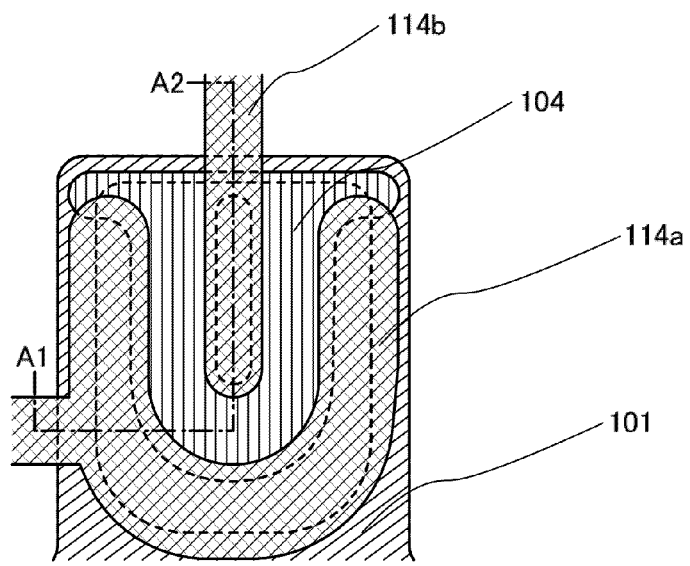
Figure 2C:
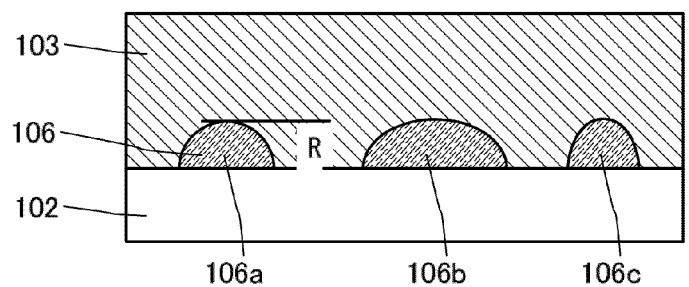

In addition, without limitation to the thin film transistor having an inverted staggered structure illustrated in FIGS. 1A to 1C, a thin film transistor having an inverted staggered structure in which a channel protective layer 104 is provided over the oxide semiconductor layer 103 may be employed as illustrated in FIGS. 2A to 2C. As the channel protective layer 104, a film of an inorganic material (such as silicon oxide, silicon nitride, silicon oxynitride, or silicon nitride oxide) which is formed by a sputtering method or a vapor phase growth method such as a plasma CVD method or a thermal CVD method can be used. The structure in which the channel protective layer 104 is provided over the oxide semiconductor layer 103 can prevent damage to the channel formation region of the oxide semiconductor layer 103 (such as oxidation or reduction in film thickness due to plasma or an etchant in etching at the formation of the oxide semiconductor layer 103) in the manufacturing process. Therefore, reliability of the thin film transistor can be improved. Note that the thin film transistor illustrated in FIGS. 2A to 2C has the same structure as the thin film transistor illustrated in FIGS. 1A to 1C except that the channel protective layer 104 is formed over the oxide semiconductor layer 103, and reference numerals in FIGS. 2A to 2C are the same as those used for the thin film transistor illustrated in FIGS. 1A to 1C.

With such a structure, a cluster containing titanium which has a higher electrical conductance than an oxide semiconductor layer serving as an active layer is formed between the oxide semiconductor layer and a gate insulating layer; thus, field effect mobility can be increased when a thin film transistor is turned on. Further, increase in off current can be suppressed even when the field effect mobility of the thin film transistor is increased.

Note that the structure described in this embodiment can be combined as appropriate with any of the structures described as an example in other embodiments.

Embodiment 2

In Embodiment 2, a manufacturing process of a display device including the thin film transistor described in Embodiment 1 will be described with reference to FIGS. 3A to 3C, FIGS. 4A to 4C, FIGS. 5A to 5C, FIG. 6, FIG. 7, FIG. 8, FIG. 9, FIGS. 10A1 to 10B2, and FIG. 11. FIGS. 3A to 3C, FIGS. 4A to 4C, and FIGS. 5A to 5C are cross-sectional views, and FIG. 6, FIG. 7, FIG. 8, FIG. 9, FIGS. 10A1 to 10B2, and FIG. 11 are plan views. Line A1-A2 and line B1-B2 in each of FIG. 6, FIG. 7, FIG. 8, and FIG. 9 correspond to line A1-A2 and line B1-B2 in each of the cross-sectional views of FIGS. 3A to 3C, FIGS. 4A to 4C, and FIGS. 5A to 5C.

First, a substrate 100 is prepared. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist process temperature of this manufacturing process; or the like. Alternatively, a metal substrate including a stainless steel alloy or the like which is provided with an insulating film over the surface may also be used. As the substrate 100, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

Further, an insulating film may be provided as a base film over the substrate 100. The base film may be formed using a single layer or a stack of layers of a silicon oxide film, a silicon nitride film, a silicon oxynitride film, and/or a silicon nitride oxide film by CVD, sputtering, or the like. In the case where a substrate containing mobile ions such as a glass substrate is used as the substrate 100, a film containing nitrogen such as a silicon nitride film or a silicon nitride oxide film is used as the base film, whereby the mobile ions can be prevented from entering the oxide semiconductor layer.

Figure 6:
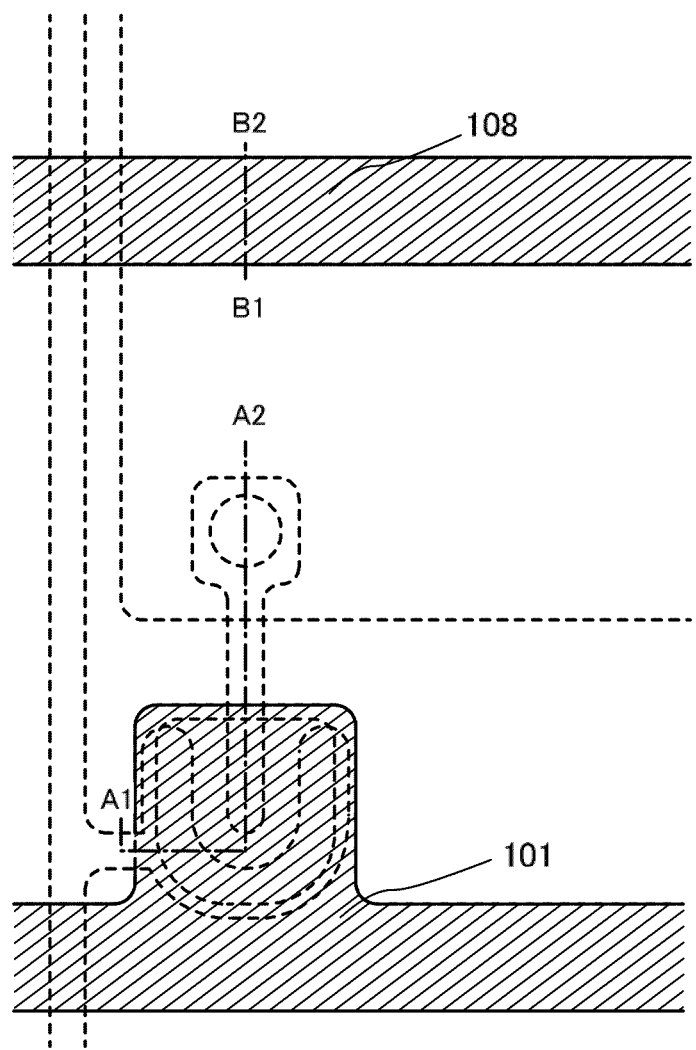
FIG. 6 illustrates a method for manufacturing a semiconductor device according to one embodiment of the present invention.
Figure 7:
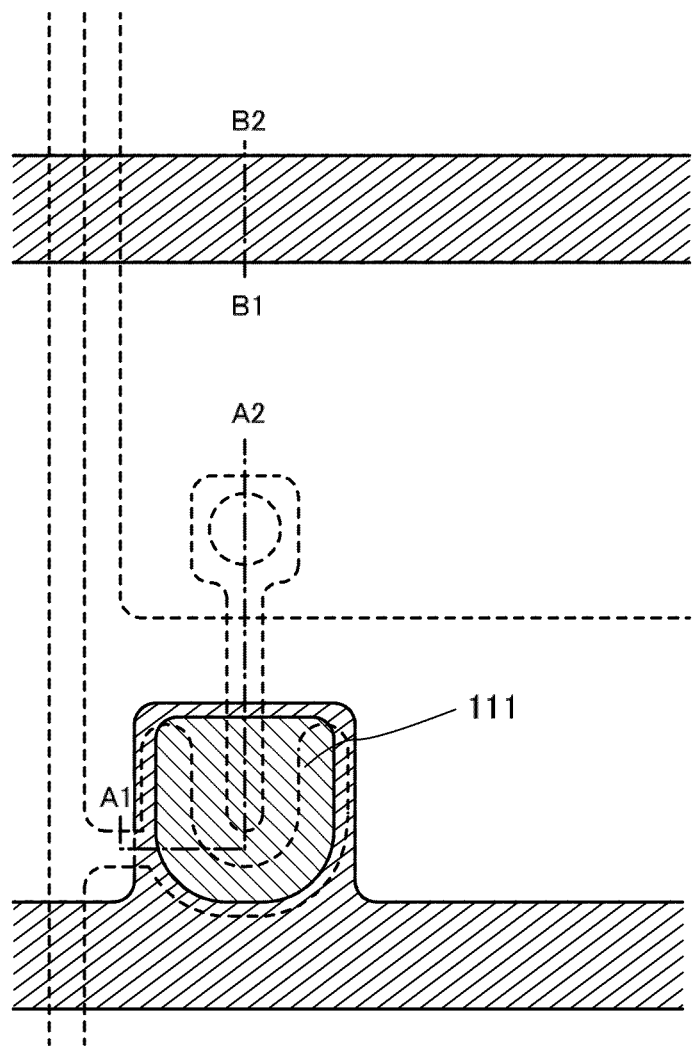
FIG. 7 illustrates a method for manufacturing a semiconductor device according to one embodiment of the present invention.
Figure 8:
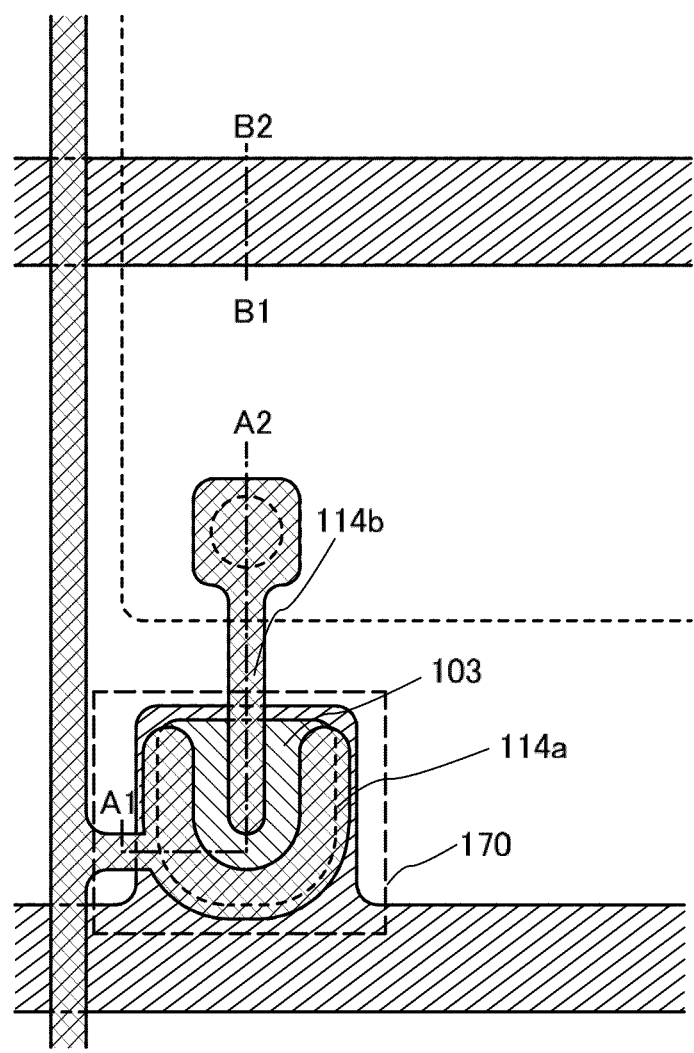
FIG. 8 illustrates a method for manufacturing a semiconductor device according to one embodiment of the present invention.

Next, a conductive film for forming a gate wiring including the gate electrode layer 101, a capacitor wiring 108, and a first terminal 121 is formed over the entire surface of the substrate 100 by a sputtering method or a vacuum evaporation method. Next, a first photolithography step is performed. A resist mask is formed, and unnecessary portions are removed by etching to form wirings and an electrode (the gate wiring including the gate electrode layer 101, the capacitor wiring 108, and the first terminal 121). At this time, etching is preferably performed in such a manner that at least an end portion of the gate electrode layer 101 is tapered in order to prevent disconnection. FIG. 3A is a cross-sectional view at this stage. Note that FIG. 6 is a plan view at this stage.

The gate wiring including the gate electrode layer 101, the capacitor wiring 108, and the first terminal 121 in a terminal portion can be formed to have a single-layer structure or a stacked structure using the conductive material described in Embodiment 1.

Next, the gate insulating layer 102 is formed over the entire surface of the gate electrode layer 101. The gate insulating layer 102 is formed to a thickness of 50 nm to 250 nm by a CVD method, a sputtering method, or the like.

For example, for the gate insulating layer 102, a silicon oxide film with a thickness of 100 nm is formed by a CVD method or a sputtering method. Needless to say, the gate insulating layer 102 is not limited to such a silicon oxide film and may be a single-layer structure or a stacked structure of any other types of insulating films such as a silicon oxynitride film, a silicon nitride oxide film, a silicon nitride film, an aluminum oxide film, and a tantalum oxide film.

Alternatively, for the gate insulating layer 102, a silicon oxide layer can be formed by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Further alternatively, the gate insulating layer 102 may be formed using one kind of oxide, nitride, oxynitride, or nitride oxide of aluminum, yttrium, or hafnium; or a compound including at least two or more kinds of the aforementioned compounds.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 to 70 atomic %, 0.5 to 15 atomic %, 25 to 35 atomic %, and 0.1 to 10 atomic %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 to 30 atomic %, 20 to 55 atomic %, 25 to 35 atomic %, and 10 to 30 atomic %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 atomic %.

Next, a second photolithography step is performed. A resist mask is formed, and unnecessary portions are removed by etching to form a contact hole reaching the wiring or electrode layer which is formed from the same material as the gate electrode layer 101. This contact hole is provided to directly connect the wiring or electrode layer to a conductive film formed later. For example, in the driving circuit portion, a contact hole is formed when a thin film transistor whose gate electrode layer is in direct contact with the source or drain electrode layer or a terminal that is electrically connected to a gate wiring of a terminal portion is formed.

Before an oxide semiconductor film to form the oxide semiconductor layer 103 and the cluster 106 containing titanium are formed, dust attached to a surface of the gate insulating layer is preferably removed by performing reverse sputtering in which an argon gas is introduced to generate plasma in chamber in which the substrate 100 is placed. In addition to this, surface planarity of the gate insulating layer 102 can be improved by performing the reverse sputtering. The reverse sputtering refers to a method in which, without application of a voltage to a target side, an RF power source is used for application of a voltage to a substrate side in an argon atmosphere and plasma is generated on the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film is formed without exposure to air; thus, dust or moisture is prevented from attaching to an interface between the oxide semiconductor layer 103 or the cluster 106 containing titanium and the gate insulating layer 102.

Next, the plurality of clusters 106 containing titanium is formed over the gate insulating layer 102 in a dispersed manner. Other than titanium, niobium (Nb) or tantalum (Ta) may be added so as to improve the electrical conductance. Further, indium (In), zinc (Zn), tin (Sn), molybdenum (Mo), or tungsten (W) may be contained. Note that the electrical conductance of the cluster 106 containing titanium is higher than that of the oxide semiconductor layer 103. Note also that the cluster 106 containing titanium may be crystallized. These clusters containing titanium can be formed by a sputtering method, an evaporation method, a sol-gel method, or the like. The cluster 106 containing titanium is formed so that its height R is greater than 0 nm and less than or equal to 10 nm, preferably greater than or equal to 3 nm and less than or equal to 5 nm. The height R here refers to, similarly to Embodiment 1, the height of the cluster 106 containing titanium from the surface of the gate insulating layer 102 which is in contact with the clusters 106 as a reference surface.

Then, the oxide semiconductor film for forming the oxide semiconductor layer 103 is formed by sputtering in an atmosphere of a rare gas such as argon gas and an oxygen gas, without exposure to air. As the oxide semiconductor film, the oxide semiconductor described in Embodiment 1 can be used; preferably, an In—Ga—Zn—O-based oxide semiconductor is used. As specific conditions of sputtering, an oxide semiconductor target containing indium, gallium, and zinc ($In_2O_3$:$Ga_2O_3$:ZnO=1:1:1) of 8 inches in diameter is used; a distance between the substrate and the target is set to 170 mm; the pressure is set at 0.4 Pa; the direct current (DC) power source is 0.5 kW; a flow rate of a film-formation gas is Ar:$O_2$=50:5 (sccm); and the film formation temperature is set at room temperature. As the target, $Ga_2O_3$ and ZnO in a pellet state may be disposed on a disk of 8 inches in diameter which contains $In_2O_3$. Note that a pulsed direct current (DC) power source is preferably used because dust can be reduced and the thickness distribution is uniform. An In—Ga—Zn—O-based non-single-crystal film is formed to a thickness of greater than or equal to 10 nm and less than or equal to 150 nm, preferably greater than or equal to 20 nm and less than or equal to 60 nm.

In the case of forming the In—Ga—Zn—O-based non-single-crystal film by sputtering, an oxide semiconductor target containing indium, gallium, and zinc may be made to contain an insulating impurity. The examples of the impurity are: insulating oxide typified by silicon oxide, germanium oxide, or the like; insulating nitride typified by silicon nitride, or the like; and insulating oxynitride such as silicon oxynitride. For example, the oxide semiconductor target is preferably made to contain $SiO_2$ at the rate of greater than or equal to 0.1 weight % and less than or equal to 10 weight %, preferably greater than or equal to 1 weight % and less than or equal to 6 weight %.

The oxide semiconductor is made to contain the insulating impurity, whereby the oxide semiconductor film to be formed is easily made amorphous. Besides, in the case where the oxide semiconductor film is subjected to heat treatment, the oxide semiconductor film can be prevented from being crystallized.

In addition to the In—Ga—Zn—O-based oxide semiconductor, a similar effect can be obtained in such a manner that any of the following oxide semiconductor is made to contain the insulating impurity: an In—Sn—Zn—O-based oxide semiconductor, a Sn—Ga—Zn—O-based oxide semiconductor, an In—Zn—O-based oxide semiconductor, a Sn—Zn—O-based oxide semiconductor, a Ga—Zn—O-based oxide semiconductor, an In—O-based oxide semiconductor, a Sn—O-based oxide semiconductor, and a Zn—O-based oxide semiconductor.

For example, in the case where a film of an In—Sn—Zn—O-based oxide semiconductor to which silicon oxide is added is formed by sputtering, a target in which $In_2O_3$, $SnO_2$, ZnO, and $SiO_2$ are sintered at a predetermined ratio is used as a target thereof. In the case of the In—Zn—O based oxide semiconductor to which silicon oxide is added, a film is formed using a target in which $In_2O_3$, ZnO, and $SiO_2$ are sintered at a predetermined ratio as a target thereof. In the case where a film of a Sn—Zn—O-based oxide semiconductor to which silicon oxide is added is formed by sputtering, a target in which $SnO_2$ and ZnO are mixed at a predetermined ratio and $SiO_2$ is added and sintered at a proportion of greater than or equal to 1 weight % and less than or equal to 10 weight %, preferably greater than or equal to 2 weight % and less than or equal to 8 weight % with respect to the total percentage of $SnO_2$ and ZnO is used as a target thereof.

A chamber used for film formation of the In—Ga—Zn—O-based non-single-crystal film may be the same or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a film formation method by sputtering, there are also a reactive sputtering method in which a target substance and a sputtering gas component are chemically reacted with each other during film formation so as to form a thin compound film thereof, and a bias sputtering in which a voltage is also applied to a substrate during film formation.

Next, a third photolithography step is performed. A resist mask is formed, and the In—Ga—Zn—O-based non-single-crystal film is etched. In etching of the In—Ga—Zn—O-based non-single-crystal film, organic acid such as citric acid or oxalic acid can be used for etchant. Here, the In—Ga—Zn—O-based non-single-crystal film is etched by wet etching with the use of ITO-07N (manufactured by KANTO CHEMICAL CO., INC.) to remove unnecessary portions. Thus, the In—Ga—Zn—O-based non-single-crystal film is processed into an island-like shape, whereby the oxide semiconductor layer 103 which is the In—Ga—Zn—O-based non-single-crystal film is formed. At the same time, the cluster 106 containing titanium which is formed in a position that does not to overlap with the oxide semiconductor layer 103 is etched. The end portion of the oxide semiconductor layer 103 is etched into a tapered shape, whereby disconnection of a wiring due to a step shape can be prevented. However, in the case where the cluster 106 containing titanium is not removed completely by etching performed on the In—Ga—Zn—O-based non-single-crystal film at the same time, etching is performed again to remove the remaining cluster 106 containing titanium.

Note that etching here is not limited to wet etching and may be dry etching. As an etching apparatus used for the dry etching, an etching apparatus using a reactive ion etching method (an RIE method) or a dry etching apparatus using a high-density plasma source such as ECR (electron cyclotron resonance) or ICP (inductively coupled plasma) can be used. As a dry etching apparatus by which uniform electric discharge can be obtained over a wider area as compared to an ICP etching apparatus, there is an ECCP (enhanced capacitively coupled plasma) mode apparatus in which an upper electrode is grounded, a high-frequency power source at 13.56 MHz is connected to a lower electrode, and further a low-frequency power source at 3.2 MHz is connected to a lower electrode. This ECCP mode etching apparatus can be applied even when, as the substrate, a substrate, the size of which exceeds 3 m of the tenth generation, is used, for example. A cross-sectional view at this stage is illustrated in FIG. 3B. Note that a plan view at this stage corresponds to FIG. 7.

Next, over the oxide semiconductor layer 103 and the gate insulating layer 102, a first conductive layer 112, a second conductive layer 113, and a third conductive layer 114 which include a metal material are formed by a sputtering method or a vacuum evaporation method. FIG. 3C is a cross-sectional view at this stage.

The first conductive layer 112, the second conductive layer 113, and the third conductive layer 114 can be formed to have a single-layer structure or a stacked structure using the conductive material described in Embodiment 1. In this embodiment, the first conductive layer 112 and the third conductive layer 114 are formed using titanium that is a heat-resistant conductive material, and the second conductive layer 113 is formed using an aluminum alloy containing neodymium. With such a structure, a conductive layer can be formed in which electric resistance and generation of a hillock are suppressed.

Next, a fourth photolithography step is performed to form a resist mask 131, and unnecessary portions are removed by etching, whereby source and drain electrode layers 105a and 105b, the oxide semiconductor layer 103, and a connection electrode 120 are formed. Wet etching or dry etching is used as an etching method at this time. For example, when the first and third conductive layers 112 and 114 are formed using titanium and the second conductive layer 113 is formed using an aluminum alloy containing neodymium, wet etching can be performed using a hydrogen peroxide solution, heated hydrochloric acid, or a nitric acid aqueous solution containing ammonium fluoride as an etchant. For example, the first conductive layer 112, the second conductive layer 113, and the third conductive layer 114 can be etched collectively with the use of KSMF-240 (manufactured by KANTO CHEMICAL CO., INC.). In this etching step, a region to be exposed in the oxide semiconductor layer 103 is also partly etched; thus, a region whose thickness is smaller than the thickness of a region overlapping with the source and drain electrode layers 105a and 105b is formed between the source and drain electrode layers 105a and 105b. Accordingly, a channel formation region which includes the oxide semiconductor layer 103 and the cluster 106 containing titanium overlaps with the small-thickness region of the oxide semiconductor layer 103.

In FIG. 4A, the first conductive layer 112, the second conductive layer 113, the third conductive layer 114, and the oxide semiconductor layer 103 can be etched in one step by etching in which a hydrogen peroxide solution, heated hydrochloric acid, or a nitric acid aqueous solution containing ammonium fluoride is used as etchant; therefore, end portions of the source or drain electrode layers 105a and 105b and the oxide semiconductor layer 103 are aligned with each other, and a continuous structure can be formed. In addition, wet etching allows the layers to be etched isotropically, so that the end portions of the source or drain electrode layers 105a and 105b are recessed from the resist mask 131. Through the aforementioned steps, a thin film transistor 170 which includes the oxide semiconductor layer 103 and the cluster 106 containing titanium as the channel formation region can be manufactured. A cross-sectional view at this stage is illustrated in FIG. 4A. Note that a plan view at this stage corresponds to FIG. 8.

In a fourth photolithography step, a second terminal 122 made from the same material as the source or drain electrode layers 105a and 105b is also left in the terminal portion. Note that the second terminal 122 is electrically connected to a source wiring (a source wiring including the source or drain electrode layers 105a and 105b).

In addition, in the terminal portion, the connection electrode 120 is directly connected to the first terminal 121 of the terminal portion through a contact hole formed in the gate insulating layer 102. Note that although not illustrated here, a source or drain wiring of the thin film transistor of the driver circuit is directly connected to the gate electrode through the same steps as the aforementioned steps.

As shown in the above steps, two masks are used; one in the third photolithography step for processing the oxide semiconductor layer 103 and the cluster 106 containing titanium into an island-like shape, and the other in the fourth photolithography step for forming the source and drain electrode layers 105a and 105b. However, with the use of a resist mask having regions with plural thicknesses (typically, two different thicknesses) which is formed using a multi-tone (high-tone) mask, the number of resist masks can be reduced, resulting in simplified process and lower costs. A method for manufacturing a thin film transistor 171 by a photolithography step using a multi-tone mask is described with reference to FIGS. 5A to 5C.

First, similarly to the above-described steps, the plurality of clusters containing titanium is formed over the gate insulating layer 102 in a dispersed manner, and then the oxide semiconductor film is formed without exposure to air.

Next, without a step of processing the oxide semiconductor film and the cluster containing titanium into an island-like shape, the first conductive layer 112, the second conductive layer 113, and the third conductive layer 114 which include a metal material are formed by a sputtering method or a vacuum evaporation method over the entire surface of the oxide semiconductor film. Note that the first conductive layer 112, the second conductive layer 113, and the third conductive layer 114 are formed in a manner similar to that of the above-described steps. A cross-sectional view at this stage is illustrated in FIG. 5A.

Then, a resist mask 132 having regions with a plurality of different thicknesses is formed over the third conductive layer 114 as illustrated in FIG. 5B by light exposure using a multi-tone (high-tone) mask with which transmitted light has a plurality of intensity. The resist mask 132 has a small-thickness region in a region that overlaps with part of the gate electrode layer 101. Next, the first conductive layer 112, the second conductive layer 113, and the third conductive layer 114 are etched and processed into an island-like shape using the resist mask 132 to form a conductive layer 115. A cross-sectional view at this stage corresponds to FIG. 5B.

After that, the resist mask 132 is subjected to ashing so that a resist mask 131 is formed. As FIG. 5C illustrates, the area and the thickness of the resist mask 131 are reduced and the resist in the small-thickness region is removed.

Finally, with use of the resist mask 131, the conductive layer 115 is etched, whereby the source or drain electrode layers 105a and 105b are formed. In this etching step, a region to be exposed in the oxide semiconductor layer 103 is also partly etched; thus, a region whose thickness is smaller than the thickness of a region overlapping with the source or drain electrode layer 105a and 105b is formed between the source or drain electrode layers 105a and 105b. Since the area of the resist mask 131 is reduced, the end portions of the source and drain electrode layers 105a and 105b are also etched. The cross-sectional view of this stage corresponds to FIG. 5C.

After the resist mask 131 is removed, heat treatment is preferably performed at 200° C. to 600° C., typically, 250° C. to 500° C. Here, heat treatment is performed in a nitrogen atmosphere in a furnace at 350° C. for one hour. Through this heat treatment, rearrangement at the atomic level occurs in the In—Ga—Zn—O-based non-single-crystal film. Since strain (energy) which inhibits carrier transport is released by the heat treatment, the heat treatment (including optical annealing) is important. Note that there is no particular limitation on the timing of heat treatment as long as it is performed after formation of the In—Ga—Zn—O-based non-single-crystal film, and for example, heat treatment may be performed after formation of a pixel electrode. Moreover, the electrical conductance of the cluster 106 containing titanium can be improved by crystallization of the cluster 106 containing titanium through the above heat treatment.

Further, the exposed channel formation region of the oxide semiconductor layer 103 may be subjected to oxygen radical treatment. The oxygen radical treatment is performed, whereby the thin film transistor can be normally off. In addition, the radical treatment can repair damage due to the etching of the oxide semiconductor layer 103. The radical treatment is preferably performed in an atmosphere of $O_2$ or $N_2O$, and preferably an atmosphere of $N_2$, He, or Ar each containing oxygen. Alternatively, the radical treatment may be performed in an atmosphere in which $Cl_2$ or $CF_4$ are added to the above atmosphere. Note that the radical treatment is preferably performed with no bias applied.

Next, a protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Then, a fifth photolithography step is performed to form a resist mask, and the protective insulating layer 107 is etched to form a contact hole 125 that reaches the drain electrode layer 105b. In addition, by the etching here, a contact hole 127 that reaches the second terminal 122 and a contact hole 126 that reaches the connection electrode 120 are also formed. A cross-sectional view at the stage after removing the resist mask is illustrated in FIG. 4B.

Then, a transparent conductive film is formed. The transparent conductive film is formed using indium oxide ($In_2O_3$), an alloy of indium oxide and tin oxide ($In_2O_3$—$SnO_2$, abbreviated to ITO), or the like by a sputtering method, a vacuum evaporation method, or the like. Etching treatment of such a material is performed with a hydrochloric-acid-based solution. Instead, since a residue tends to be generated particularly in etching of ITO, an alloy of indium oxide and zinc oxide ($In_2O_3$—ZnO) may be used in order to improve etching processability.

Next, a sixth photolithography step is performed to form a resist mask, and unnecessary portions are removed by etching, whereby a pixel electrode layer 110 is formed.

Further, in this sixth photolithography step, a storage capacitor is formed with the capacitor wiring 108 and the pixel electrode layer 110, in which the gate insulating layer 102 and the protective insulating layer 107 in a capacitor portion are used as a dielectric.

In addition, in this sixth photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which functions as an input terminal for the gate wiring. The transparent conductive film 129 formed over the second terminal 122 serves as a terminal electrode for connection which functions as an input terminal for the source wiring.

Then, the resist mask is removed, and a cross-sectional view at this stage is illustrated in FIG. 4C. Note that a plan view at this stage corresponds to FIG. 9.

Further, FIGS. 10A1 and 10A2 are a cross-sectional view of a gate wiring terminal portion at this stage and a plan view thereof, respectively. FIG. 10A1 corresponds to a cross-sectional view taken along line C1-C2 in FIG. 10A2. In FIG. 10A1, a transparent conductive film 155 formed over a protective insulating film 154 is a terminal electrode for connection which functions as an input terminal. Furthermore, in FIG. 10A1, in the terminal portion, a first terminal 151 formed from the same material as the gate wiring and a connection electrode 153 formed from the same material as the source wiring overlap with each other with a gate insulating layer 152 interposed therebetween so that the first terminal 151 and the connection electrode 153 are in direct contact with each other to form conduction therebetween. In addition, the connection electrode 153 and the transparent conductive film 155 are in direct contact with each other through a contact hole provided in the protective insulating film 154 to form conduction therebetween.

Further, FIGS. 10B1 and 10B2 are a cross-sectional view of a source wiring terminal portion and a plan view thereof, respectively. In addition, FIG. 10B1 corresponds to a cross-sectional view taken along line D1-D2 in FIG. 10B2. In FIG. 10B1, the transparent conductive film 155 formed over the protective insulating film 154 is a terminal electrode for connection which functions as an input terminal. Furthermore, in FIG. 10B1, in the terminal portion, an electrode 156 formed from the same material as the gate wiring is located below and overlapped with a second terminal 150, which is electrically connected to the source wiring, with the gate insulating layer 102 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing prevent noise or static electricity can be formed. In addition, the second terminal 150 is electrically connected to the transparent conductive film 155 with the protective insulating film 154 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, a third terminal at the same potential as the capacitor wiring, and the like are each arranged in plurality. There is no particular limitation on the number of each of the terminals, and the number of the terminals may be determined by a practitioner as appropriate.

Through these six photolithography steps, the storage capacitor and a pixel thin film transistor portion including the thin film transistor 170 which is a bottom-gate n-channel thin film transistor can be completed using the six photomasks. These are arranged in matrix in respective pixels so that a pixel portion is formed, whereby one of substrates for manufacturing an active matrix display device can be obtained. In this specification, such a substrate is referred to as an active matrix substrate for convenience.

When an active matrix liquid crystal display device is manufactured, an active matrix substrate and a counter substrate provided with a counter electrode are fixed to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. This fourth terminal is provided so that the common electrode is fixed to a predetermined potential such as GND or 0 V.

Figure 9:
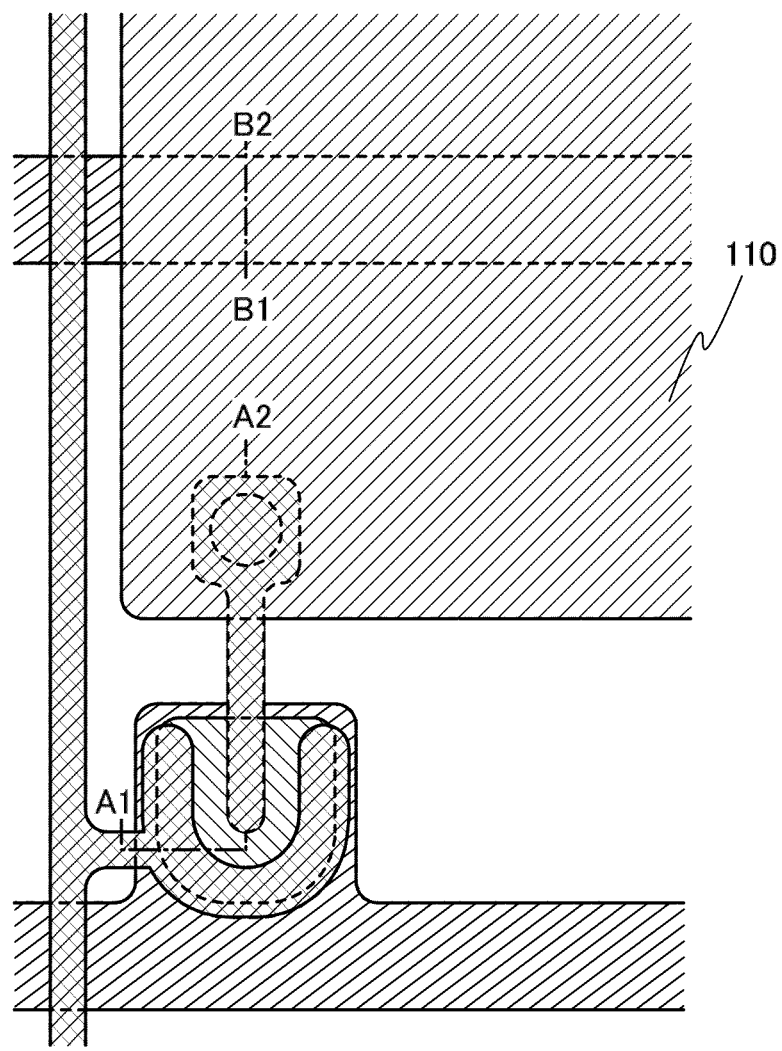
FIG. 9 illustrates a method for manufacturing a semiconductor device according to one embodiment of the present invention.
Figure 11:
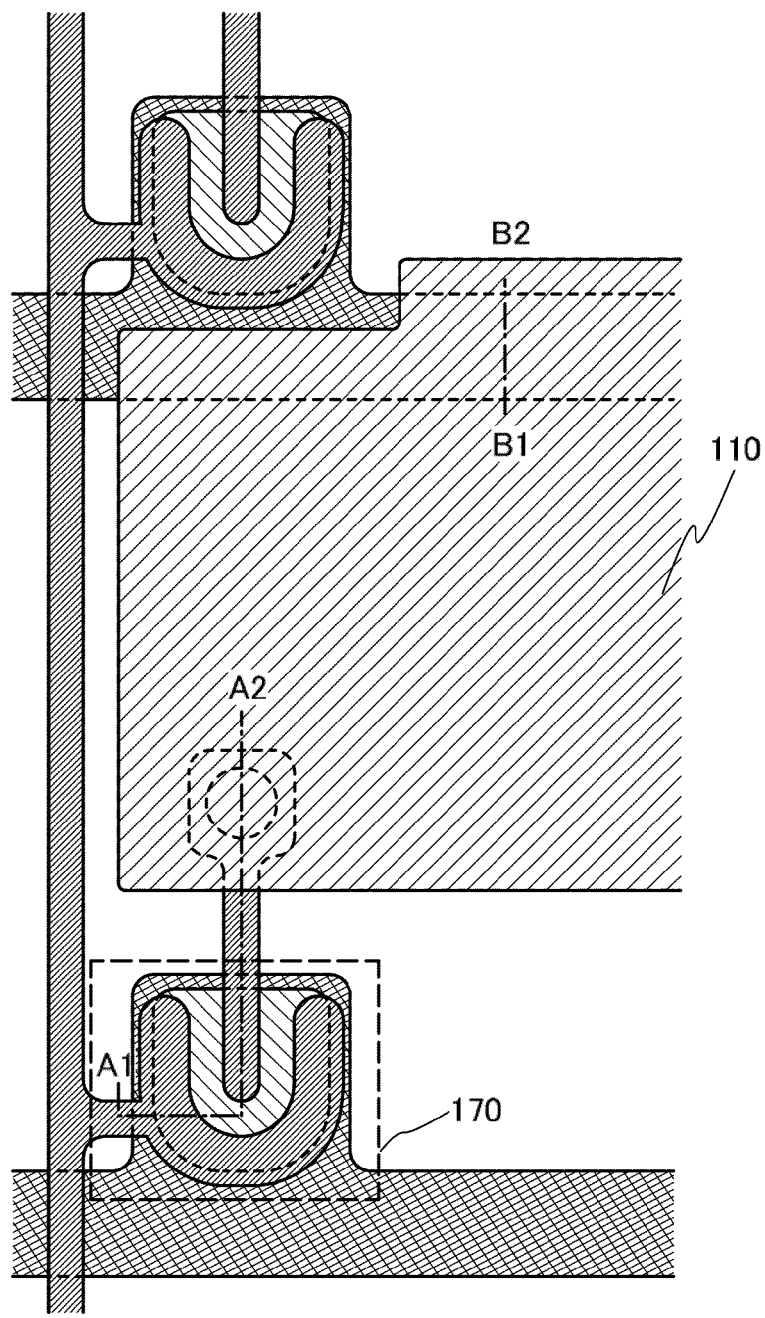
FIG. 11 illustrates a semiconductor device according to one embodiment of the present invention.

Further, this embodiment is not limited to a structure of pixel in FIG. 9, and an example of a plan view different from FIG. 9 is illustrated in FIG. 11. FIG. 11 illustrates an example in which a capacitor wiring is not provided and a storage capacitor is formed with the pixel electrode and a gate wiring of an adjacent pixel which are overlapped with each other with a protective insulating film and a gate insulating layer interposed therebetween. In this case, the capacitor wiring and the third terminal connected to the capacitor wiring can be omitted. Note that in FIG. 11, portions similar to those in FIG. 9 are denoted by the same reference numerals.

In an active matrix liquid crystal display device, pixel electrodes arranged in a matrix are driven, whereby a display pattern is formed on a screen. Specifically, a voltage is applied between a selected pixel electrode and a counter electrode corresponding to the pixel electrode, whereby a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably 2 times or more as high as a usual vertical synchronizing frequency, whereby the response speed is increased, and gray level to be written is selected for a plurality of divided fields in each frame.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used, or an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

These driving methods are combined, whereby the display characteristics of a liquid crystal display device, such as moving-image characteristics, can be improved as compared to those of conventional liquid crystal display devices.

The n-channel transistor obtained in this embodiment includes an In—Ga—Zn—O-based non-single-crystal film in a channel formation region and has good dynamic characteristics. Thus, these driving methods can be applied in combination with the n-channel transistor of this embodiment.

When a light-emitting display device is manufactured, one electrode (also referred to as a cathode) of an organic light-emitting element is set to a low power supply potential such as GND or 0 V; therefore, a terminal portion is provided with the fourth terminal for setting the cathode to a low power supply potential such as GND or 0 V. In addition, when a light-emitting display device is manufactured, a power supply line is provided in addition to a source wiring and a gate wiring. Therefore, a terminal portion is provided with a fifth terminal electrically connected to the power supply line.

With such a structure, in a thin film transistor using an oxide semiconductor layer, a cluster containing titanium, whose electrical conductance is higher than the oxide semiconductor layer serving as an active layer, is formed between the oxide semiconductor layer and a gate insulating layer; thus, the field effect mobility can be increased when the thin film transistor is turned on. Further, increase in off current can be suppressed even when the field effect mobility of the thin film transistor is increased.

A display device with high electric characteristics and high reliability can be provided using the thin film transistor in a pixel portion or a driver circuit portion of the display device.

Note that the structure described in this embodiment can be combined as appropriate with any of the structures described as an example in other embodiments.

Embodiment 3

In this embodiment, a thin film transistor having a different shape from the thin film transistor described in Embodiment 1 is described with reference to FIG. 12.

Figure 12:
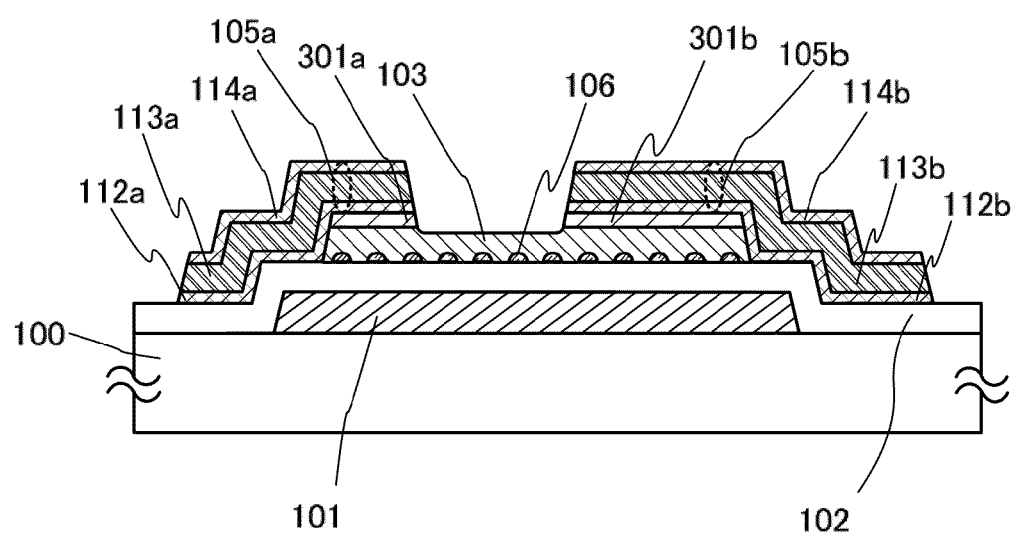
FIG. 12 illustrates a semiconductor device according to one embodiment of the present invention.

A thin film transistor having a bottom-gate structure of this embodiment is illustrated in FIG. 12. In the thin film transistor illustrated in FIG. 12, the gate electrode layer 101 is provided over the substrate 100, the gate insulating layer 102 is provided over the gate electrode layer 101, the plurality of clusters 106 containing titanium is provided over the gate insulating layer 102 in a dispersed manner, the oxide semiconductor layer 103 is provided over the gate insulating layer 102 and the plurality of clusters 106 containing titanium, buffer layers 301a and 301b are provided over the oxide semiconductor layer 103, and the source and drain electrode layers 105a and 105b are provided over the buffer layers 301a and 301b. The source or drain electrode layer 105a has a three-layer structure of the first conductive layer 112a, the second conductive layer 113a, and the third conductive layer 114a while the source or drain electrode layer 105b has a three-layer structure of the first conductive layer 112b, the second conductive layer 113b, and the third conductive layer 114b. That is, the thin film transistor illustrated in FIG. 12 has a structure in which the buffer layers 301a and 301b are provided between the oxide semiconductor layer 103 and the source and drain electrode layers 105a and 105b in the thin film transistor illustrated in FIGS. 1A to 1C in Embodiment 1.

The buffer layers 301a and 301b which function as a source region and a drain region have n-type conductivity and a higher electrical conductance than the oxide semiconductor layer 103.

As examples of a material with n-type conductivity having a higher electrical conductance than the oxide semiconductor layer 103, which can be used for the buffer layers 301a and 301b, the following can be given: an In—Ga—Zn—O-based non-single-crystal film containing indium, gallium, and zinc, which is formed under conditions different from those of the oxide semiconductor layer 103; and a film containing indium, gallium, zinc, oxygen, and nitrogen.

An In—Ga—Zn—O-based non-single-crystal film used for the buffer layers 301a and 301b can be formed by sputtering. Note that the conditions of forming the In—Ga—Zn—O-based non-single-crystal film used for the buffer layers 301a and 301b are different from those of forming the In—Ga—Zn—O-based non-single-crystal film used for the oxide semiconductor layer. For example, the proportion of the flow rate of the oxygen gas in the film formation condition for forming the In—Ga—Zn—O-based non-single-crystal film used for the buffer layers 301a and 301b is set to be lower than that of the flow rate of the oxygen gas in the film formation condition for forming the In—Ga—Zn—O-based non-single-crystal film used for the oxide semiconductor layer. In addition, the In—Ga—Zn—O-based non-single-crystal film used for the buffer layers 301a and 301b may be formed in an atmosphere of rare gas such as an argon gas without containing an oxygen gas.

As specific conditions of sputtering, an oxide semiconductor target containing indium, gallium, and zinc ($In_2O_3$:$Ga_2O_3$:$ZnO$=1:1:1) of 8 inches in diameter is used; a distance between the substrate and the target is set to 170 mm; the pressure is set at 0.4 Pa; the direct current (DC) power source is 0.5 kW; the flow rate of a film-formation gas is Ar:$O_2$=50:1 (sccm); and the film formation temperature is set at room temperature.

Further, the In—Ga—Zn—O-based non-single-crystal films used for the buffer layers 301a and 301b include at least an amorphous component. In some cases, the In—Ga—Zn—O-based non-single-crystal films include crystal grains (nanocrystals) in the amorphous structure. The crystal grains (nanocrystals) each have a diameter of 1 nm to 10 nm, typically approximately 2 nm to 4 nm.

The thickness of the In—Ga—Zn—O-based non-single-crystal film used for the buffer layers 301a and 301b is set to 5 nm to 20 nm Needless to say, when the film includes crystal grains, the above-described size of the crystal grains does not exceed the thickness of the film. In this embodiment, the thickness of the In—Ga—Zn—O-based non-single-crystal film used for the buffer layers 301a and 301b is set to 5 nm.

The buffer layers 301a and 301b may contain an impurity element imparting n-type conductivity. As the impurity element, it is possible to use, for example, magnesium, aluminum, titanium, iron, tin, calcium, germanium, scandium, yttrium, zirconium, hafnium, boron, thallium, or lead. In the case where magnesium, aluminum, titanium, or the like is contained in the buffer layers, there is an effect of blocking oxygen, and the like, so that the oxygen concentration of the oxide semiconductor layer can be kept within an optimal range by heat treatment or the like after the film formation.

The carrier concentration of the buffer layers is preferably greater than or equal to $1\times10^{18}$/cm$^3$ (and less than or equal to $1\times10^{22}$/cm$^3$).

The percentage (N/O) of nitrogen (N) to oxygen (O) in oxynitride containing indium, gallium, zinc, oxygen, and nitrogen which is used for the buffer layers 301a and 301b is in the range of greater than or equal to 5 atomic % and less than or equal to 80 atomic %, preferably in the range of greater than or equal to 10 atomic % and less than or equal to 50 atomic %. A conductive oxynitride film containing indium, gallium, zinc, oxygen, and nitrogen, which is used for the buffer layers, can be formed in such a manner that film formation is performed by a sputtering method with use of a target including oxide containing indium, gallium, and zinc in an atmosphere containing nitrogen and heat treatment is performed.

As specific conditions of sputtering, a target of 12 inches in diameter in which oxide containing indium, gallium, and zinc is sintered ($In_2O_3$:$Ga_2O_3$:ZnO=1:1:1) is used; a distance between the substrate and the target is set to 60 mm; the pressure is set at 0.4 Pa; the direct current (DC) power source is 0.5 kW; and the film formation is performed in an atmosphere of a mixed gas of argon and nitrogen. The thickness of the oxynitride film is 2 nm to 100 nm. The film formation is performed with a total flow rate of the mixed gas of 40 sccm in which the nitrogen gas is mixed in the range of 1 sccm to 40 sccm. In this embodiment, the thickness of the conductive oxynitride film used for the buffer layers is 5 nm.

With such a structure, provision of the buffer layers 301a and 301b can make thermal stability improved more than formation of Schottky junction do, between the oxide semiconductor layer and the source and drain electrode layers 105a and 105b, whereby operating characteristics of the thin film transistor can be stabilized. In addition, because of high electrical conductivity, favorable mobility can be kept even when high drain voltage is applied.

Note that as for a structure and materials of the thin film transistor of this embodiment other than the buffer layers 301a and 301b, Embodiment 1 is to be referred to.

A manufacturing process of the thin film transistor of this embodiment is almost similar to the manufacturing process of the thin film transistor described in Embodiment 2. First, by the method described in Embodiment 2, steps up to forming the oxide semiconductor film for forming the oxide semiconductor layer 103 are performed. Following the above steps, an n-type material film having a higher electrical conductance than the oxide semiconductor layer 103 for forming the buffer layers 301a and 301b is formed by sputtering with the use of the above method. Next, by the third photolithography step, in a manner similar to that of formation of the oxide semiconductor layer 103, the n-type material film having a higher electrical conductance than the oxide semiconductor layer 103 is etched into an island-like shape, whereby a buffer layer 302 is formed (see FIG. 13A). Then, by the method described in Embodiment 2, the first conductive layer 112, the second conductive layer 113, and the third conductive layer 114 are formed (see FIG. 13B). Next, by the fourth photolithography step, the source and drain electrode layers 105a and 105b, the oxide semiconductor layer 103, and the buffer layers 301a and 301b are formed (see FIG. 13C). Subsequent steps are similar to those of Embodiment 2.

Note that the structure described in this embodiment can be combined as appropriate with any of the structures described as an example in other embodiments.

By providing the buffer layer 302 having a higher electrical conductance than the oxide semiconductor layer 103, operation of a thin film transistor can be made stable. Field effect mobility can be increased when the thin film transistor is in an on state. In addition, an increase in off current can be suppressed even when the field effect mobility of the thin film transistor is increased.

Embodiment 4

Embodiment 4 will describe an inverter circuit formed using two thin film transistors described in Embodiment 1.

A driver circuit which is configured to drive a pixel portion is formed using an inverter circuit, a capacitor, a resistor, and the like. When two n-channel TFTs are combined to form an inverter circuit, there are two types of combinations: a combination of an enhancement-type transistor and a depletion-type transistor (hereinafter a circuit formed by such a combination is referred to as an "EDMOS circuit") and a combination of enhancement-type TFTs (hereinafter a circuit formed by such a combination is referred to as an "EEMOS circuit"). Note that when the threshold voltage of the n-channel TFT is positive, the n-channel TFT is defined as an enhancement-type transistor, while when the threshold voltage of the n-channel TFT is negative, the n-channel TFT is defined as a depletion-type transistor, and this specification follows the above definition.

The pixel portion and the driver circuit are formed over one substrate. In the pixel portion, on and off of voltage application to a pixel electrode are switched using enhancement-type transistors arranged in a matrix. An oxide semiconductor is used for these enhancement-type transistors arranged in the pixel portion. The enhancement-type transistor has electric characteristics such as small leakage current; and therefore low power consumption driving can be realized.

Figure 14A:
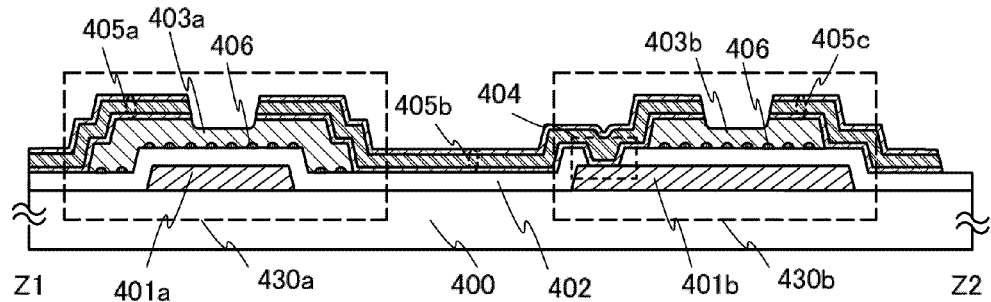
FIGS. 14A to 14C illustrate a semiconductor device according to one embodiment of the present invention.
Figure 14B:
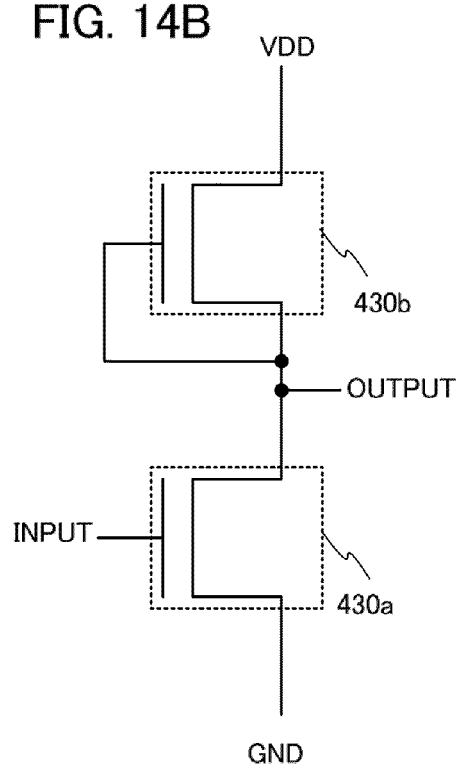
Figure 14C:
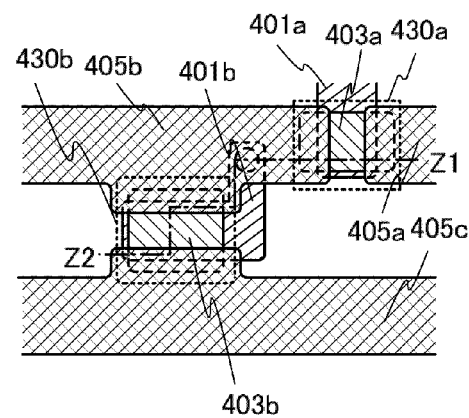

FIG. 14A illustrates a cross-sectional structure of the inverter circuit of the driver circuit. Note that a first thin film transistor 430a and a second thin film transistor 430b illustrated in FIGS. 14A to 14C are the inverted staggered thin film transistors which are one embodiment of the present invention.

In the first thin film transistor 430a illustrated in FIG. 14A, a first gate electrode layer 401a is provided over a substrate 400, a gate insulating layer 402 is provided over the first gate electrode layer 401a, a plurality of clusters 406 containing titanium is provided over the gate insulating layer 402 in a dispersed manner, a first oxide semiconductor layer 403a is provided over the gate insulating layer 402 and the plurality of clusters 406 containing titanium, and a first wiring 405a and a second wiring 405b are provided over the first oxide semiconductor layer 403a. In a similar manner, also in the second thin film transistor 430b, a second gate electrode layer 401b is provided over the substrate 400, the gate insulating layer 402 is provided over the second gate electrode layer 401b, the plurality of clusters 406 containing titanium are provided over the gate insulating layer 402 in a dispersed manner, a second oxide semiconductor layer 403b is provided over the gate insulating layer 402 and the clusters 406 containing titanium, and the second wiring 405b and a third wiring 405c are provided over the second oxide semiconductor layer 403b. Here, the second wiring 405b is directly connected to the second gate electrode layer 401b through a contact hole 404 formed in the gate insulating layer 402. At least part of the first oxide semiconductor layer 403a and the second oxide semiconductor layer 403b are provided in contact with an upper surface of the gate insulating layer 402. Note that as for the structures and materials of the respective portions, the thin film transistor described in Embodiment 2 is to be referred to.

The first wiring 405a is a power supply line at a ground potential (a ground power supply line). This power supply line at a ground potential may be a power supply line to which a negative voltage $V_{DL}$ is applied (a negative power supply line). The third wiring 405c is a power supply line to which a positive voltage $V_{DD}$ is applied (a positive power supply line).

As illustrated in FIG. 14A, the second wiring 405b which is electrically connected to both the first oxide semiconductor layer 403a and the second oxide semiconductor layer 403b is directly connected to the second gate electrode layer 401b of the second thin film transistor 430b through the contact hole 404 formed in the gate insulating layer 402. By the direct connection between the second wiring 405b and the second gate electrode layer 401b, favorable contact can be obtained, which leads to reduction in contact resistance. In comparison with the case where the second gate electrode layer 401b and the second wiring 405b are connected to each other with another conductive film, for example, a transparent conductive film interposed therebetween, reduction in the number of contact holes and reduction in an occupied area due to the reduction in the number of contact holes can be achieved.

Further, FIG. 14C is a top view of the inverter circuit of the driver circuit. In FIG. 14C, a cross section taken along the chain line Z1-Z2 corresponds to FIG. 14A.

Further, FIG. 14B illustrates an equivalent circuit of the EDMOS circuit. The circuit connection illustrated in FIGS. 14A and 14C corresponds to that illustrated in FIG. 14B. An example in which the first thin film transistor 430a is an enhancement-type n-channel transistor and the second thin film transistor 430b is a depletion-type n-channel transistor is illustrated.

In order to manufacture an enhancement-type n-channel transistor and a depletion-type n-channel transistor over one substrate, for example, the first oxide semiconductor layer 403a and the second semiconductor layer 403b are formed using different materials or under different conditions. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Alternatively, without limitation to the EDMOS circuit, an EEMOS circuit can be manufactured in such a manner that the first thin film transistor 430a and the second thin film transistor 430b are enhancement-type n-channel transistors. In that case, the third wiring 405c and the second gate electrode layer 401b are connected to each other instead of the connection between the second wiring 405b and the second gate electrode layer 401b.

With such a structure, a cluster containing titanium which has a higher electrical conductance than an oxide semiconductor layer serving as an active layer is formed between the oxide semiconductor layer and a gate insulating layer; thus, field effect mobility can be increased when a thin film transistor is turned on. Further, increase in off current can be suppressed even when the field effect mobility of the thin film transistor is increased.

Note that the structure described in this embodiment can be combined as appropriate with any of the structures described as an example in other embodiments.

Embodiment 5

In this embodiment, with reference to FIGS. 15A and 15B, FIG. 16, FIG. 17, FIG. 18, FIG. 19 and FIG. 20, an example will be described in which at least part of a driver circuit and a thin film transistor arranged in a pixel portion are manufactured over one substrate in a display device as an example of a semiconductor device which is one embodiment of the present invention.

The thin film transistor to be arranged over the substrate is formed by the method described as an example in other embodiments. The obtained thin film transistor is an n-channel TFT; therefore, part of a driver circuit which can be formed using an n-channel TFT is formed over the same substrate as the thin film transistor of the pixel portion.

Figure 15A:
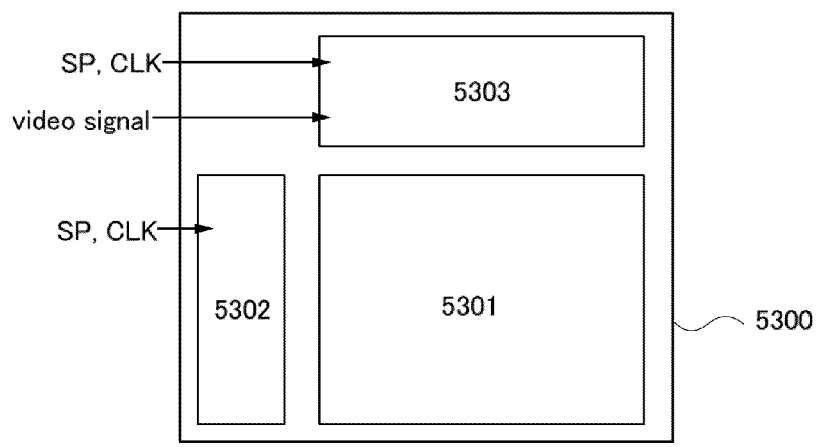
FIGS. 15A and 15B each illustrate a block diagram of a semiconductor device.

FIG. 15A illustrates an example of a block diagram of an active matrix liquid crystal display device which is an example of a semiconductor device as one embodiment of the present invention. The display device illustrated in FIG. 15A includes, over a substrate 5300, a pixel portion 5301 having a plurality of pixels each provided with a display element, a scan-line driver circuit 5302 that selects each pixel, and a signal-line driver circuit 5303 that controls a video signal input to a selected pixel.

The pixel portion 5301 is connected to the signal-line driver circuit 5303 with a plurality of signal lines S1 to Sm (not illustrated) extending in a column direction from the signal-line driver circuit 5303 and connected to the scan-line driver circuit 5302 with a plurality of scan lines G1 to Gn (not illustrated) extending in a row direction from the scan-line driver circuit 5302. The pixel portion 5301 includes a plurality of pixels (not illustrated) arranged in a matrix so as to correspond to the signal lines S1 to Sm and the scan lines G1 to Gn. In addition, each of the pixels is connected to a signal line Sj (any one of the signal lines S1 to Sm) and a scan line Gi (any one of the scan lines G1 to Gn).

Figure 16:
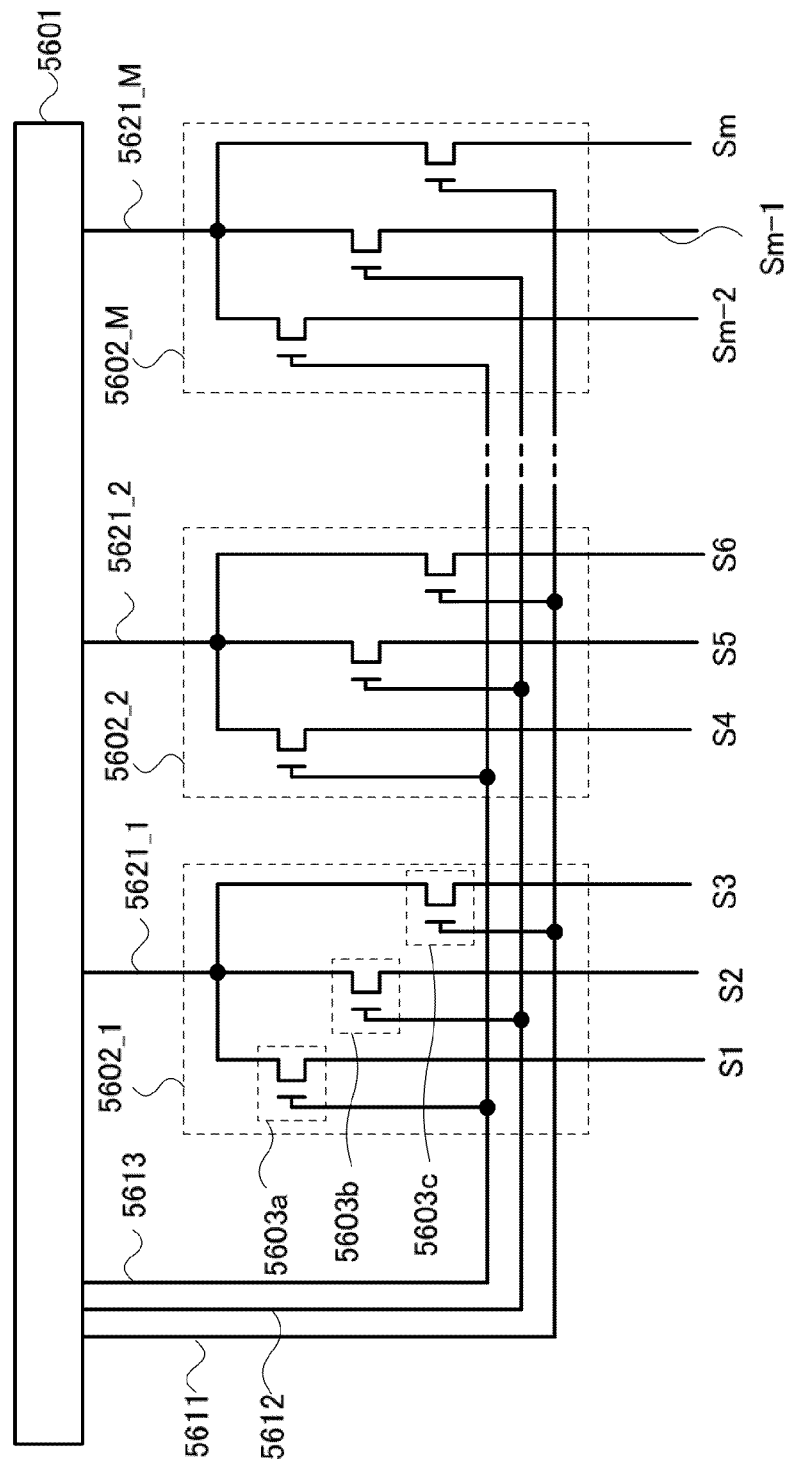
FIG. 16 illustrates a configuration of a signal line driver circuit.

Referring to FIG. 16, description will be made about a signal-line driver circuit which includes an n-channel TFT described as an example in other embodiments.

The signal-line driver circuit illustrated in FIG. 16 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and the wirings 5621_1 to 5621_M corresponding to the switch groups 5602_1 to 5602_M, respectively. Each of the wirings 5621_1 to 5621_M is connected to three signal lines (a signal line Sm−2, a signal line Sm−1, and a signal line Sm (m=3M)) through the first thin film transistor 5603a, the second thin film transistor 5603b, and the third thin film transistor 5603c. For example, a wiring 5621_J of the J-th column (any one of the wirings 5621_1 to 5621_M) is connected to a signal line Sj−2, a signal line Sj−1, and a signal line Sj (j=3J) through the first thin film transistor 5603a, the second thin film transistor 5603b, and the third thin film transistor 5603c of a switch group 5602_J.

Note that a signal is input to each of the first wiring 5611, the second wiring 5612, and the third wiring 5613.

Note that the driver IC 5601 is preferably formed using a single crystal semiconductor. Further, the switch groups 5602_1 to 5602_M are preferably formed over the same substrate as the pixel portion. Therefore, the driver IC 5601 is preferably connected to the switch groups 5602_1 to 5602_M through an FPC or the like. Alternatively, a single crystal semiconductor layer may be provided over the same substrate as the pixel portion by a method such as bonding to form the driver IC 5601.

Figure 17:
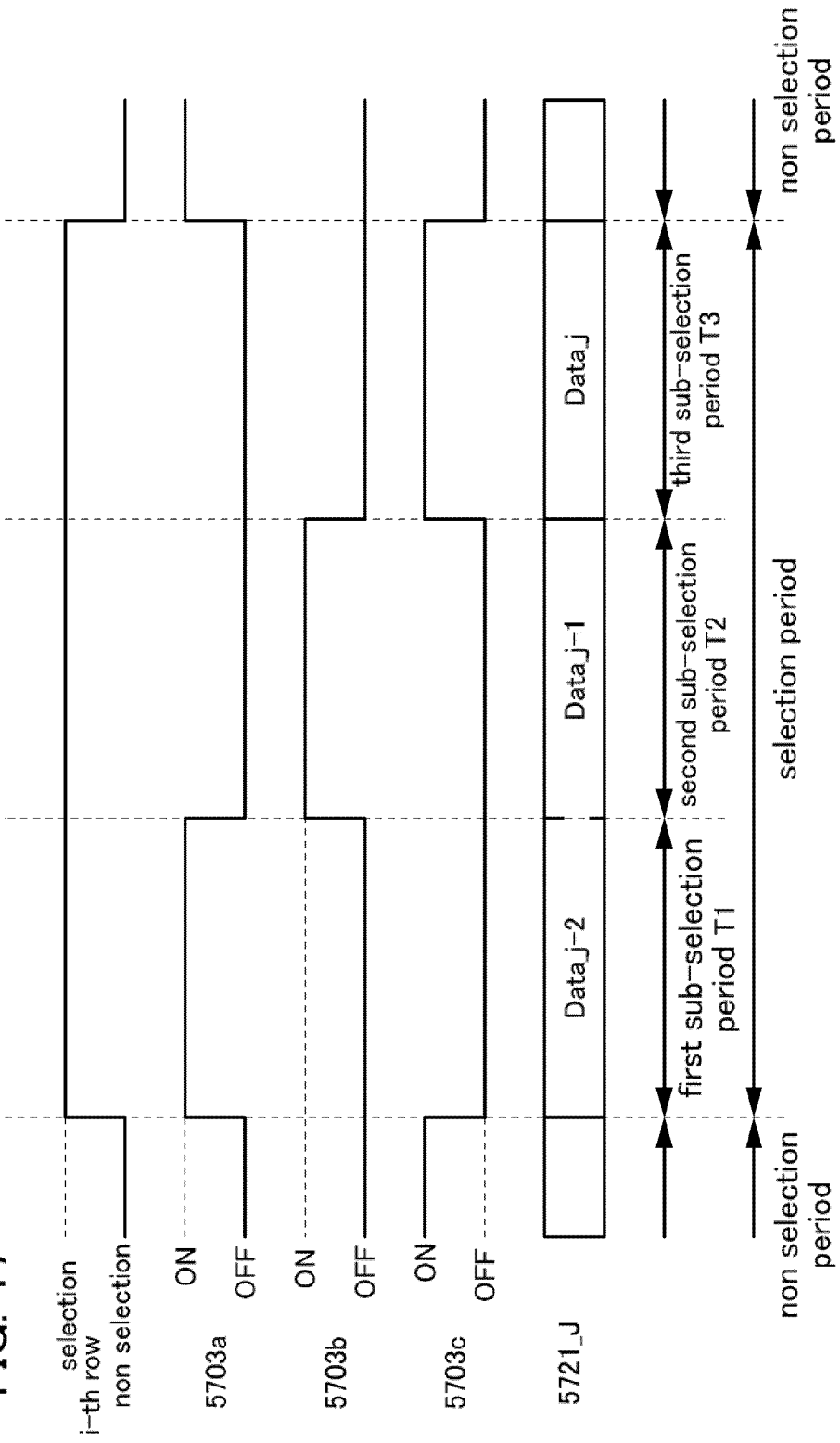
FIG. 17 is a timing chart illustrating operation of a signal line driver circuit.

Next, operation of the signal-line driver circuit illustrated in FIG. 16 is described with reference to a timing chart of FIG. 17. FIG. 17 illustrates the timing chart where the scan line Gi in the i-th row is selected. Further, a selection period of the scan line Gi in the i-th row is divided into a first sub-selection period T1, a second sub-selection period T2, and a third sub-selection period T3. Furthermore, the signal-line driver circuit in FIG. 16 operates similarly to that in FIG. 17 even when a scan line of another row is selected.

Note that the timing chart of FIG. 17 illustrates the case where the wiring 5621_J in the J-th column is connected to the signal line Sj−2, the signal line Sj−1, and the signal line Sj through the first thin film transistor 5603a, the second thin film transistor 5603b, and the third thin film transistor 5603c.

The timing chart of FIG. 17 illustrates timing when the scan line Gi in the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. The video signals input to the wiring 5621_J in the first sub-selection period T1, the second sub-selection period T2, and the third sub-selection period T3 are denoted by Data_j−2, Data_j−1, and Data_j.

As illustrated in FIG. 17, in the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 through the first thin film transistor 5603a. In the second sub-selection period T2, the second thin film transistor 5603b is turned on, and the first thin film transistor 5603a and the third thin film transistor 5603c are turned off. At this time, Data_j−1 input to the wiring 5621_J is input to the signal line Sj−1 through the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj through the third thin film transistor 5603c.

As described above, in the signal-line driver circuit of FIG. 16, one gate selection period is divided into three; thus, video signals can be input to three signal lines through one wiring 5621 in one gate selection period. Therefore, in the signal-line driver circuit of FIG. 16, the number of connections between the substrate provided with the driver IC 5601 and the substrate provided with the pixel portion can be reduced to approximately one third of the number of signal lines. The number of connections is reduced to approximately one third of the number of signal lines, so that the reliability, yield, and the like of the signal-line driver circuit of FIG. 16 can be improved.

Note that there is no particular limitation on the arrangement, number, driving method, and the like of the thin film transistor as long as one gate selection period is divided into a plurality of sub-selection periods and video signals are input to a plurality of signal lines from one wiring in each of the plurality of sub-selection periods, as illustrated in FIG. 16.

For example, when video signals are input to three or more signal lines from one wiring in each of three or more sub-selection periods, a thin film transistor and a wiring for controlling the thin film transistor may be added. Note that when one gate selection period is divided into four or more sub-selection periods, one sub-selection period becomes shorter. Therefore, one gate selection period is preferably divided into two or three sub-selection periods.

Figure 18:
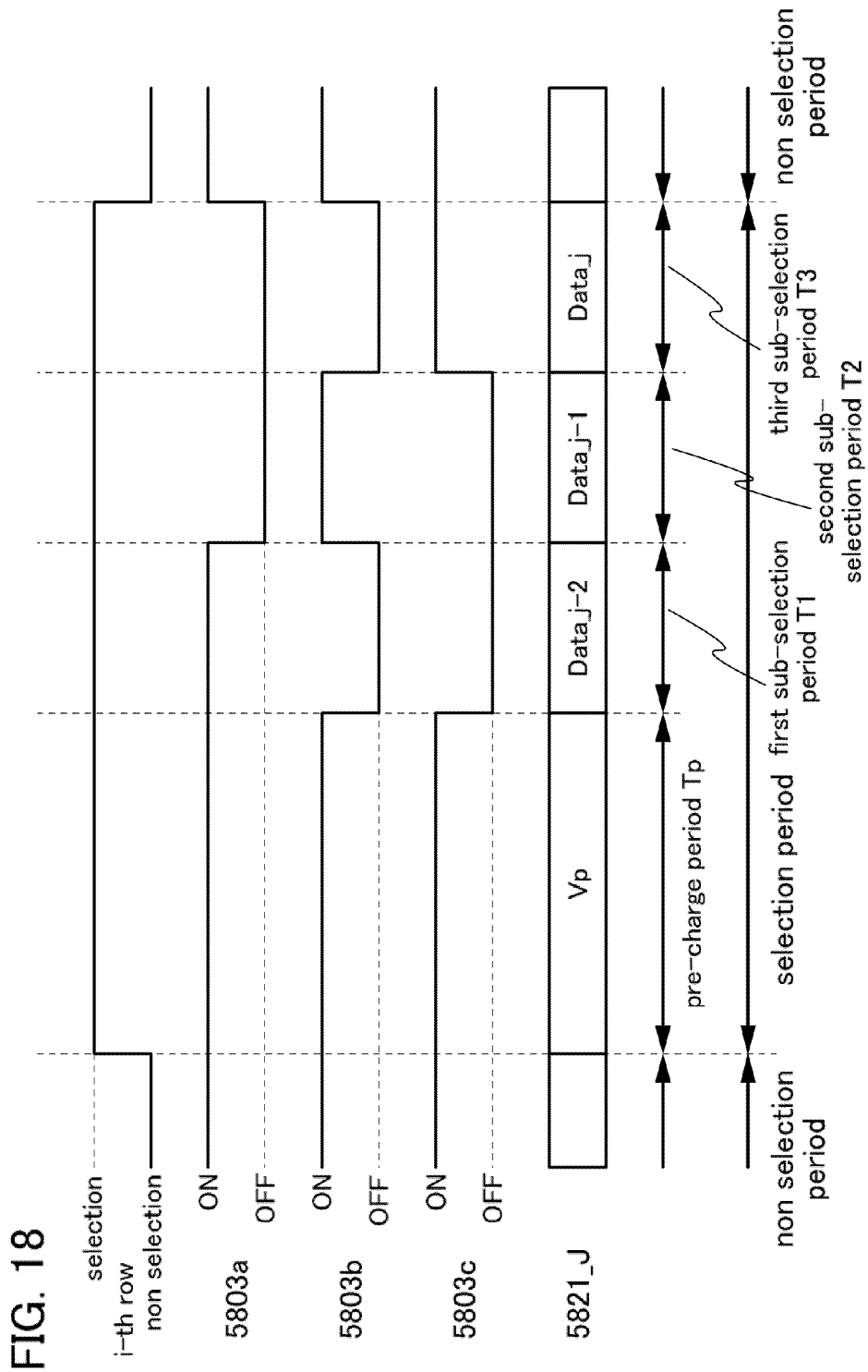
FIG. 18 is a timing chart illustrating operation of a signal line driver circuit.

As another example, as illustrated in a timing chart of FIG. 18, one selection period may be divided into a pre-charge period Tp, the first sub-selection period T1, the second sub-selection period T2, and the third sub-selection period T3. Further, the timing chart of FIG. 18 illustrates timing when the scan line Gi in the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J in the J-th column. As illustrated in FIG. 18, the first thin film transistor 5603a, the second thin film transistor 5603b, and the third thin film transistor 5603c are turned on in the pre-charge period Tp. At this time, a pre-charge voltage $V_p$ input to the wiring 5621_J is input to each of the signal line Sj−2, the signal line Sj−1, and the signal line Sj through the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 through the first thin film transistor 5603a. In the second sub-selection period T2, the second thin film transistor 5603b is turned on, and the first thin film transistor 5603a and the third thin film transistor 5603c are turned off. At this time, Data_j−1 input to the wiring 5621_J is input to the signal line Sj−1 through the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj through the third thin film transistor 5603c.

As described above, in the signal-line driver circuit of FIG. 16, to which the timing chart of FIG. 18 is applied, a signal line can be pre-charged by providing a pre-charge selection period before sub-selection periods. Thus, a video signal can be written to a pixel at a high speed. Note that portions in FIG. 18 similar to those in FIG. 17 are denoted by the same reference numerals, and detailed description of the same portions and portions having similar functions is omitted.

In addition, a configuration of the scan-line driver circuit is described. The scan-line driver circuit includes a shift register and a buffer. Moreover, a level shifter may be included in some cases. In the scan-line driver circuit, when a clock signal (CLK) and a start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on all at once, a buffer which can feed a large amount of current is used.

One mode of the shift register used for part of the scan-line driver circuit is described with reference to FIG. 19 and FIG. 20.

Figure 19:
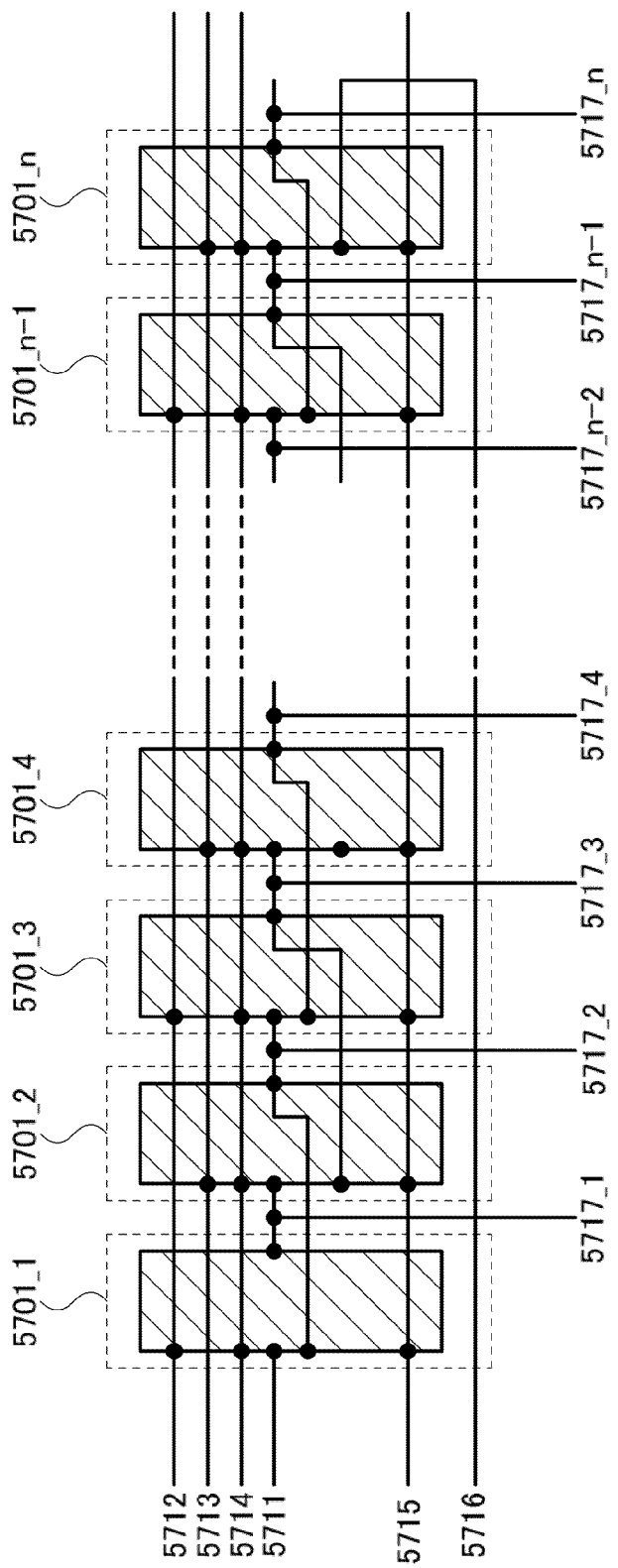
FIG. 19 illustrates a structure of a shift register.

FIG. 19 illustrates a circuit configuration of the shift register. The shift register illustrated in FIG. 19 includes a plurality of flip-flops, flip-flops 5701_1 to 5701_n. Further, the shift register operates with input of a first clock signal, a second clock signal, a start pulse signal, and a reset signal.

The connection relation of the shift register illustrated in FIG. 19 is described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, a flip-flop 5701_i (any one of the flip-flops 5701_1 to 5701_n) of an i-th stage is connected to one of the second wiring 5712 and the third wiring 5713, the fourth wiring 5714, the fifth wiring 5715, a seventh wiring 5717_i−1, a seventh wiring 5717_i, and a seventh wiring 5717=i+1. Here, when the "i" is an odd number, the flip-flop 5701_i of the i-th stage is connected to the second wiring 5712; when the "i" is an even number, the flip-flop 5701_i of the i-th stage is connected to the third wiring 5713.

The flip-flop 5701_n of an n-th stage is connected to one of the second wiring 5712 and the third wiring 5713, the fourth wiring 5714, the fifth wiring 5715, a seventh wiring 5717_n−1, a seventh wiring 5717_n, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. Further, the fourth wiring 5714 and the fifth wiring 5715 may be referred to as a first power supply line and a second power supply line, respectively.

Figure 20:
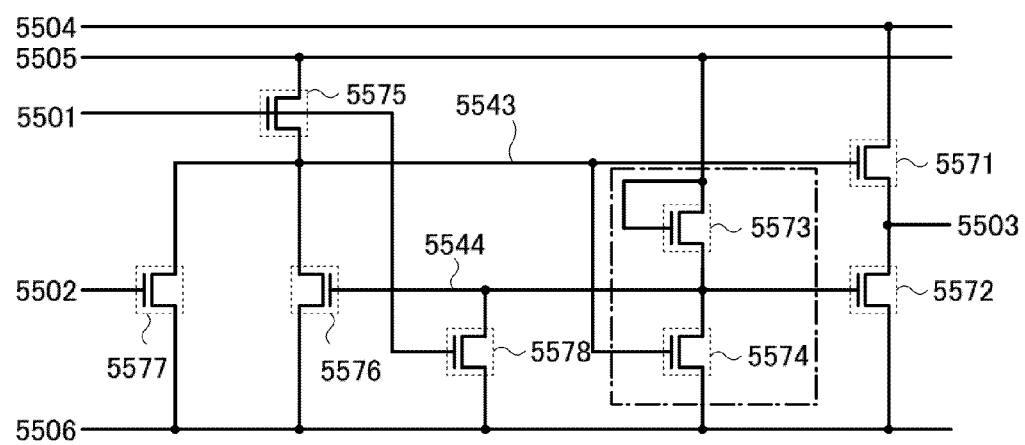
FIG. 20 illustrates a connection structure of a flip flop according to one embodiment of the present invention.

Next, FIG. 20 illustrates details of the flip-flop in FIG. 19. A flip-flop illustrated in FIG. 20 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In addition, the flip-flop illustrated in FIG. 20 includes a first wiring 5501, a second wiring 5502, a third wiring 5503, a fourth wiring 5504, a fifth wiring 5505, and a sixth wiring 5506.

Although the example in which all the thin film transistors are enhancement-type n-channel transistors is described here, there is no limitation to this example. For example, the driver circuit can be driven even with the use of a depletion-type n-channel transistor.

Next, connection structures of the flip-flop illustrated in FIG. 20 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506, and a second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502.

A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_i of the i-th stage, the first wiring 5501 in FIG. 20 is connected to the seventh wiring 5717_i−1 in FIG. 19. The second wiring 5502 in FIG. 20 is connected to the seventh wiring 5717_i+1 in FIG. 19. The third wiring 5503 in FIG. 20 is connected to the seventh wiring 5717_i. The sixth wiring 5506 in FIG. 20 is connected to the fifth wiring 5715.

If the "i" is an odd number, the fourth wiring 5504 in FIG. 20 is connected to the second wiring 5712 in FIG. 19; if the "i" is an even number, the fourth wiring 5504 in FIG. 20 is connected to the third wiring 5713 in FIG. 19. In addition, the fifth wiring 5505 in FIG. 20 is connected to the fourth wiring 5714 in FIG. 19.

Note that in the flip-flop 5701_1 of the first stage, the first wiring 5501 in FIG. 20 is connected to the first wiring 5711 in FIG. 19. In addition, in the flip-flop 5701_n of the n-th stage, the second wiring 5502 in FIG. 20 is connected to the sixth wiring 5716 in FIG. 19.

Alternatively, the signal-line driver circuit and the scan-line driver circuit can be formed using only the n-channel TFTs described as an example in other embodiments. The n-channel TFT described as an example in other embodiments has a high mobility, and thus the driving frequency of a driver circuit can be increased. Further, the parasitic capacitance of the n-channel TFT described as an example in other embodiments is reduced because of a source or drain region which is formed using an In—Ga—Zn—O-based non-single-crystal film; thus, frequency characteristics (referred to as f characteristics) of the n-channel TFT are high. For example, the scan-line driver circuit which includes the n-channel TFT described as an example in other embodiments can operate at a high speed; therefore, it is possible to increase the frame frequency or to achieve insertion of a black screen, for example.

In addition, when the channel width of the transistor in the scan-line driver circuit is increased or a plurality of scan-line driver circuits are provided, for example, much higher frame frequency can be realized. When a plurality of scan-line driver circuits are provided, a scan-line driver circuit for driving scan lines of even-numbered rows is provided on one side and a scan-line driver circuit to drive scan lines of odd-numbered rows is provided on the opposite side, whereby increase in frame frequency can be realized. Furthermore, the use of the plurality of scan-line driver circuits to output signals to the same scan line is advantageous in increasing the size of a display device.

Figure 15B:
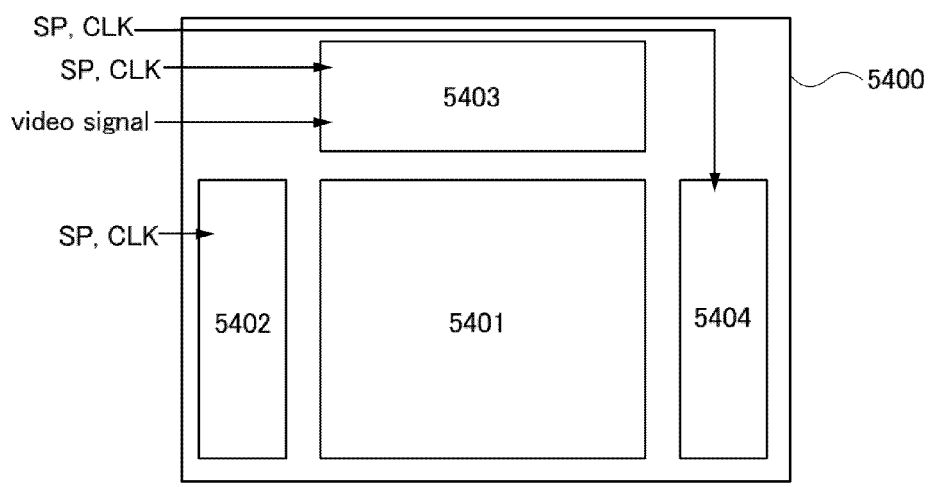

Further, in the case of manufacturing an active matrix light-emitting display device as an example of a semiconductor device to which one embodiment of the present invention is applied, a plurality of scan-line driver circuits are preferably arranged because a plurality of thin film transistors are arranged in at least one pixel. FIG. 15B illustrates an example of a block diagram of an active matrix light-emitting display device.

The light-emitting display device illustrated in FIG. 15B includes, over a substrate 5400, a pixel portion 5401 including a plurality of pixels each provided with a display element, a first scan-line driver circuit 5402 and a second scan-line driver circuit 5404 that selects a pixel, and a signal-line driver circuit 5403 that controls a video signal input to the selected pixel.

In the case where the video signal input to a pixel of the light-emitting display device illustrated in FIG. 15B is a digital signal, the pixel is put in a light-emitting state or a non-light-emitting state by switching on/off of a transistor. Thus, grayscale can be displayed using an area-ratio grayscale method or a time grayscale method. An area-ratio grayscale method refers to a driving method in which one pixel is divided into a plurality of sub-pixels and the respective sub-pixels are driven separately based on video signals so that grayscale is displayed. Further, a time grayscale method refers to a driving method in which a period during which a pixel is in a light-emitting state is controlled so that grayscale is displayed.

Since the response time of light-emitting elements is higher than that of liquid crystal elements or the like, the light-emitting elements are suitable for a time grayscale method than the liquid crystal element. Specifically, in the case of displaying with a time grayscale method, one frame period is divided into a plurality of sub-frame periods. Then, in accordance with video signals, the light-emitting element in the pixel is put in a light-emitting state or a non-light-emitting state in each sub-frame period. One frame period is divided into a plurality of sub-frame periods, whereby the total length of time, in which pixels actually emit light in one frame period, can be controlled with video signals to display grayscale.

Note that in the example of the light-emitting display device illustrated in FIG. 15B, when two switching TFTs are arranged in one pixel, the first scan-line driver circuit 5402 generates a signal which is input to a first scan line serving as a gate wiring of one of the two switching TFTs, and the second scan-line driver circuit 5404 generates a signal which is input to a second scan line serving as a gate wiring of the other of the two switching TFTs. However, one scan-line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan-line driver circuit may generate all signals that are input to the plurality of scan lines, or a plurality of scan-line driver circuits may generate signals that are input to the plurality of scan lines.

Also in the light-emitting display device, part of the driver circuit that can include the n-channel TFTs among driver circuits can be formed over the same substrate as the thin film transistors of the pixel portion. Alternatively, the signal-line driver circuit and the scan-line driver circuit can be formed using only the n-channel TFTs described as an example in other embodiments.

Moreover, the above-described driver circuits may be used for electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has less power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By application of an electric field to the microcapsules, the particles in the microcapsules are moved in opposite directions to each other and only the color of the particles gathering on one side is displayed. Note that the first particles or the second particles contain a colorant, and does not move without an electric field. Moreover, a color of the first particles is different from a color of the second particles (the particles may also be colorless).

Thus, an electrophoretic display is a display that utilizes a so-called dielectrophoretic effect in which a substance having a high dielectric constant moves to a high-electric field region. The electrophoretic display does not require a polarizing plate and a counter substrate, which are necessary for a liquid crystal display device, so that the thickness and weight thereof are about half.

Dispersing elements in which the above microcapsules are dispersed in a solvent are referred to as electronic ink. This electronic ink can be printed on a surface of glass, plastic, cloth, paper, or the like. Furthermore, with the use of a color filter or particles having a coloring matter, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistors which can be formed by the method described as an example in other embodiments can be used.

Note that the first particles and the second particles in the microcapsule may be formed from one of a conductive material, an insulating material, a semiconductor material, a magnetic material, a liquid crystal material, a ferroelectric material, an electroluminescent material, an electrochromic material, and a magnetophoretic material, or a composite material thereof.

The thin film transistor of one embodiment of the present invention is mounted on the display device described as an example in this embodiment; therefore, the display device consumes less power and can operate at a high speed.

Note that the structure described in this embodiment can be combined as appropriate with any of the structures described as an example in other embodiments.

Embodiment 6

The thin film transistor described as an example in any of the other embodiments, which is one embodiment of the present invention, is manufactured, and a semiconductor device having a display function (also referred to as a display device) can be manufactured using the thin film transistor in a pixel portion and further in a driver circuit. Moreover, part or whole of a driver circuit can be formed over the same substrate as a pixel portion, using the thin film transistor described as an example in any of the other embodiments, which is one embodiment of the present invention, so that a system-on-panel can be formed.

The display device includes a display element. A liquid crystal element (also referred to as a liquid crystal display element) or a light-emitting element (also referred to as a light-emitting display element) can be used as the display element. A light-emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used.

In addition, the display device includes a panel in which a display element is sealed, and a module in which an IC and the like including a controller are mounted on the panel. An embodiment of the present invention relates to one embodiment of an element substrate before the display element is completed in a manufacturing process of the display device, and the element substrate is provided with means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

A display device in this specification refers to an image display device, a display device, or a light source (including a lighting device). Further, the display device includes any of the following modules in its category: a module including a connector such as an flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip-on-glass (COG) method.

The appearance and cross section of a liquid crystal display panel which is one mode of a semiconductor device as one embodiment of the present invention will be described in this embodiment with reference to FIGS. 21A1 to 21B. FIGS. 21A1 and 21A2 are top views of a panel in each of which highly reliable thin film transistors 4010 and 4011 that include oxide semiconductor layers of the In—Ga—Zn—O-based non-single-crystal films described as an example in other embodiments and a liquid crystal element 4013, which are formed over a first substrate 4001, are sealed with a sealant 4005 between the first substrate 4001 and a second substrate 4006. FIG. 21B corresponds to a cross-sectional view of FIGS. 21A1 and 21A2 taken along line M-N.

The sealant 4005 is provided so as to surround a pixel portion 4002 and a scan-line driver circuit 4004 which are provided over the first substrate 4001. The second substrate 4006 is provided over the pixel portion 4002 and the scan-line driver circuit 4004. Thus, the pixel portion 4002 and the scan-line driver circuit 4004 as well as a liquid crystal layer 4008 are sealed with the sealant 4005 between the first substrate 4001 and the second substrate 4006. A signal-line driver circuit 4003 which is formed using a single crystal semiconductor film or a polycrystalline semiconductor film over a substrate which is prepared separately is mounted in a region that is different from the region surrounded by the sealant 4005 over the first substrate 4001.

Note that there is no particular limitation on a connection method of the driver circuit which is separately formed, and a COG method, a wire bonding method, a TAB method, or the like can be used. FIG. 21A1 illustrates an example in which the signal-line driver circuit 4003 is mounted by a COG method, and FIG. 21A2 illustrates an example in which the signal-line driver circuit 4003 is mounted by a TAB method.

Each of the pixel portion 4002 and the scan-line driver circuit 4004 which are provided over the first substrate 4001 includes a plurality of thin film transistors. FIG. 21B illustrates the thin film transistor 4010 included in the pixel portion 4002 and the thin film transistor 4011 included in the scan-line driver circuit 4004. Insulating layers 4020 and 4021 are provided over the thin film transistors 4010 and 4011.

As each of the thin film transistors 4010 and 4011, the highly reliable thin film transistor described as an example in other embodiments including an In—Ga—Zn—O-based non-single-crystal film as the oxide semiconductor layer can be used. In this embodiment, the thin film transistors 4010 and 4011 are each an n-channel thin film transistor.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with each other corresponds to the liquid crystal element 4013. Note that the pixel electrode layer 4030 and the counter electrode layer 4031 are provided with an insulating layer 4032 and an insulating layer 4033 which function as orientation films, respectively, and the liquid crystal layer 4008 is interposed between the insulating layers 4032 and 4033.

Note that the first substrate 4001 and the second substrate 4006 can be formed from glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer which is obtained by selectively etching of an insulating film and is provided to control a distance (a cell gap) between the pixel electrode layer 4030 and the counter electrode layer 4031. Alternatively, a spherical spacer may be used. In addition, the counter electrode layer 4031 is electrically connected to a common potential line provided over the same substrate as the thin film transistor 4010. The counter electrode layer 4031 and the common potential line are electrically connected to each other through conductive particles which are arranged between the pair of substrates using a common connection portion. Note that the conductive particles are contained in the sealant 4005.

Alternatively, a blue phase liquid crystal without an orientation film may be used. A blue phase is a type of liquid crystal phase which appears just before a cholesteric liquid crystal changes into an isotropic phase when the temperature of the cholesteric liquid crystal is increased. A blue phase appears only within narrow temperature range; therefore, the liquid crystal layer 4008 is formed using a liquid crystal composition in which a chiral agent of greater than or equal to 5 weight % is mixed in order to expand the temperature range. The liquid crystal composition including a blue phase liquid crystal and a chiral agent has a short response time of 10 µs to 100 µs and is optically isotropic; therefore, orientation treatment is not necessary and viewing angle dependence is small.

Note that this embodiment describes an example of a transmissive liquid crystal display device; however, one embodiment of the present invention can be applied to a reflective liquid crystal display device or a semi-transmissive liquid crystal display device.

Although a liquid crystal display device of this embodiment has a polarizing plate provided outer than the substrate (the viewer side) and a coloring layer and an electrode layer used for a display element provided inner than the substrate, which are arranged in that order, the polarizing plate may be inner than the substrate. The stacked structure of the polarizing plate and the coloring layer is not limited to that shown in this embodiment and may be set as appropriate in accordance with the materials of the polarizing plate and the coloring layer and the condition of the manufacturing process. Further, a light-blocking film which functions as a black matrix may be provided.

In this embodiment, in order to reduce the unevenness of the surface of the thin film transistors and to improve the reliability of the thin film transistors, the thin film transistors which are described as an example in other embodiments are covered with protective films or insulating layers (the insulating layers 4020 and 4021) which function as planarizing insulating films. Note that the protective film is provided to prevent entry of a contaminant impurity such as an organic substance, a metal substance, or moisture floating in the atmosphere, and therefore a dense film is preferable. The protective film may be formed using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film. Although the protective film is formed by a sputtering method in this embodiment, the method is not particularly limited and may be selected from a variety of methods.

Here, the insulating layer 4020 is formed to have a stacked structure as the protective film. Here, a silicon oxide film is formed by a sputtering method as a first layer of the insulating layer 4020. The use of a silicon oxide film for the protective film provides an advantageous effect of preventing hillock of an aluminum film used for the source and drain electrode layers.

Moreover, an insulating layer is formed as a second layer of the protective film. Here, a silicon nitride film is formed by a sputtering method as a second layer of the insulating layer 4020. When a silicon nitride film is used as the protective film, it is possible to prevent movable ions such as sodium from entering a semiconductor region to vary the electric characteristics of the TFT.

Further, after the protective film is formed, the oxide semiconductor layer may be annealed (at 300° C. to 400° C.).

The insulating layer 4021 is formed as the planarizing insulating film. The insulating layer 4021 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane-based material as a starting material and having the bond of Si—O—Si. The siloxane-based resin may include as a substituent at least one of fluorine, an alkyl group, and aromatic hydrocarbon, as well as hydrogen.

The method for the formation of the insulating layer 4021 is not particularly limited and any of the following methods can be used depending on the material of the insulating layer 4021: a sputtering method; an SOG method; spin coating; dip coating; spray coating; a droplet discharge method (e.g., an inkjet method, screen printing, or offset printing); a doctor knife; a roll coater; a curtain coater; a knife coater; or the like. In the case of forming the insulating layer 4021 with the use of a material solution, annealing (300° C. to 400° C.) may be performed on the oxide semiconductor layer at the same time as a baking step. When the baking of the insulating layer 4021 and the annealing of the oxide semiconductor layer are performed at the same time, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition including a conductive macromolecule (also referred to as a conductive polymer) can be used for the pixel electrode layer 4030 and the counter electrode layer 4031. The pixel electrode formed using the conductive composition has preferably a sheet resistance of less than or equal to 10000 ohm/square and a transmittance of greater than or equal to 70% at a wavelength of 550 nm. Further, the resistivity of the conductive macromolecule included in the conductive composition is preferably less than or equal to 0.1 Ω·cm.

As the conductive macromolecule, a so-called π-electron conjugated conductive macromolecule can be used. As examples thereof, polyaniline or a derivative thereof, polypyrrole or a derivative thereof, polythiophene or a derivative thereof, a copolymer of two or more kinds of them, and the like can be given.

Further, a variety of signals and potentials are supplied from an FPC 4018 to the signal-line driver circuit 4003 which is formed separately, the scan-line driver circuit 4004, and the pixel portion 4002.

In this embodiment, a connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal of the FPC 4018 through an anisotropic conductive film 4019.

Although FIGS. 21A1 to 21B illustrate an example in which the signal-line driver circuit 4003 is formed separately and mounted on the first substrate 4001, this embodiment is not limited to this structure. The scan-line driver circuit may be separately formed and then mounted, or only part of the signal-line driver circuit or part of the scan-line driver circuit may be separately formed and then mounted.

Figure 22:
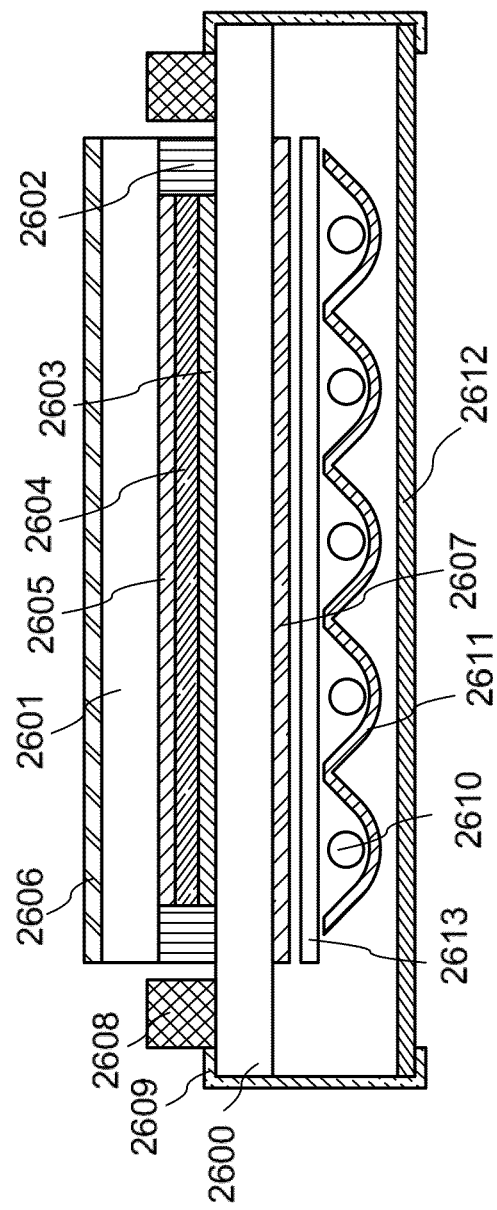
FIG. 22 illustrates a semiconductor device according to one embodiment of the present invention.

FIG. 22 illustrates an example in which a liquid crystal display module is formed as a semiconductor device with the use of a TFT substrate 2600 which is manufactured by application of the TFT described as an example in other embodiments.

FIG. 22 illustrates an example of a liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the case of the RGB system, respective colored layers corresponding to colors of red, green, and blue are provided for respective pixels. Polarizing plates 2606 and 2607 and a diffuser plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit and a power source circuit. The polarizing plate and the liquid crystal layer may be stacked with a retardation plate interposed therebetween.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti-Ferroelectric Liquid Crystal) mode, or the like can be used.

The thin film transistor of one embodiment of the present invention is mounted on the liquid crystal display panel which is described as an example in this embodiment; therefore, the liquid crystal display panel consumes less power and can operate at a high speed.

Note that the structure described in this embodiment can be combined as appropriate with any of the structures described as an example in other embodiments.

Embodiment 7

In this embodiment, an example of electronic paper is shown as a semiconductor device to which the thin film transistor described as an example in other embodiments is applied.

Figure 23:
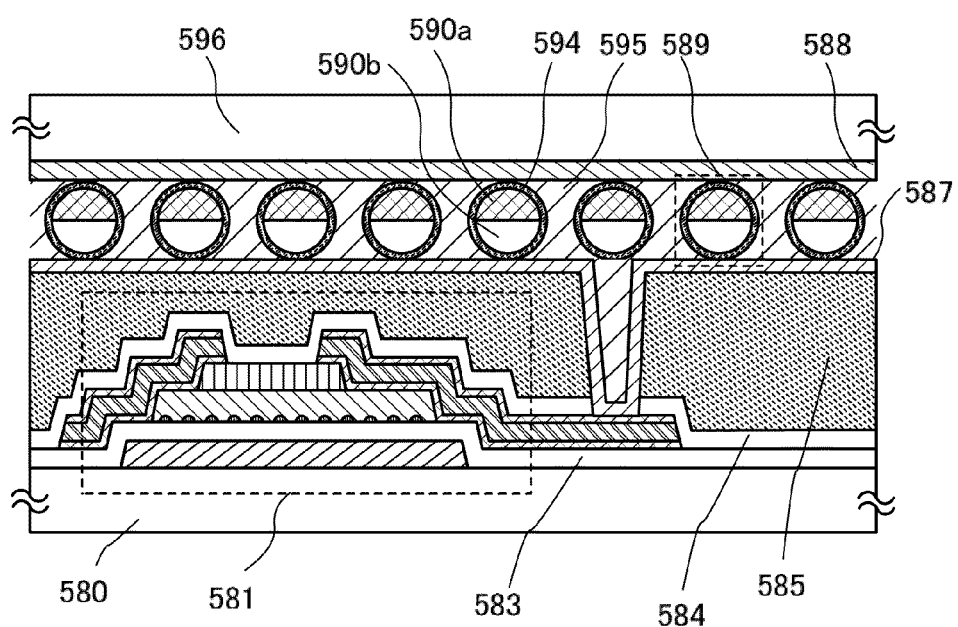
FIG. 23 illustrates a semiconductor device according to one embodiment of the present invention.

FIG. 23 illustrates active matrix electronic paper as an example of a semiconductor device. As a thin film transistor 581 used for a semiconductor device, the thin film transistor described as an example in other embodiments can be applied.

The electronic paper in FIG. 23 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor which includes a gate insulating layer 583 and an insulating layer 584, and in which a source or drain electrode layer is electrically connected to a first electrode layer 587 through an opening formed in the insulating layer 584 and an insulating layer 585. Between the first electrode layer 587 and a second electrode layer 588, spherical particles 589 each of which has a black region 590a, a white region 590b, and a cavity 594 filled with liquid which is provided around the regions. A space around the spherical particles 589 is filled with a filler 595 such as a resin (see FIG. 23). In Embodiment 7, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 and the common potential line are electrically connected through conductive particles arranged between a pair of substrates using any one of the common connection portions described as an example in other embodiments.

Further, instead of the twisting ball, an electrophoretic element can also be used. A microcapsule having a diameter of approximately 10 μm to 200 μm, which is filled with transparent liquid, positively-charged white microparticles, and negatively-charged black microparticles, is used. In the microcapsule which is provided between the first electrode layer and the second electrode layer, when an electric field is applied by the first electrode layer and the second electrode layer, the white microparticles and the black microparticles move to opposite sides to each other, so that white or black can be displayed. A display element using this principle is an electrophoretic display element, and is called electronic paper in general. The electrophoretic display element has higher reflectance than a liquid crystal display element, and thus an assistant light is unnecessary. Moreover, power consumption is low and a display portion can be recognized even in a dusky place. Furthermore, an image which is displayed once can be retained even when power is not supplied to the display portion. Accordingly, a displayed image can be stored even though a semiconductor device having a display function (which is also referred to simply as a display device or a semiconductor device provided with a display device) is distanced from an electric wave source which serves as a power supply, for example.

The thin film transistor of one embodiment of the present invention is mounted on the electronic paper described as an example in this embodiment; therefore, the electronic paper consumes less power and can operate at a high speed.

Note that the structure described in this embodiment can be combined as appropriate with any of the structures described as an example in other embodiments.

Embodiment 8

In this embodiment, an example of a light-emitting display device will be shown as the semiconductor device to which the thin film transistor described as an example in other embodiments is applied. As an example of a display element of the display device, here, a light-emitting element utilizing electroluminescence is used. Light-emitting elements utilizing electroluminescence are classified according to whether a light-emitting material is an organic compound or an inorganic compound. In general, the former is called an organic EL element and the latter is called an inorganic EL element.

In an organic EL element, by application of voltage to a light-emitting element, electrons and holes are separately injected from a pair of electrodes into a layer containing a light-emitting organic compound, and thus current flows. Then, those carriers (electrons and holes) are recombined, and thus the light-emitting organic compound is excited. When the light-emitting organic compound returns to a ground state from the excited state, light is emitted. Owing to such a mechanism, such a light-emitting element is referred to as a current-excitation light-emitting element.

Inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description here is made using an organic EL element as a light-emitting element.

Figure 24:
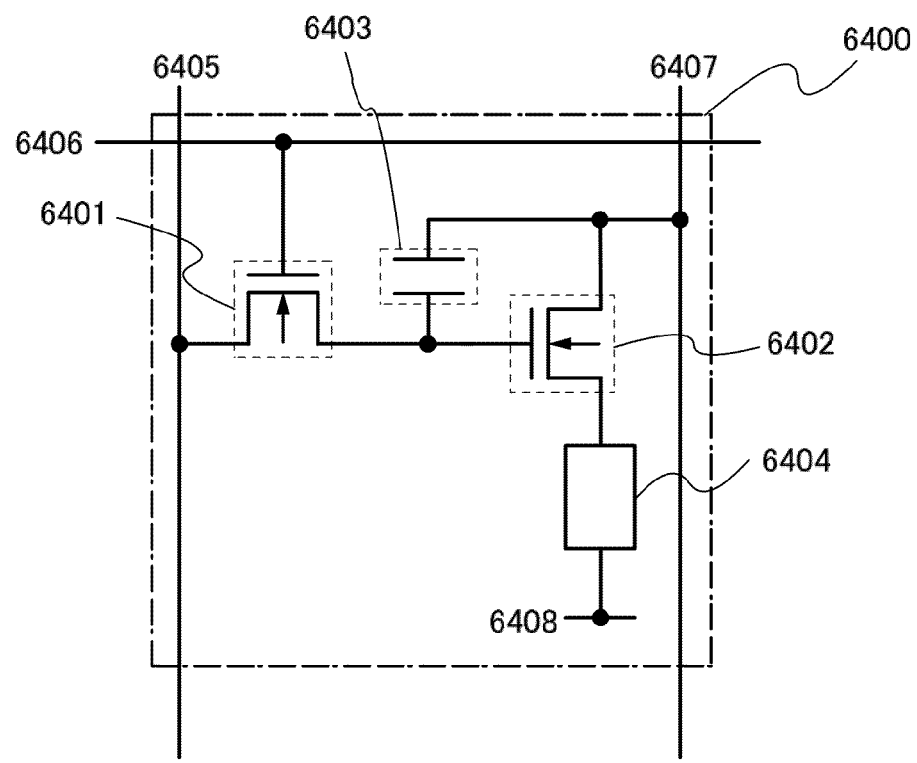
FIG. 24 illustrates a pixel equivalent circuit of a semiconductor device according to one embodiment of the present invention.

FIG. 24 illustrates an example of a pixel structure to which digital time grayscale driving can be applied, as an example of a semiconductor device to which one embodiment of the present invention is applied.

A structure and operation of a pixel to which digital time grayscale driving can be applied are described. In this example, one pixel includes two of the n-channel transistors in each of which a channel formation region is formed in an oxide semiconductor layer (In—Ga—Zn—O-based non-single-crystal film) described as an example in other embodiments.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (a pixel electrode) of the light-emitting element 6404. A second electrode of the light-emitting element 6404 corresponds to a common electrode 6408. The common electrode 6408 is electrically connected to a common potential line formed over the same substrate, and the structure illustrated in FIG. 1A, FIG. 2A, or FIG. 3A may be employed using the connection portion as a common connection portion.

The second electrode (common electrode 6408) of the light-emitting element 6404 is set to a low power supply potential. The low power supply potential is a potential satisfying the low power supply potential<a high power supply potential when the high power supply potential set to the power supply line 6407 is a reference. As the low power supply potential, for example, GND, 0 V, or the like may be employed. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is greater than or equal to forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel formation region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 is made to operate in a linear region. In order to make the driver transistor 6402 operate in a linear region, a voltage higher than the voltage of the power supply line 6407 is applied to the gate of the driver transistor 6402. Note that a voltage higher than or equal to a total voltage of a voltage of the power supply line and $V_{th}$ of the driver transistor 6402 is applied to the signal line 6405.

In the case of performing analog grayscale driving instead of digital time grayscale driving, the same pixel structure as in FIG. 24 can be used by changing signal input.

In the case of performing analog grayscale driving, a voltage higher than or equal to forward voltage of the light-emitting element 6404+$V_{th}$ of the driver transistor 6402 is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order make the driver transistor 6402 operate in a saturation region, the potential of the power supply line 6407 is set higher than the gate potential of the driver transistor 6402. When an analog video signal is used, it is possible to supply current to the light-emitting element 6404 in accordance with the video signal and perform analog grayscale driving.

Note that the pixel structure illustrated in FIG. 24 is not limited thereto. For example, a switch, a resistor, a capacitor, a transistor, a logic circuit, or the like may be added to the pixel illustrated in FIG. 24.

Figure 25A:
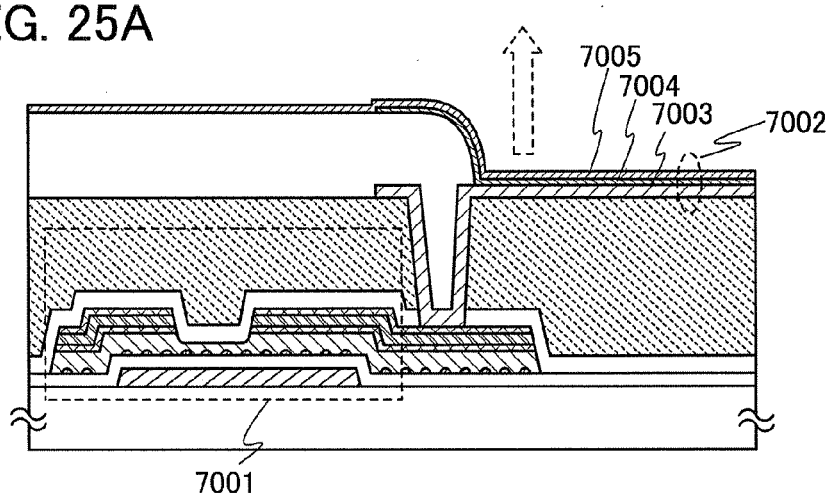
FIGS. 25A to 25C each illustrate a semiconductor device according to one embodiment of the present invention.
Figure 25B:
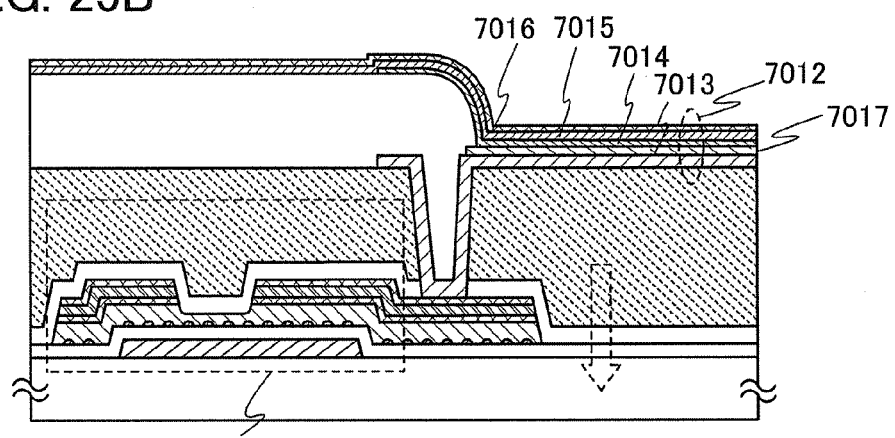
Figure 25C:
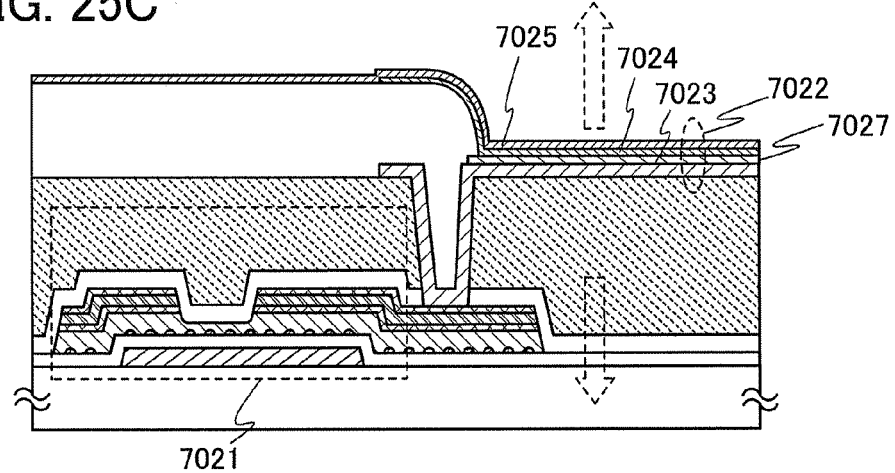

Next, structures of a light-emitting element are described with reference to FIGS. 25A to 25C. A cross-sectional structure of a pixel is described here with an n-channel driver TFT taken as an example. TFTs 7001, 7011, and 7021 serving as driver TFTs used for a semiconductor device, which are illustrated in FIGS. 25A, 25B, and 25C, can be manufactured in a manner similar to that of the thin film transistor described as an example in other embodiments. The TFTs 7001, 7011, and 7021 are highly reliable thin film transistors each including an In—Ga—Zn—O-based non-single-crystal film as an oxide semiconductor layer.

In order to extract light emitted from the light-emitting element, at least one of an anode and a cathode may be transparent. A thin film transistor and a light-emitting element are formed over a substrate. A light-emitting element can have a top-emission structure in which light emission is extracted through the surface opposite to the substrate; a bottom-emission structure in which light emission is extracted through the surface on the substrate side; or a dual-emission structure in which light emission is extracted through the surface opposite to the substrate and the surface on the substrate side. The pixel structure of one embodiment of the present invention can be applied to a light-emitting element having any of these emission structures.

A light-emitting element having a top-emission structure is described with reference to FIG. 25A.

FIG. 25A is a cross-sectional view of a pixel in the case where the TFT 7001 serving as a driver TFT is an n-channel TFT and light generated in a light-emitting element 7002 is emitted to pass through an anode 7005. In FIG. 25A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of a variety of conductive materials as long as it has a low work function and reflects light. For example, Ca, Al, MgAg, AlLi, or the like is preferably used. The light-emitting layer 7004 may be formed using a single layer or by stacking a plurality of layers. When the light-emitting layer 7004 is formed by stacking a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive material, for example, a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added may be used.

The light-emitting element 7002 corresponds to a region where the cathode 7003 and the anode 7005 sandwich the light-emitting layer 7004. In the case of the pixel illustrated in FIG. 25A, light is emitted from the light-emitting element 7002 to the anode 7005 side as indicated by an arrow.

Next, a light-emitting element having a bottom-emission structure is described with reference to FIG. 25B. FIG. 25B is a cross-sectional view of a pixel in the case where the driver TFT 7011 is an n-channel TFT, and light generated in a light-emitting element 7012 is emitted to a cathode 7013 side. In FIG. 25B, the cathode 7013 of the light-emitting element 7012 is formed over a light-transmitting conductive film 7017 which is electrically connected to the driver TFT 7011, and a light-emitting layer 7014 and an anode 7015 are stacked in this order over the cathode 7013. When the anode 7015 has a light-transmitting property, a light-blocking film 7016 for reflecting or blocking light may be formed so as to cover the anode 7015. As in the case of FIG. 25A, the cathode 7013 can be formed using any of a variety of conductive materials as long as it has a low work function. Note that the cathode 7013 is formed to have a thickness that can transmit light (preferably approximately 5 nm to 30 nm). For example, an aluminum film with a thickness of 20 nm can be used as the cathode 7013. As in the case of FIG. 25A, the light-emitting layer 7014 may be formed using a single layer or by stacking a plurality of layers. As in the case of FIG. 25A, the anode 7015 is not required to transmit light, but can be formed using a light-transmitting conductive material. For the light-blocking film 7016, for example, metal or the like that reflects light can be used; however, the light-blocking film 7016 is not limited to a metal film. For example, a resin or the like to which black pigment is added can be used.

The light-emitting element 7012 corresponds to a region where the cathode 7013 and the anode 7015 sandwich the light-emitting layer 7014. In the case of the pixel illustrated in FIG. 25B, light is emitted from the light-emitting element 7012 to the cathode 7013 side as indicated by an arrow.

Next, a light-emitting element having a dual-emission structure is described with reference to FIG. 25C. In FIG. 25C, a cathode 7023 of a light-emitting element 7022 is formed over a light-transmitting conductive film 7027 which is electrically connected to a driver TFT 7021, and a light-emitting layer 7024 and an anode 7025 are stacked in this order over the cathode 7023. As in the case of FIG. 25A, the cathode 7023 can be formed using any of a variety of conductive materials as long as it has a low work function. Note that the cathode 7023 is formed to have a thickness that can transmit light. For example, an aluminum film with a thickness of 20 nm can be used as the cathode 7023. As in the case of FIG. 25A, the light-emitting layer 7024 may be formed using a single layer or by stacking a plurality of layers. As in the case of FIG. 25A, the anode 7025 can be formed using a light-transmitting conductive material.

The light-emitting element 7022 corresponds to a region where the cathode 7023, the light-emitting layer 7024, and the anode 7025 overlap with each other. In the pixel illustrated in FIG. 25C, light is emitted from the light-emitting element 7022 to both the anode 7025 side and the cathode 7023 side as indicated by arrows.

Although an organic EL element is described here as a light-emitting element, an inorganic EL element can be alternatively provided as a light-emitting element.

Note that in this embodiment, the example is shown in which a thin film transistor (a driver TFT) which controls the driving of a light-emitting element is electrically connected to the light-emitting element; however, a structure may be employed in which a current control TFT is connected between the driver TFT and the light-emitting element.

The semiconductor device described in this embodiment is not limited to the structures illustrated in FIGS. 25A to 25C, and can be modified in various ways based on the spirit of techniques of one embodiment of the present invention.

Figure 26A:
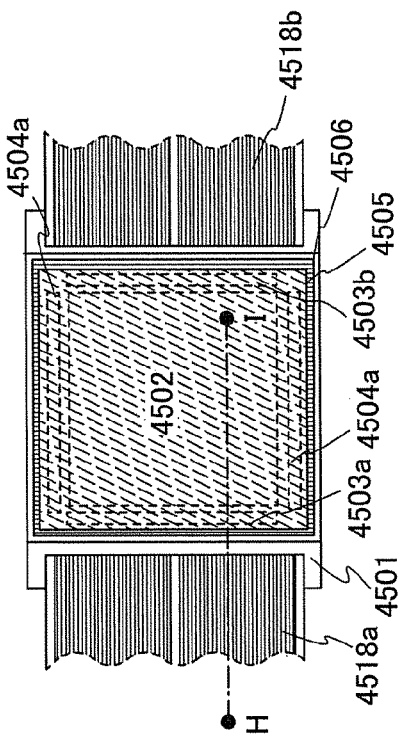
FIGS. 26A and 26B illustrate a semiconductor device according to one embodiment of the present invention.

Next, the appearance and cross section of a light-emitting display panel (also referred to as a light-emitting panel) which corresponds to one embodiment of the semiconductor device to which the thin film transistor described as an example in other embodiments is applied is described with reference to FIGS. 26A and 26B. FIG. 26A is a plan view of a panel in which a thin film transistor and a light-emitting element formed over a first substrate are sealed between the first substrate and a second substrate with a sealant, and FIG. 26B is a cross-sectional view taken along H-I of FIG. 26A.

A sealant 4505 is provided so as to surround a pixel portion 4502, signal-line driver circuits 4503a and 4503b, and scan-line driver circuits 4504a and 4504b, which are provided over a first substrate 4501. In addition, a second substrate 4506 is provided over the pixel portion 4502, the signal-line driver circuits 4503a and 4503b, and the scan-line driver circuits 4504a and 4504b. Accordingly, the pixel portion 4502, the signal-line driver circuits 4503a and 4503b, and the scan-line driver circuits 4504a and 4504b are sealed together with filler 4507 by the first substrate 4501, the sealant 4505, and the second substrate 4506. It is preferable that the light-emitting panel be packaged (sealed) with a protective film (such as a laminate film or an ultraviolet curable resin film) or a cover material with high air tightness and little degasification so that the light-emitting panel is not exposed to the air as described above.

Figure 26B:
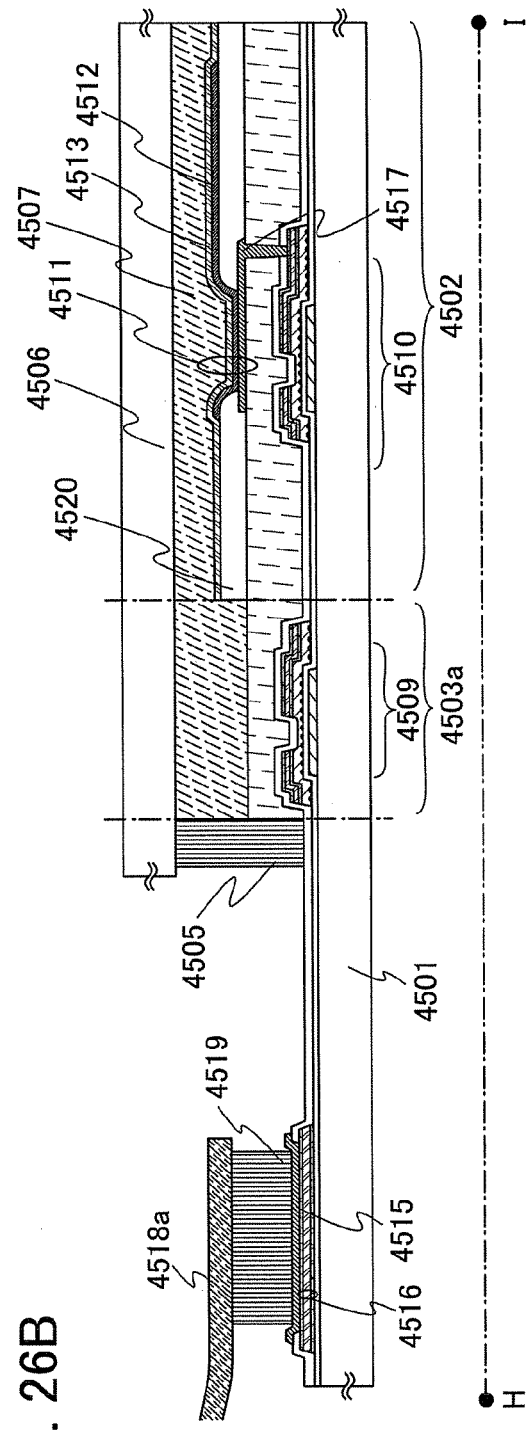

The pixel portion 4502, the signal-line driver circuits 4503a and 4503b, and the scan-line driver circuits 4504a and 4504b provided over the first substrate 4501 each include a plurality of thin film transistors, and a thin film transistor 4510 included in the pixel portion 4502 and a thin film transistor 4509 included in the signal-line driver circuit 4503a are illustrated as an example in FIG. 26B.

As the thin film transistors 4509 and 4510, highly reliable thin film transistors described as an example in other embodiments including an In—Ga—Zn—O-based non-single-crystal films as the oxide semiconductor layers can be used. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to source or drain electrode layers of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, for example.

A partition 4520 is formed using an organic resin film, an inorganic insulating film, or organic polysiloxane. It is particularly preferable that the partition 4520 be formed using a photosensitive material to have an opening on the first electrode layer 4517 so that a sidewall of the opening is formed as a tilted surface with continuous curvature.

The electroluminescent layer 4512 may be formed using a single layer or by stacking a plurality of layers.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC film, or the like can be formed.

In addition, a variety of signals and potentials are supplied from FPCs 4518a and 4518b to the signal-line driver circuits 4503a and 4503b, the scan-line driver circuits 4504a and 4504b, or the pixel portion 4502.

In this embodiment, a connection terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin as well as inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler.

In addition, if needed, an optical film such as a polarizing plate, a circularly polarizing plate (including an elliptically polarizing plate), a retarder plate (a quarter-wave plate, a half-wave plate), or a color filter may be provided on an emission surface of the light-emitting element, as appropriate. Further, the polarizing plate or the circularly polarizing plate may be provided with an anti-reflection film. For example, anti-glare treatment can be performed by which reflected light is diffused by projections and depressions on the surface so as to reduce the glare.

As the signal-line driver circuits 4503a and 4503b and the scan-line driver circuits 4504a and 4504b, driver circuits formed using a single crystal semiconductor film or polycrystalline semiconductor film over a substrate separately prepared may be mounted. In addition, only the signal-line driver circuit or only part thereof, or only the scan-line driver circuit or only part thereof may be separately formed and mounted. This embodiment is not limited to the structure illustrated in FIGS. 26A and 26B.

The thin film transistor of one embodiment of the present invention is mounted on the light-emitting display device described as an example in this embodiment; therefore, the light-emitting display device consumes less power and can operate at a high speed.

Note that the structure described in this embodiment can be combined as appropriate with any of the structures described as an example in other embodiments.

Embodiment 9

A semiconductor device to which the thin film transistor described as an example in other embodiments can be applied as electronic paper. Electronic paper can be used for electronic devices of every field for displaying information. For example, electronic paper can be used for electronic books (e-book readers), posters, advertisements in vehicles such as trains, display in a variety of cards such as credit cards, and so on. Examples of such electronic devices are illustrated in FIGS. 27A and 27B and FIG. 28.

Figure 27A:
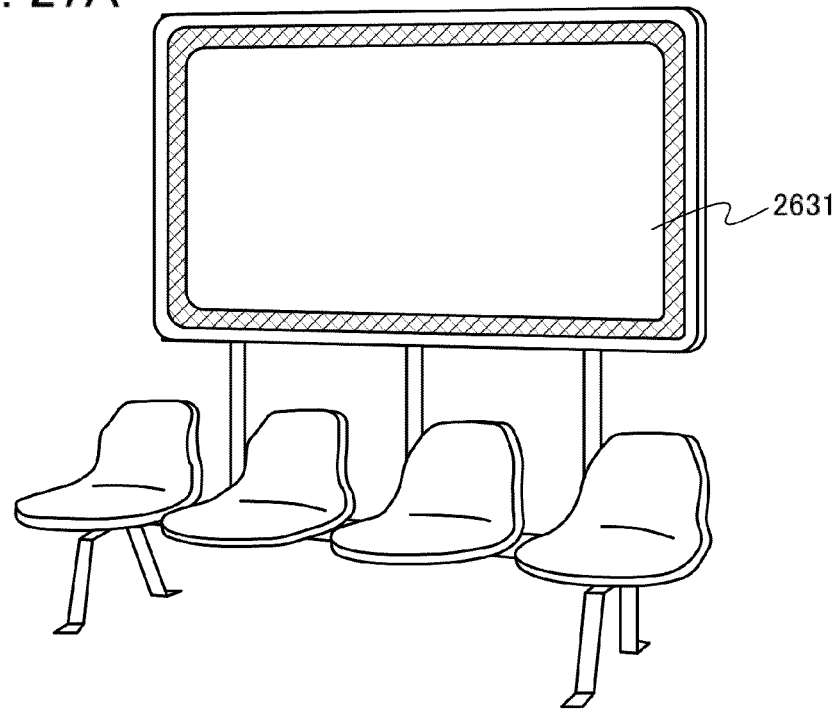
FIGS. 27A and 27B each illustrate an example of applications of electronic paper.

FIG. 27A illustrates a poster 2631 formed using electronic paper. If the advertizing medium is printed paper, the advertisement is replaced by manpower; however, when electronic paper to which one embodiment of the present invention is applied is used, the advertisement display can be changed in a short time. Moreover, a stable image can be obtained without display deterioration. Note that the poster may send and receive information wirelessly.

Figure 27B:
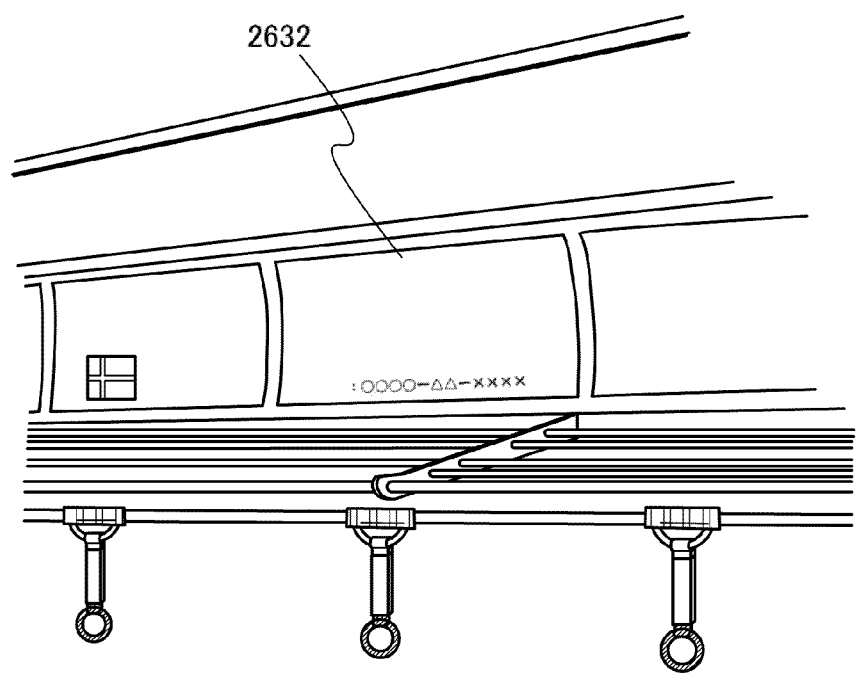

FIG. 27B illustrates an advertisement 2632 in a vehicle such as a train. If the advertizing medium is printed paper, the advertisement is replaced by manpower; however, when electronic paper to which one embodiment of the present invention is applied is used, the advertisement display can be changed in a short time without much manpower. Moreover, a stable image can be obtained without display deterioration. Note that the advertisement in a vehicle may send and receive information wirelessly.

Figure 28:
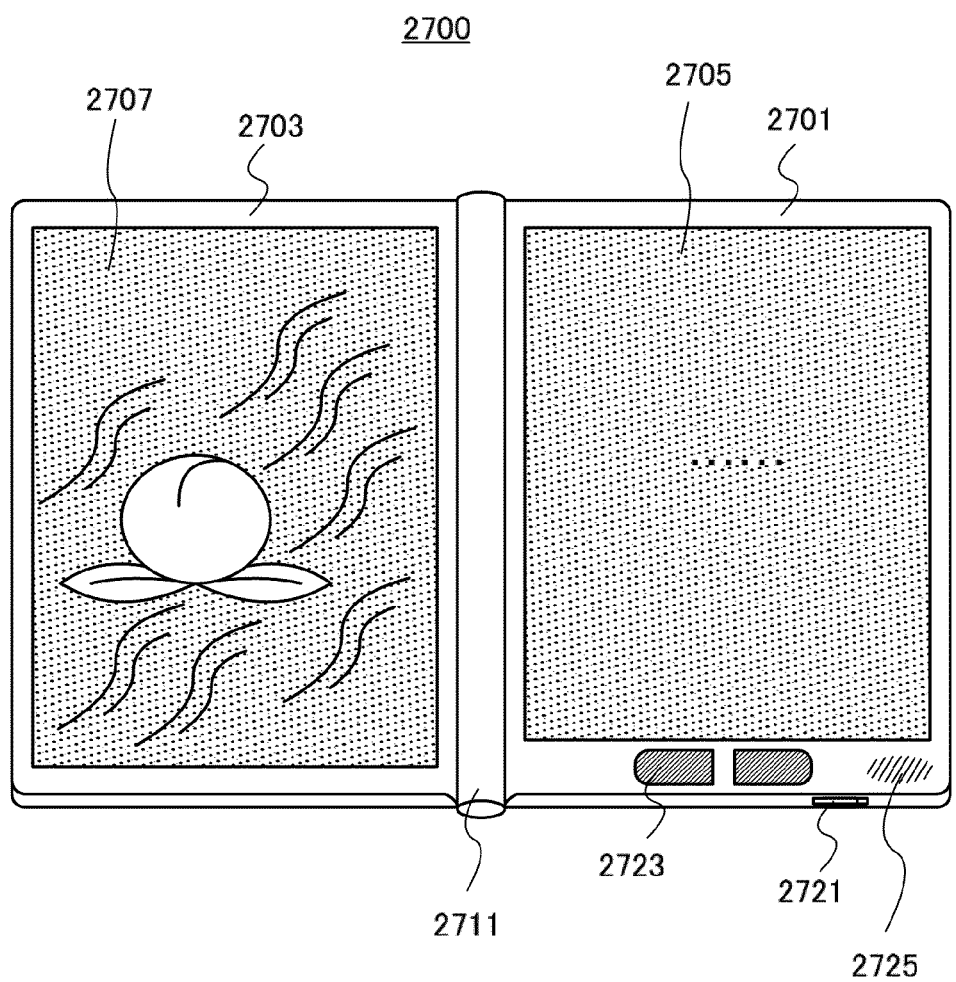
FIG. 28 shows an external view of an example of an electronic book device.

FIG. 28 illustrates an example of an electronic book 2700. For example, the electronic book 2700 includes two chassis of a chassis 2701 and a chassis 2703. The chassis 2701 and 2703 are bound with each other by an axis portion 2711, along which the electronic book 2700 can be opened and closed. With such a structure, operation as a paper book is achieved.

A display portion 2705 is incorporated in the chassis 2701, and a display portion 2707 is incorporated in the chassis 2703. The display portions 2705 and 2707 may display a series of images, or may display different images. With the structure where different images are displayed in different display portions, for example, a display portion on the right side (the display portion 2705 in FIG. 28) can display text, and a display portion on the left side (the display portion 2707 in FIG. 28) can display images.

FIG. 28 illustrates an example in which the chassis 2701 is provided with an operation portion and the like. For example, the chassis 2701 is provided with a power supply 2721, an operation key 2723, a speaker 2725, and the like. The page can be turned with the operation key 2723. Note that a keyboard, a pointing device, and the like may be provided on the same plane as the display portion of the chassis. Further, a rear surface or a side surface of the chassis may be provided with an external connection terminal (an earphone terminal, a USB terminal, a terminal which can be connected to a variety of cables such as an AC adapter or a USB cable, and the like), a storage medium inserting portion, or the like. Moreover, the electronic book 2700 may also have a function of an electronic dictionary.

Further, the electronic book 2700 may send and receive information wirelessly. Desired book data or the like can be purchased and downloaded from an electronic book server wirelessly.

The thin film transistor of one embodiment of the present invention is mounted on the display device described as an example in this embodiment; therefore, the display device consumes less power and can operate at a high speed.

Note that the structure described in this embodiment can be combined as appropriate with any of the structures described as an example in other embodiments.

Embodiment 10

The semiconductor device including the thin film transistor described as an example in other embodiments can be applied to a variety of electronic devices (including game machines). As the electronic devices, for example, there are a television device (also referred to as TV or a television receiver), a monitor for a computer or the like, a digital camera, a digital video camera, a digital photo frame, a cellular phone (also referred to as a mobile phone or a portable telephone device), a portable game machine, a portable information terminal, an audio playback device, a large game machine such as a pachinko machine, and the like.

Figure 29A:
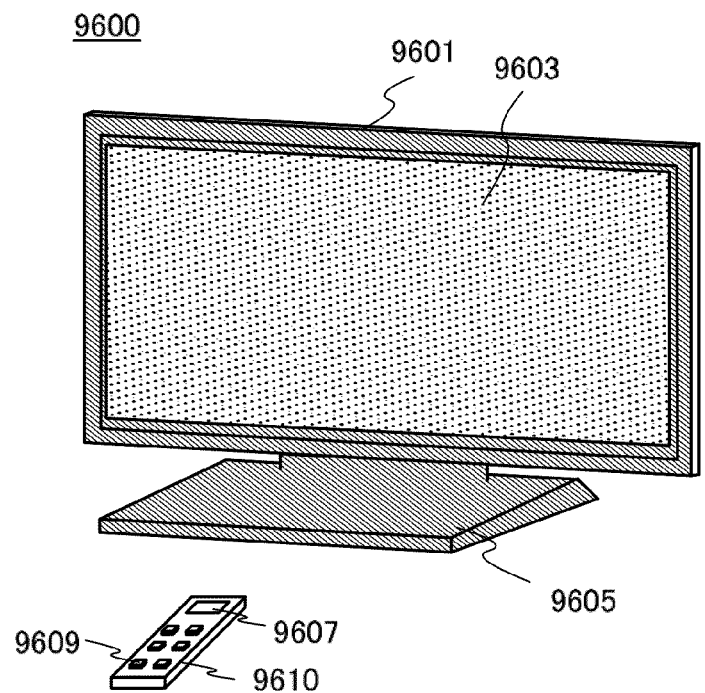
FIG. 29A shows an external view of an example of a television device and FIG. 29B shows an external view of an example of a digital photo frame.

FIG. 29A illustrates an example of a television device 9600. A display portion 9603 is incorporated in a chassis 9601 of the television device 9600. The display portion 9603 can display images. Here, the chassis 9601 is supported on a stand 9605.

The television device 9600 can operate by an operation switch of the chassis 9601 or a separate remote controller 9610. The channel and volume can be controlled with operation keys 9609 of the remote controller 9610, and the images displayed in the display portion 9603 can be controlled. Moreover, the remote controller 9610 may have a display portion 9607 in which data output from the remote controller 9610 is displayed.

Note that the television device 9600 is provided with a receiver, a modem, and the like. With the use of the receiver, general television broadcasting can be received. Moreover, when the television device 9600 is connected to a communication network with or without wires via the modem, one-way (from a sender to a receiver) or two-way (between a sender and a receiver, between receivers, or the like) information communication can be performed.

Figure 29B:
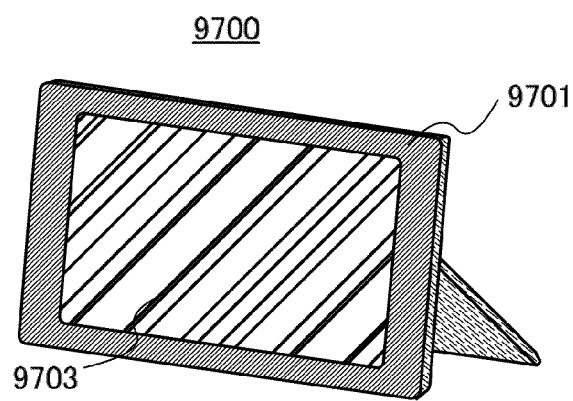

FIG. 29B illustrates an example of a digital photo frame 9700. For example, a display portion 9703 is incorporated in a chassis 9701 of the digital photo frame 9700. The display portion 9703 can display a variety of images. For example, image data taken by a digital camera or the like are displayed, so that the digital photo frame can function in a manner similar to that of a general picture frame.

Note that the digital photo frame 9700 is provided with an operation portion, an external connection terminal (such as a USB terminal, a terminal which can be connected to a variety of cables including a USB cable, or the like), a storage medium inserting portion, and the like. These structures may be incorporated on the same plane as the display portion; however, they are preferably provided on the side surface or rear surface of the display portion because the design is improved. For example, a memory including image data taken by a digital camera is inserted into the storage medium inserting portion of the digital photo frame and the image data are imported. Then, the imported image data can be displayed in the display portion 9703.

The digital photo frame 9700 may send and receive information wirelessly. In this case, desired image data can be wirelessly imported into the digital photo frame 9700 and can be displayed therein.

Figure 30A:
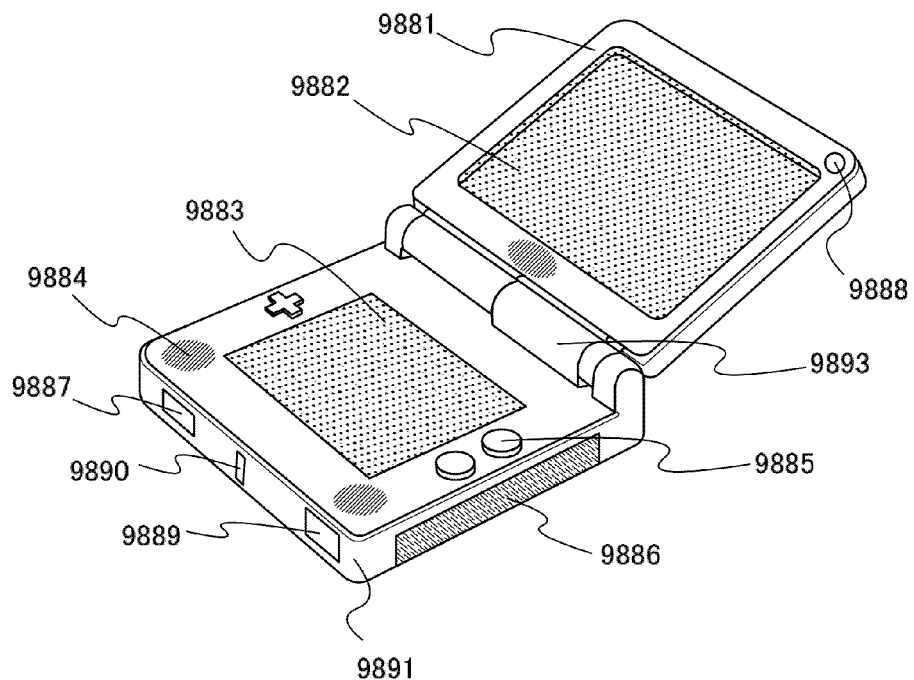
FIGS. 30A and 30B are external views of examples of amusement machines.

FIG. 30A illustrates a portable game machine including a chassis 9881 and a chassis 9891 which are jointed with a connector 9893 so as to be able to open and close. A display portion 9882 is incorporated in the chassis 9881, and a display portion 9883 is incorporated in the chassis 9891. The portable game machine illustrated in FIG. 30A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and may be any structure as long as at least a semiconductor device according to one embodiment of the present invention is provided. Moreover, another accessory may be provided as appropriate. The portable game machine illustrated in FIG. 30A has a function of reading out a program or data stored in a storage medium to display it on the display portion and a function of sharing information with another portable game machine by wireless communication. The functions of the portable game machine illustrated in FIG. 30A are not limited to these, and the portable game machine can have a variety of functions.

Figure 30B:
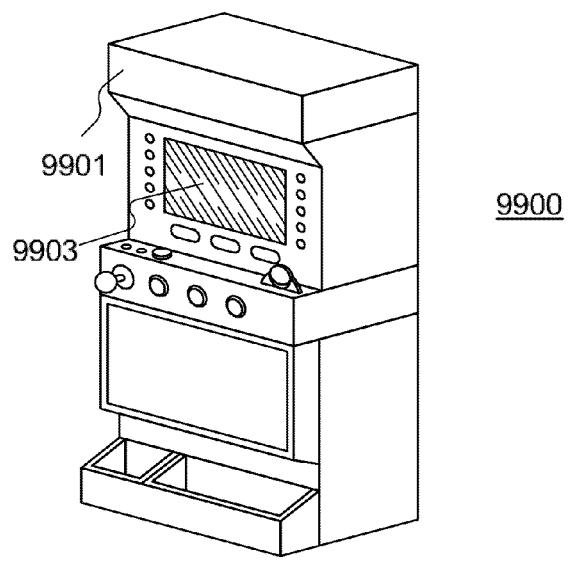

FIG. 30B illustrates an example of a slot machine 9900 which is a large game machine. A display portion 9903 is incorporated in a chassis 9901 of the slot machine 9900. The slot machine 9900 additionally includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 31:
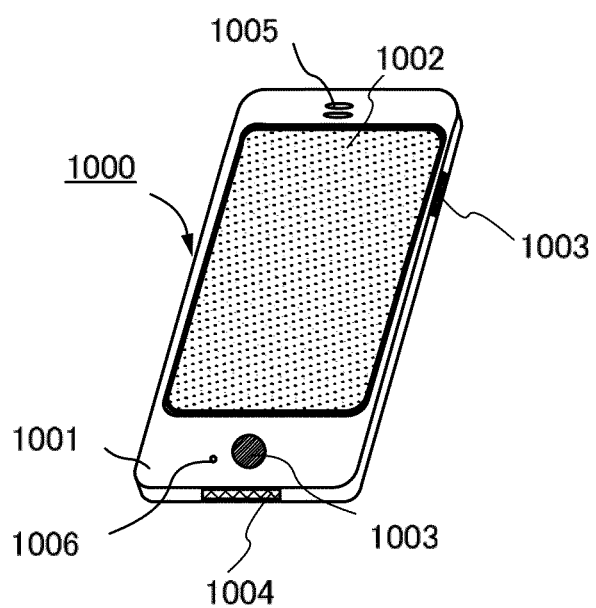
FIG. 31 shows an external view of an example of a mobile phone.

FIG. 31 illustrates an example of a cellular phone 1000. The cellular phone 1000 includes a chassis 1001 in which a display portion 1002 is incorporated, and moreover includes an operation button 1003, an external connection port 1004, a speaker 1005, a microphone 1006, and the like.

Information can be input to the cellular phone 1000 illustrated in FIG. 31 by touching the display portion 1002 with a finger or the like. Moreover, operations such as making a phone call or texting message can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in the case of making a phone call or texting message, the display portion 1002 is set to a text input mode where text input is mainly performed, and text input operation can be performed on a screen. In this case, it is preferable to display a keyboard or number buttons on almost the entire screen of the display portion 1002.

When a detection device including a sensor that detects inclination, such as a gyroscope or an acceleration sensor, is provided inside the cellular phone 1000, display in the screen of the display portion 1002 can be automatically switched by judging the direction of the cellular phone 1000 (whether the cellular phone 1000 is placed horizontally or vertically for a landscape mode or a portrait mode).

Further, the screen modes are switched by touching the display portion 1002 or operating the operation button 1003 of the chassis 1001. Alternatively, the screen modes can be switched depending on kinds of image displayed in the display portion 1002. For example, when a signal for an image displayed in the display portion is data of moving images, the screen mode is switched to the display mode. When the signal is text data, the screen mode is switched to the input mode.

Moreover, in the input mode, when input by touching the display portion 1002 is not performed within a specified period while a signal detected by an optical sensor in the display portion 1002 is detected, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight which emits near-infrared light or a sensing light source which emits near-infrared light is provided in the display portion, a finger vein, a palm vein, or the like can be taken.

The thin film transistor of one embodiment of the present invention is mounted on the electronic devices described as an example in this embodiment; therefore, the electronic devices consume less power and can operate at a high speed.

Note that the structure described in this embodiment can be combined as appropriate with any of the structures described as an example in other embodiments.

This application is based on Japanese Patent Application serial No. 2009-019922 filed with the Japan Patent Office on Jan. 30, 2009, the entire contents of which are hereby incorporated by reference.

What is claimed is:

1. A semiconductor device comprising:
   a gate electrode layer;
   a gate insulating layer over the gate electrode layer;
   a plurality of clusters containing titanium over the gate insulating layer;
   an oxide semiconductor layer over the gate insulating layer; and
   a source electrode layer and a drain electrode layer over the oxide semiconductor layer,
   wherein a channel formation region is formed in the oxide semiconductor layer, and the channel formation region comprises the plurality of clusters containing titanium, and
   wherein the oxide semiconductor layer and the source and drain electrode layers are electrically connected to each other.

2. The semiconductor device according to claim 1, wherein the plurality of clusters contains a titanium compound whose electrical conductance is higher than electrical conductance of the oxide semiconductor layer.

3. The semiconductor device according to claim 1,
   wherein the plurality of clusters containing titanium have a height of greater than or equal to 3 nm and less than or equal to 5 nm from a surface where the clusters are in contact with the gate insulating layer, and contain at least one kind of impurity element selected from niobium and tantalum.

4. The semiconductor device according to claim 1, wherein the oxide semiconductor layer contains at least one selected from the group of indium, gallium, and zinc.

5. The semiconductor device according to claim 1,
   wherein the oxide semiconductor layer has a first region which is between the source electrode layer and the drain electrode layer, and
   wherein a thickness of the first region is smaller than a thickness of a second region which the source and drain electrode layers overlap.

6. The semiconductor device according to claim 1,
   wherein the oxide semiconductor layer contains at least one selected from the group of indium, gallium, and zinc, and
   wherein a thickness of the oxide semiconductor layer is greater than or equal to 10 nm and less than or equal to 150 nm.

7. The semiconductor device according to claim 1,
   wherein a channel protective layer including an inorganic material is formed over the oxide semiconductor layer.

8. A semiconductor device comprising:
a gate electrode layer;
a gate insulating layer over the gate electrode layer;
a plurality of clusters containing titanium over the gate insulating layer;
an oxide semiconductor layer over the gate insulating layer;
a buffer layer having n-type conductivity over the oxide semiconductor layer; and
a source electrode layer and a drain electrode layer over the buffer layer,
wherein a channel formation region is formed in the oxide semiconductor layer, and the channel formation region comprises the plurality of clusters containing titanium,
wherein a carrier concentration of the buffer layer is higher than a carrier concentration of the oxide semiconductor layer, and
wherein the oxide semiconductor layer and the source and drain electrode layers are electrically connected to each other via the buffer layer.

9. The semiconductor device according to claim 8, wherein the plurality of clusters contains a titanium compound whose electrical conductance is higher than electrical conductance of the oxide semiconductor layer.

10. The semiconductor device according to claim 8, wherein the plurality of clusters containing titanium have a height of greater than or equal to 3 nm and less than or equal to 5 nm from a surface where the clusters are in contact with the gate insulating layer, and contain at least one kind of impurity element selected from niobium and tantalum.

11. The semiconductor device according to claim 8, wherein the oxide semiconductor layer contains at least one selected from the group of indium, gallium, and zinc.

12. The semiconductor device according to claim 8, wherein the oxide semiconductor layer has a first region which is between the source electrode layer and the drain electrode layer, and
wherein a thickness of the first region is smaller than a thickness of a second region which the source and drain electrode layers overlap.

13. The semiconductor device according to claim 8, wherein the oxide semiconductor layer and the buffer layer contain at least one selected from the group of indium, gallium, and zinc, and
wherein a thickness of the oxide semiconductor layer is greater than or equal to 10 nm and less than or equal to 150 nm.

14. The semiconductor device according to claim 8, wherein a channel protective layer including an inorganic material is formed over the oxide semiconductor layer.

15. A semiconductor device comprising:
a gate electrode layer;
a gate insulating layer over the gate electrode layer;
a plurality of clusters containing a metal over the gate insulating layer;
an oxide semiconductor layer over the gate insulating layer; and
a source electrode layer and a drain electrode layer over the oxide semiconductor layer,
wherein a channel formation region is formed in the oxide semiconductor layer, and the channel formation region comprises the plurality of clusters containing the metal, and
wherein the oxide semiconductor layer and the source and drain electrode layers are electrically connected to each other.

* * * * *